United States Patent
Kraus et al.

[11] Patent Number: 5,995,406
[45] Date of Patent: Nov. 30, 1999

[54] PLATE LINE SEGMENTATION IN A 1T/1C FERROELECTRIC MEMORY

[75] Inventors: William F. Kraus; Lark E. Lehman, both of Colorado Springs, Colo.

[73] Assignee: Ramtron International Corporation, Colorado Springs, Colo.

[21] Appl. No.: 08/970,448

[22] Filed: Nov. 14, 1997

[51] Int. Cl.$^6$ .................................................. G11C 11/22
[52] U.S. Cl. ........................................... 365/145; 365/149
[58] Field of Search .................................. 365/145, 149, 365/230.03

[56] References Cited

U.S. PATENT DOCUMENTS

| | | |
|---|---|---|
| 5,010,518 | 4/1991 | Toda . |
| 5,029,128 | 7/1991 | Toda . |
| 5,038,323 | 8/1991 | Schwee . |
| 5,086,412 | 2/1992 | Jaffe et al. . |
| 5,262,982 | 11/1993 | Brassington et al. . |
| 5,265,061 | 11/1993 | Tanaka . |
| 5,297,077 | 3/1994 | Imai et al. . |
| 5,400,275 | 3/1995 | Abe et al. . |
| 5,406,510 | 4/1995 | Mihara et al. . |
| 5,414,654 | 5/1995 | Kubota et al. . |
| 5,455,786 | 10/1995 | Takeuchi et al. . |
| 5,508,954 | 4/1996 | Mihara et al. . |
| 5,515,312 | 5/1996 | Nakakuma et al. . |
| 5,517,445 | 5/1996 | Imai et al. . |
| 5,517,446 | 5/1996 | Ihara . |
| 5,524,093 | 6/1996 | Kuroda ............................... 365/145 |
| 5,539,279 | 7/1996 | Takeuchi et al. . |
| 5,608,667 | 3/1997 | Osawa . |
| 5,615,145 | 3/1997 | Takeuchi et al. . |
| 5,638,318 | 6/1997 | Seyyedy . |
| 5,663,904 | 9/1997 | Arase . |
| 5,668,753 | 9/1997 | Koike . |
| 5,671,174 | 9/1997 | Koike et al. . |
| 5,677,865 | 10/1997 | Seyyedy . |
| 5,694,353 | 12/1997 | Koike . |
| 5,745,402 | 4/1998 | Arase . |
| 5,751,626 | 5/1998 | Seyyedy . |
| 5,754,466 | 5/1998 | Arase . |
| 5,798,964 | 8/1998 | Shimizu et al. ..................... 365/145 |

*Primary Examiner*—Son T. Dinh
*Attorney, Agent, or Firm*—Peter J. Meza

[57] ABSTRACT

A plate line segmentation scheme for a 1T/1C ferroelectric memory architecture includes an array of 1T/1C ferroelectric memory cells, word lines corresponding to each row of 1T/1C ferroelectric memory cells, and plate lines corresponding to each row of 1T/1C ferroelectric memory cells, wherein each plate line is divided into two or more equal plate line segments, only one of which is driven when a corresponding word line is selected.

20 Claims, 38 Drawing Sheets

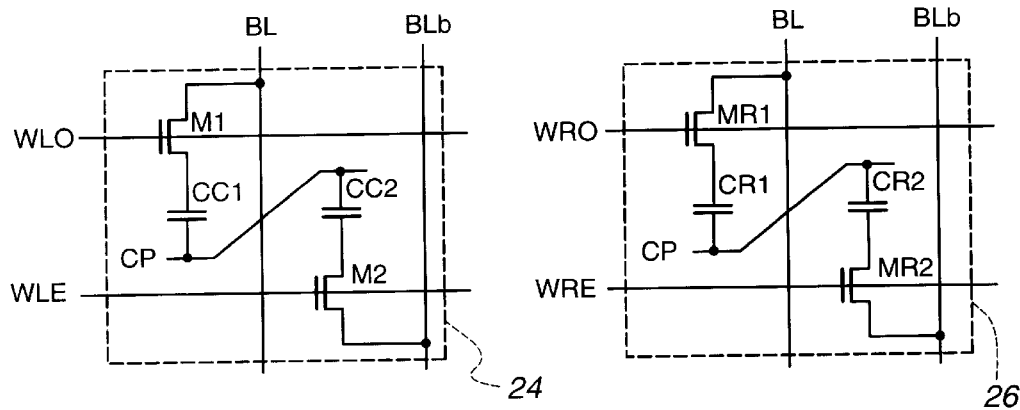
Fig. 7
Prior Art
Fig. 8
Prior Art
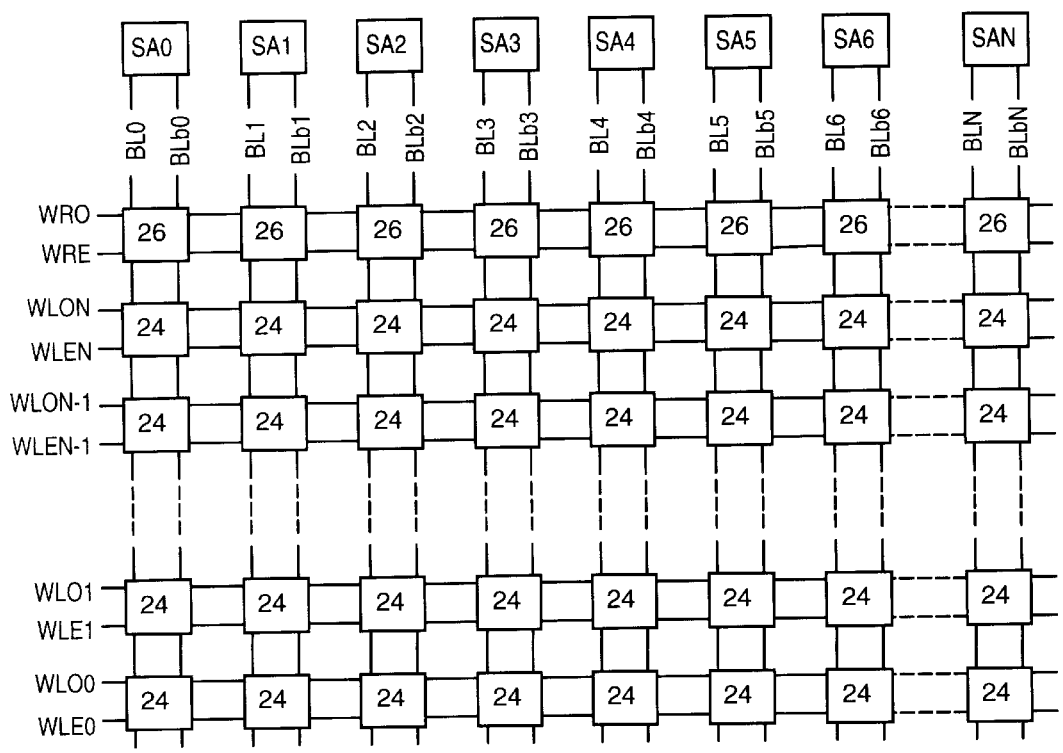
Fig. 9
Prior Art

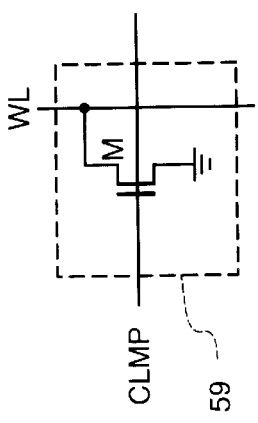
Fig. 30
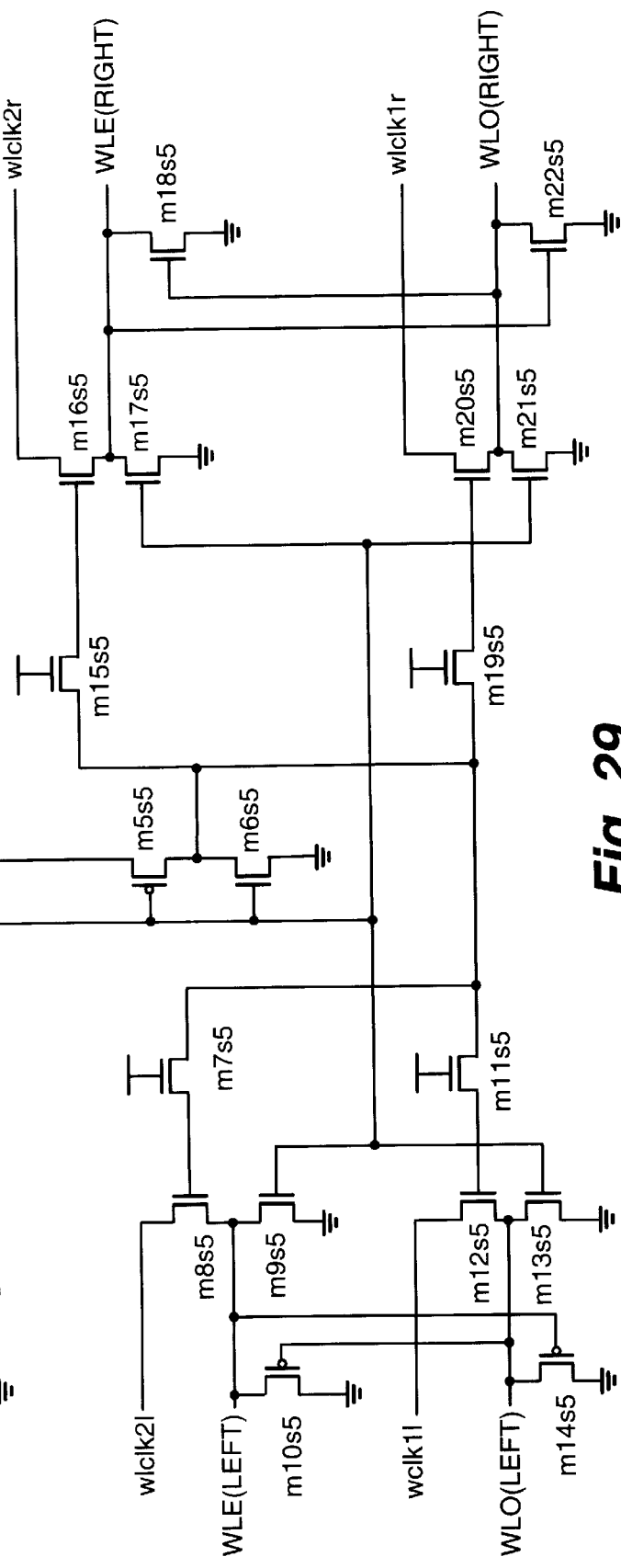
Fig. 29
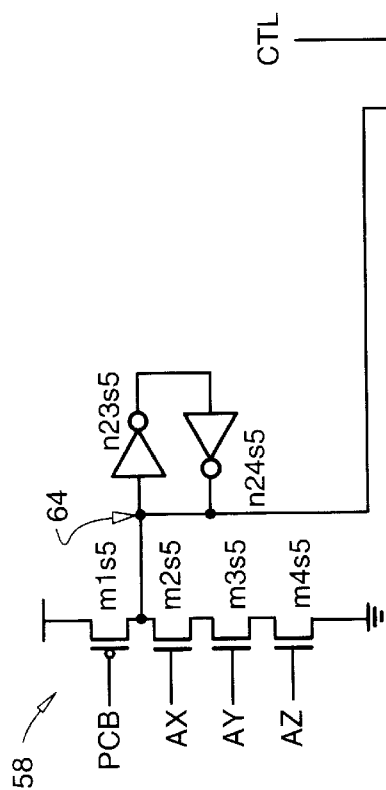

PLATE LINE SEGMENTATION IN A 1T/1C FERROELECTRIC MEMORY

RELATED APPLICATION INFORMATION

This application is related to the following applications assigned to the assignee of the present invention, which are all hereby specifically incorporated by this reference:

Ser. No. 08/970,452 entitled "REFERENCE CELL FOR A 1T/1C FERROELECTRIC MEMORY";

Ser. No. 08/970,520 entitled "MEMORY CELL CONFIGURATION FOR A 1T/1C FERROELECTRIC MEMORY";

Ser. No. 08/970,518 entitled "REFERENCE CELL CONFIGURATION FOR A 1T/1C FERROELECTRIC MEMORY";

Ser. No. 08/970,519 entitled "SENSE AMPLIFIER CONFIGURATION FOR A 1T/1C FERROELECTRIC MEMORY";

Ser. No. 08/970,454 entitled "COLUMN DECODER CONFIGURATION FOR A 1T/1C FERROELECTRIC MEMORY";

Ser. No. 08/970,521 entitled "SENSE AMPLIFIER LATCH DRIVER CIRCUIT FOR A 1T/1C FERROELECTRIC MEMORY";

Ser. No. 08/970,522 entitled "PLATE LINE DRIVER CIRCUIT FOR A 1T/1C FERROELECTRIC MEMORY"; and Ser. No. 08/970,453 entitled "SENSING METHODOLOGY FOR A 1T/1C FERROELECTRIC MEMORY".

BACKGROUND OF THE INVENTION

1. Field of the Invention

This invention relates generally to ferroelectric memories. More particularly, the present invention relates to those memories employing an array of one-transistor, one-capacitor ("1T/1C") ferroelectric memory cells.

2. Description of the Prior Art

The first designs with ferroelectric capacitors utilized memory cells containing two transistors and two ferroelectric capacitors, ("2T/2C"). Ferroelectric 2T/2C memory products are shown and described in the 1996 Ramtron International Corporation FRAM® Memory Products databook, which is hereby incorporated by reference. A 2T/2C memory is also described in U.S. Pat. No. 4,873,664 entitled "Self Restoring Ferroelectric Memory", which is also hereby incorporated by reference. The 2T/2C memory cells were arranged in a physical layout such that the transistors and the ferroelectric capacitors were adjacent in the cell.

FIG. 1 is a schematic diagram of a 2T/2C memory cell and also represents the relative proximity of the physical layout of the elements. Ferroelectric memory cell 10 includes a first transistor M1 coupled to a first ferroelectric capacitor CC, and a second transistor M2 coupled to a second ferroelectric capacitor CCb. Ferroelectric capacitors CC and CCb store complementary polarization states, which define a single data state of memory cell 10. The plate line PL, which is coupled to one side of the ferroelectric capacitors CC and CCb runs parallel to the word line WL, which is coupled to the gates of the two transistors M1 and M2. In the arrangement of FIG. 1, the signal propagation delay along the plate line PL across one cell is insignificant compared to the delay in transferring data from the cell to the complementary bit lines BL and BLb, which are coupled to the source/drains of transistors M1 and M2. In the schematic of FIG. 1, the connection between the common electrodes for capacitors CC and CCb is a plate line wire PL. This plate line wire is a highly conductive material, generally a metal conductor. Also, the physical layout of memory cell 10 places these elements in close proximity to each other.

A timing diagram for the operation of a 2T/2C memory cell such as cell 10 is shown in FIG. 3. The control signals necessary to develop charge on the complementary bit lines BL and BLb are the word line signal WL and the plate line signal PL. The word line waveform 12 is a pulse that transitions from ground to the VCC supply voltage. The plate line waveform 14, 16 can either be a shorter or longer pulse, depending upon the desired sensing method. Initially, the word line and plate line waveforms are at ground potential. At time $t_0$, the word line waveform is taken high to the VCC power supply voltage level, which turns on transistors M1 and M2 and electrically couples the ferroelectric capacitors CC and CCb to the bit lines BL and BLb, respectively. Once the high voltage level has been established on the word line, the plate line is pulsed to "pole" the ferroelectric capacitors at time $t_1$. Plate line waveform 14 is used for the "up-down" sensing method. With reference to the hysteresis loop 38 of FIG. 10, the "up-down" sensing method senses the charge developed moving from point 1 to point 2 to point 3 of the "switched" ferroelectric capacitor, minus the charge developed moving from point 3 to point 2 back to point 3 in the "unswitched" ferroelectric capacitor. Note that waveform 14 is brought low to ground potential at time $t_2$. At time $t_3$ the sense amplifiers (not shown in FIG. 1) are enabled and the differential charge on the bit lines BL and BLb can be sensed and converted into a valid logic state. Plate line waveform 16 is used for the "up-only" sensing method. With reference again to the hysteresis loop 38 of FIG. 10, the "up-only" sensing method senses the charge developed moving only from point 1 to point 2 in the "switched" ferroelectric capacitor minus the charge moving from point 3 to point 2 of the "unswitched" ferroelectric capacitor. Note that plate line waveform 16 remains high at times $t_2$ and $t_3$. At time $t_3$ the sense amplifiers are enabled and the differential charge on the bit lines can be sensed and again converted into a valid logic state. Although the charge in each case is slightly different, the charge from the switched ferroelectric capacitor in cell 10 is always larger than the charge from the unswitched capacitor, so that the correct data state can be sensed.

In the full array of memory cells 10, bit lines are paired as true/complement and connected as illustrated in FIG. 4. Each block 10 is a 2T/2C memory cell as shown in previous FIG. 1. In the arrangement of FIG. 4, there is a multiplicity of paired plate lines PL0 through PLN and word lines WL0 through WLN extending in the word or row direction. There is a corresponding multiplicity of pairs of true/complement bit lines BL0/BLb0 through BLN/BLbN in the column or bit direction.

Using the physical layout corresponding to the array of FIG. 4, the data pattern along the bit lines is always in pairs of true complement data. Therefore, no matter what logical data pattern is written into the array, the bit line data pattern as described by "1's" and "0's" representing the actual high and low voltages on the bit lines is described completely by the pattern "10" plus its complement "01". This is not to be confused with the logical data states of "1" and "0" that refers to a pair of bit lines, such as BL0 and BLb0. The "1" or "0" referred to below represents the high "1" and low "0" voltage on each pair of bit (BL0–BLN) and bit bar (BLb0–BLbN) bit lines shown in FIGS. 1 and 4. Any other larger array of cells repeats this basic pattern. Assuming eight columns for the array shown in FIG. 4, corresponding to 16 bit/bit bar pairs, the pattern combinations could be, for example, 1010101010101010, 0101010101010101, 1001100110011001 or 0110011001100110. Because of the nature of the cell layout with true complement data per cell there is never an accumulated pattern of all "1's" or all "0's" or of isolated bits such as all 1's with a single zero or its complement as illustrated by the following 16 bit sequences: 1111111101111111 or 0000000010000000. Again, each individual "1" or "0" represents the voltage on an individual bit line wire.

Patterns such as that described above having single "0's" or "1's" in a field of opposite polarity can be created, however, in a 1T/1C memory design, depending on the chip architecture. These patterns create cumulative noise on the bit lines within an array. When the sense amplifiers are latched, noise generated through capacitive coupling between bit lines reduces the operating margin of the single bit line of opposite polarity. A schematic of a 1T/1C DRAM cell 20 coupled to a single bit line BL for a single storage location is shown in FIG. 5. One side of conventional oxide capacitor CC is connected to the access transistor M1 and the other side is connected to a node 22 that is common to all memory cells in a DRAM array. The common node 22 is usually at a potential of one half of the VCC power supply voltage, for example 2.5 volts for a five volt power supply voltage.

The ferroelectric version of the 1T/1C DRAM memory cell 20 of FIG. 5 is shown in FIG. 2. Ferroelectric memory cell 18 also includes a single access transistor M1, which is coupled to a ferroelectric capacitor CC. A single word line WL is coupled to the gate of access transistor M1 and a single bit line BL is coupled to the source/drain of access transistor M1. Instead of a common node 22 as in the DRAM cell 20, ferroelectric memory cell 18 includes an individual active plate line PL per word line as shown in FIG. 2.

The noise problem described above with reference to a 1T/1C array occurs when an "open bit line" architecture is used. In this configuration, all the true bits are assembled on one side of the sense amplifier and all the complement bit lines are on the opposite side of the sense amplifier. The open bit line architecture is illustrated in FIG. 6. The array shown in FIG. 6 utilizes the DRAM 1T/1C memory cell 20 of FIG. 5. The open bit line array of FIG. 6 includes bit lines BL0 through BLN and word lines WL0 through WLN in the bottom half of the array, and complementary bit lines BLb0 through BLbN and complementary word lines WLC0 through WLCN in the top half of the array. The bit lines and complementary bit lines are coupled to a row of sense amplifiers SA0 through SAN. In the open bit line configuration it is possible that when a word line is accessed all the data on one side of the sense amplifiers could be all "1's" with a single zero as indicated in the 16 bit sequences described above, generating noise. This noise problem was solved by utilizing a "folded bit line" architecture, described below.

The folded bit line array configuration is illustrated in FIG. 9 utilizing the DRAM memory cell 24 shown in FIG. 7 and the DRAM reference cell 26 shown in FIG. 8. The capacitors, access transistors, word lines, and bit lines of memory cell 24 and reference cell 26 are shown in the approximate locations on the physical layout on the chip. In the folded bit line approach shown in the array of FIG. 9, the array is comprised of odd and even word lines indicated by WLO and WLE, respectively, extending from word lines WLO0 and WLE0 through WLON and WLEN. Whenever an odd or even word line is activated, data is read from the memory cells 24 onto every other bit line. At the same time an even or odd word line is accessed an (opposite) odd, WRO, or even, WRE, reference word line is accessed to apply a reference level to the opposite bit line. Utilizing this folded bit line approach, it can be observed that the data pattern on the respective bit lines is similar to that of the 2T/2C design, previously described with respect to FIG. 4. Each bit line pair BL/BLb alternates data as described above for the 2T/2C design, thus eliminating the cumulative noise pattern described for the open bit line architecture of FIG. 6.

The design of ferroelectric memories is inexorably progressing to ever higher densities. To remain cost competitive with alternative memory 30 technologies, new ferroelectric memories will be based on the 1T/1C ferroelectric memory cell shown in FIG. 2. In a ferroelectric 1T/1C design, there is a reference word line and many corresponding memory word lines. This is the opposite of a 2T/2C design, where each memory cell has in essence its own built-in reference in the pairing of true complement data. This common reference line in a folded bit line architecture for a 1T/1C ferroelectric memory is again analogous to the 1T/1C DRAM designs shown in FIG. 9. The difference between the two being that the ferroelectric memory has an additional wire added for control of the plate line and rewriting the polarization state in the ferroelectric capacitor, rather than a fixed-potential common electrode as in DRAMs. There have been approaches suggested for ferroelectric 1T/1C memory designs that utilize a common electrode such as that of DRAMs, illustrated by common node CP in FIGS. 7 and 8. Each of these approaches, however, have associated problems such as leakage of the internal cell nodes requiring refresh, power up noise issues, and complex circuitry needed to mitigate the aforementioned problems.

Assuming that a 1T/1C folded bit line architecture is used, two new noise issues are introduced that are unique to a ferroelectric memory array. These noise issues result from both the physical interconnections with each memory row having an individual plate line per word line or shared plate line per pair of word lines, and in the sequence of operation.

The first noise problem results from the common plate line along a word line that allows noise to propagate from cell to cell. This first noise problem is data pattern dependent. The noise patterns created are analogous to that described above for the open bit line architecture DRAM. This problem does not exist in 1T/1C DRAM memory cells since the common second electrode of the memory capacitor is shared for the entire array. This common electrode in DRAMs acts as a filter capacitor with a low resistance path to propagate the noise induced into the plate when a word line is accessed. As described earlier there have been proposals for the same architecture (common electrode for the entire array) to be used with ferroelectric designs. There are, however, significant operating problems with these approaches that make their implementation impractical.

The second noise issue results from the operating voltages of the bit lines during the reading of information from the memory cells prior to sensing. In most high density memory designs the sense amplifier used to determine the voltage difference on the bit lines resulting from reading the cells is the cross coupled type as shown in FIG. 21 (sense amplifier 30). Often the constraints of the physical layout pitch of the memory cell in the bit line or column direction require that the nodes labeled "LATCH P" and "LATCH N" are actually a common wire shared across many columns. During the reading of information the bit line voltage can exceed the threshold voltage of a P-channel or N-channel transistor, i.e.

the point at which the transistor begins conducting current between source and drain. When these bit line voltages exceed the threshold voltages of the transistors, noise can be transmitted through the cross-coupled P-channel and N-channel devices to the common latch nodes (LATCH P and LATCH N). This noise can then affect the signal margin in other columns.

What is desired, therefore, is a 1T/1C ferroelectric memory architecture, interconnection approach, operating methodology, sensing control sequence, and layout configuration that minimizes the noise issues set forth above.

SUMMARY OF THE INVENTION

According to the present invention a plate line segmentation scheme for a 1T/1C ferroelectric memory includes a plurality of rows of 1T/1C ferroelectric memory cells, a plurality of word lines corresponding to each row of 1T/1C ferroelectric memory cells, and a plurality of plate lines corresponding to each row of 1T/1C ferroelectric memory cells, each plate line being divided into two or more plate line segments, only one of which is driven when a corresponding word line is selected. Each plate line is divided into four equal plate line segments. Each word line is coupled to 256 columns of ferroelectric memory cells and each plate line segment is coupled to 64 columns of ferroelectric memory cells. A bank of sense amplifiers is associated with the memory cells coupled to each plate line segment, but only one bank of sense amplifiers is enabled corresponding to the driven plate line segment. A bank of pre-charge circuits is coupled to the bit lines of the memory cells corresponding to each plate line segment, but only one bank of pre-charge circuits are disabled corresponding to the driven plate line segment. A plurality of plate line driver circuits arranged into columns is included for selectively driving each plate line segment. Ideally, the plate line driver circuits are arranged into four columns coupled to four memory array sections, the first and second columns being located between a first and second memory array section, and the third and fourth columns being located between a third and fourth memory array section.

The plate line segmentation method of the present invention essentially includes selecting a word line coupled to a row ferroelectric memory cells, driving a first plate line segment coupled to a first portion of the row of ferroelectric memory cells, and grounding a second plate line segment coupled to a second portion of the row of ferroelectric memory cells. The charge on the bit lines corresponding to the first portion of the row of ferroelectric memory cells is sensed, whereas the bit lines corresponding to the second portion of the row of ferroelectric memory cells are grounded. The pre-charge circuits coupled to the first portion of the row of ferroelectric memory cells is disabled, whereas the pre-charge circuits coupled to the second portion of the row of ferroelectric memory cells are enabled.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIG. 7 is a schematic diagram of two prior art 1T/1C DRAM memory cells;

FIG. 8 is a schematic diagram of two prior art 1T/1C DRAM reference cells;

FIG. 9 is a block diagram of a folded bit line array using the DRAM memory and reference cells shown in FIGS. 7 and 8;

FIG. 29 is a schematic diagram of two word line decoders used in the word line decoder blocks of FIGS. 25, 26, 31 and 32;

FIG. 30 is a schematic diagram of a word line clamp circuit;

DETAILED DESCRIPTION

Figure 14:
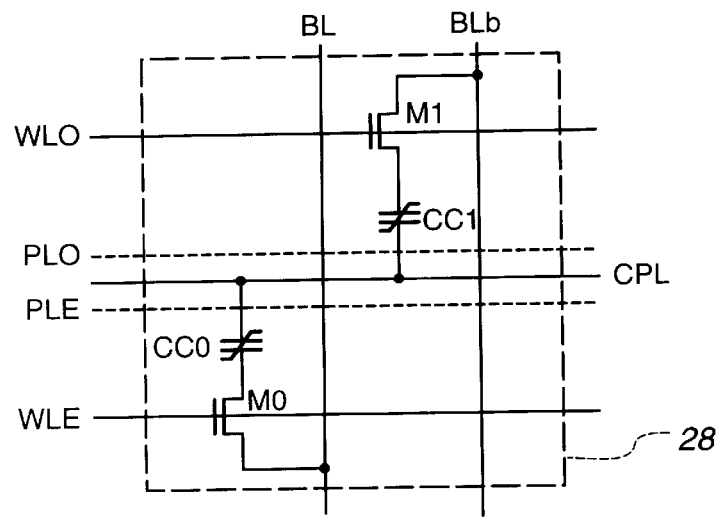
FIG. 14 is a schematic diagram of two 1T/1C ferroelectric memory cells for use in the memory of the present invention having a preferred common plate line or, alternatively, separate plate lines per word line.

A memory cell 28 according to the present invention is shown in FIG. 14. Memory cell 28 is a combination of two 1T/1C ferroelectric memory cells, physically laid out approximately as shown in FIG. 14. Memory cell 28 includes a first 1T/1C memory cell coupled to a common parallel plate and word lines, designated CPL and WLE, respectively. The first 1T/1C cell is also coupled to an orthogonal bit line designated BL. A second 1T/1C memory cell is also coupled to a common parallel plate and word lines, designated CPL and WLO, respectively. The second 1T/1C cell is also coupled to an orthogonal bit line designated BLb. Alternatively, the common plate line can be separated into individual plate lines PLO and PLE as shown in FIG. 14.

Figure 15:
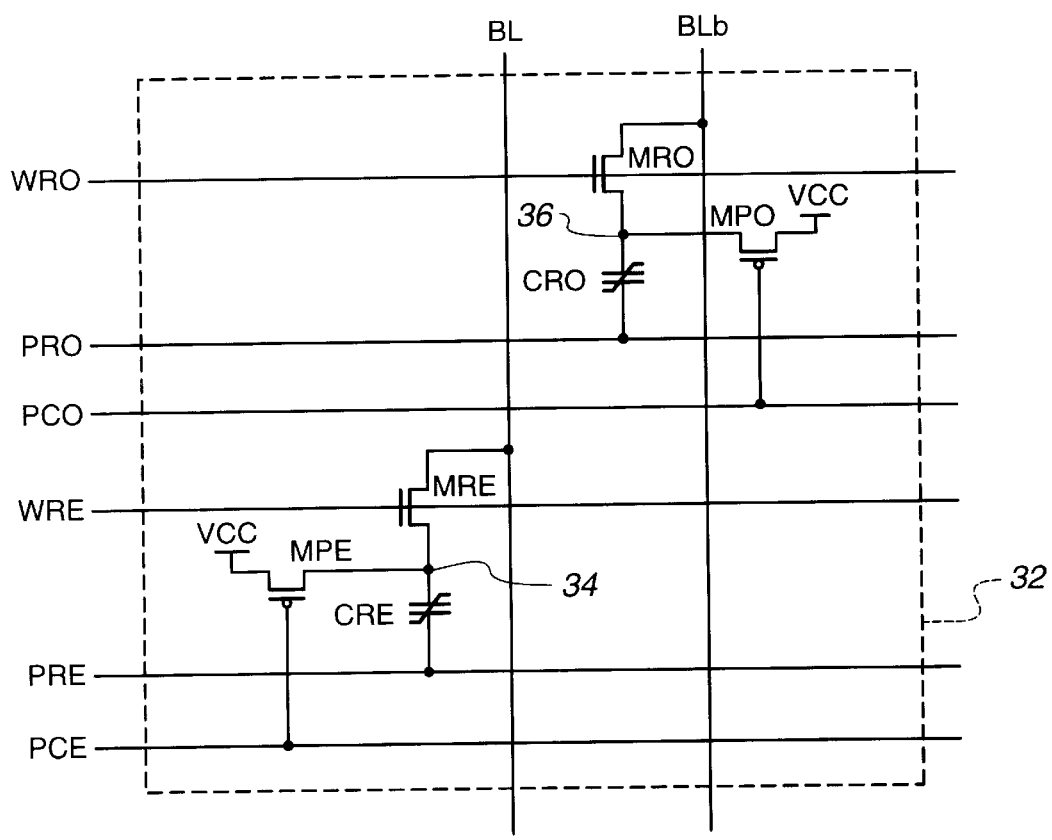
FIG. 15 is a schematic diagram of two 1T/1C ferroelectric reference cells for use in the memory of the present invention.

A reference cell 32 for use with memory cell 28 is shown in FIG. 15. The reference cells 32 are utilized in a folded bit line architecture array shown in FIG. 18 and described in further detail below. Reference cell 32 is a combination of two 1T/1C reference cells, physically laid out approximately as shown in FIG. 15. Reference cell 32 includes a first 1T/1C reference cell coupled to parallel plate, word, and pre-charge lines, designated PRE, WRE, and PCE, respectively. The first 1T/1C reference cell is also coupled to an orthogonal bit line designated BL. The first 1T/1C reference cell includes an N-channel transistor MRE having a current path coupled between bit line BL and node 34, and a gate coupled to the word line WRE. The first 1T/1C reference cell also includes a P-channel transistor MPE having a current path coupled between the VCC power supply voltage and node 34, and a gate coupled to the pre-charge line PCE. The first 1T/1C reference cell also includes a ferroelectric capacitor CRE coupled between node 34 and plate line PRE. A second 1T/1C reference cell is also coupled to parallel plate, word, and pre-charge lines, designated PRO, WRO, and PCO, respectively. The second 1T/1C reference cell is also coupled to an orthogonal bit line designated BLb. The second 1T/1C reference cell includes an N-channel transistor MRO having a current path coupled between bit line BLb and node 36, and a gate coupled to the word line WRO. The second 1T/1C reference cell includes a P-channel transistor MPO having a current path coupled between the VCC power supply voltage and node 36, and a gate coupled to the pre-charge line PCO. The second 1T/1C reference cell also includes a ferroelectric capacitor CRO coupled between node 36 and plate line PRO. As is explained in further detail below, plate lines PRO and PRE can be individually driven by a reference plate line driver circuit, or simply grounded (see FIG. 18).

Figure 18:
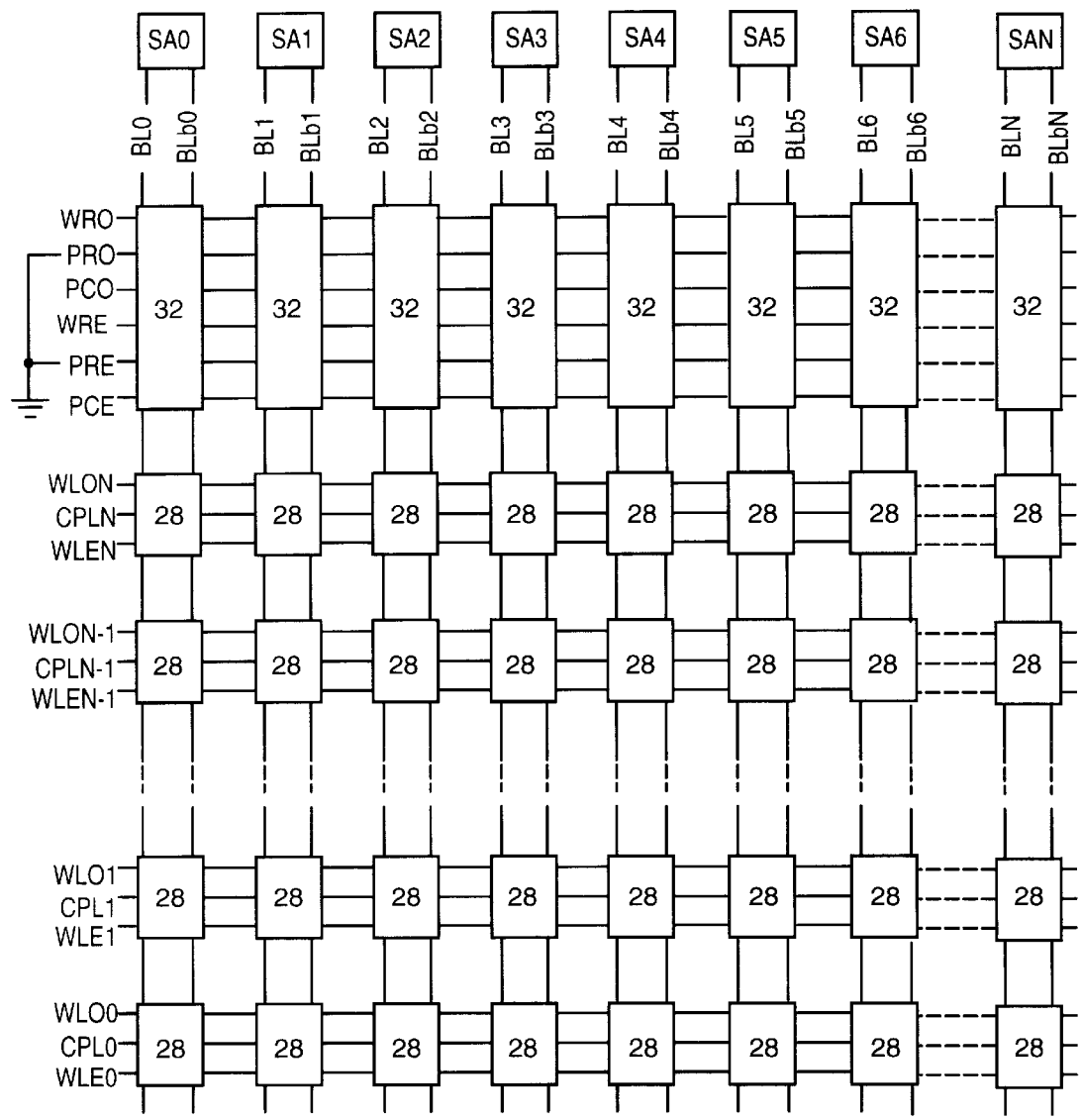
FIG. 18 is a block diagram of a folded bit line ferroelectric memory array using the memory and reference cells of FIGS. 14 and 15 according to the present invention.

A folded bit line architecture for a 1T/1C ferroelectric memory is shown in FIG. 18. A row of reference cells 32 is shown having word and plate line control signals WRO, WRE, PCO, and PCE. The reference plate lines PRO and PRE associated with the reference cells 32 are shown as grounded in FIG. 18. An array of memory cells 28 is shown having word line signals WLO0 through WLON and WLE0 through WLEN, and common plate line signals CPL0 through CPLN. Complementary bit line pairs BL0/BLb0 through BLN/BLbN are coupled to a row of sense amplifiers SA0 through SAN.

One of the key differences between a 2T/2C memory array and a 1T/1C folded bit line architecture is that when a word line is accessed, data from the memory cells in a 1T/1C design is transferred to every other bit line, either all "odd" or all "even" bit lines. This then leaves the other bit lines, even or odd, with no signal. There are, therefore, at least two reference word lines WRO and WRE attached to the ferroelectric memory array. One is employed when "even" bits are accessed and the other is employed when "odd" bits are accessed. When the odd data cells are accessed the even reference is accessed through WRE to place reference information on the even bit lines. The reverse is done for accessing the even data cells, i.e. the odd reference is accessed through WRO. The generated reference level allows the sense amplifier, connected between pairs of bit lines, to determine the polarity of the stored information.

There are various ways in which to determine the information stored in a ferroelectric memory cell. All of these require a voltage to be applied to the ferroelectric device to determine the polarization state. In the 2T/2C design described above the data state is determined by comparing a true and complement ferroelectric capacitor in each cell. One ferroelectric capacitor has its dipoles set in such a direction that upon applying a voltage the dipoles switch producing a large amount of charge. A second ferroelectric capacitor is set in the complement state so that when voltage is applied no switching occurs. This non-switching produces a small amount of charge. These charges are shared across the capacitance of bit lines in a memory array. These charges develop voltage differences via the relationship of charge and capacitance described by the equation: Q=CV.

For a 1T/1C design, however, the polarization state in the memory cell is compared with a reference level to determine the stored value. The reference level is somewhere between a switching state and a non-switching state. The particular reference described here utilizes charge sharing. To understand the operation of a ferroelectric memory it is instructive to understand the voltage response of a ferroelectric capacitor. This is best shown by referring again to the hysteresis loop 38 shown in FIG. 10. The hysteresis loop 38 shown is a plot of the input voltage, generally a sine wave, versus the output voltage of a Sawyer-Tower circuit 40 as shown in FIG. 11. In FIG. 11 the value of the load capacitor CL is large compared to the value of the ferroelectric capacitor or device CF, allowing most of voltage to appear across the ferroelectric device. The sensing of data in a ferroelectric memory (applicable to 2T/2C or 1T/1C) utilizes the same principal as a Sawyer-Tower circuit. In the memory case, the bit line represents the load capacitance CL and is optimized to develop the maximum signal across the bit line when a voltage is applied to a ferroelectric memory cell capacitor CF.

Once data is written into a ferroelectric memory cell the ferroelectric capacitor will be left in one of two possible conditions. Referring again to FIG. 10, this is either at point 1 or point 3 on the graph of the hysteresis loop 38. For positive voltages, a ferroelectric device with its polarization state defined by point 1 is labeled here as the logical "1" data state and a capacitor left at point 3 is defined as the logical "0" data state. When a voltage is applied to the Sawyer-Tower circuit 40 in FIG. 11, if the capacitor starts at point 1 then as the voltage increases to point 2 the dipoles begin to switch resulting in a charge, $Q_S$. Similarly, if the capacitor is at starting point 3 of hysteresis loop 38 in FIG. 10, then no switching occurs as the voltage increases to point 2 and a charge, $Q_{NS}$, results. For a memory cell these charges represent the switching, $Q_S$, and non-switching, $Q_{NS}$, terms, respectively. Depending on which capacitor holds the switching term in this arrangement, the data state is either a logical "1" or logical "0". For a 1T/1C design each data state, point 1 to point 2, or point 3 to point 2 corresponds to a stored "1" or a stored "0" respectively, by comparing the charge from the memory cell to a reference level. The direction of pulsing of the capacitor is irrelevant as can be seen in the symmetry of the hysteresis loop 38 of FIG. 10. Only the logical data state convention needs to be changed. If the ferroelectric capacitor is left in position 1 of hysteresis loop 38 and a negative pulse is applied to the device, then no switching occurs as shown in following the Q-V response between point 1 and point 4. Similarly, if the capacitor is left in the state corresponding to point 3 on hysteresis loop 38 and a negative pulse is applied, the Q-V response is from point 3 to point 4 and switching occurs, just the opposite of positive pulsing.

The voltages established on the bit lines are dependent on the stored data state in the ferroelectric capacitor in the same manner as in the Sawyer-Tower circuit operation described above. In the memory case, the bit line capacitance determined by the physical layout of the bit lines is equivalent to the load CL. This load value is optimized to provide the maximum amount of signal differential to the sense amplifier. Optimization is determined by the voltage charge response of the ferroelectric capacitors. One of the ways the value of load, (i.e. bit line capacitance) can be controlled is by varying the number of rows connected along a column in binary increments. For a "1" data state the cell capacitor switches, resulting in a switched charge $Q_S$. The resultant voltage is larger than that for a non-switched charge, $Q_{NS}$, representative of a "0" data state. For this example, since the odd word line, WLO, is accessed, charge is applied to the bit bar lines. At the same time the word line, WLO, is accessed, a reference word line, WRE, is accessed and the reference cell 32 is used to establish a reference charge on the opposite bit lines from the actual memory cells 28. The reference charge established is between a "1" level voltage and a "0" level voltage.

Reference Cell Operation

Figure 12:
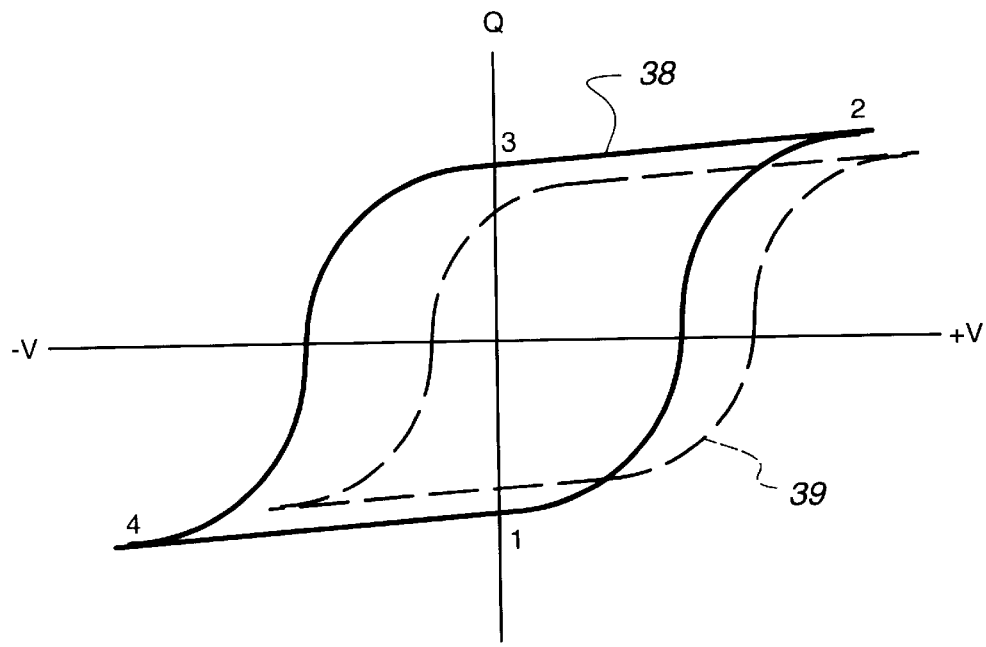
FIG. 12 is a plot of a hysteresis loop showing the output charge Q plotted against the input applied voltage V, as well as a shifted hysteresis loop.
Figure 13:
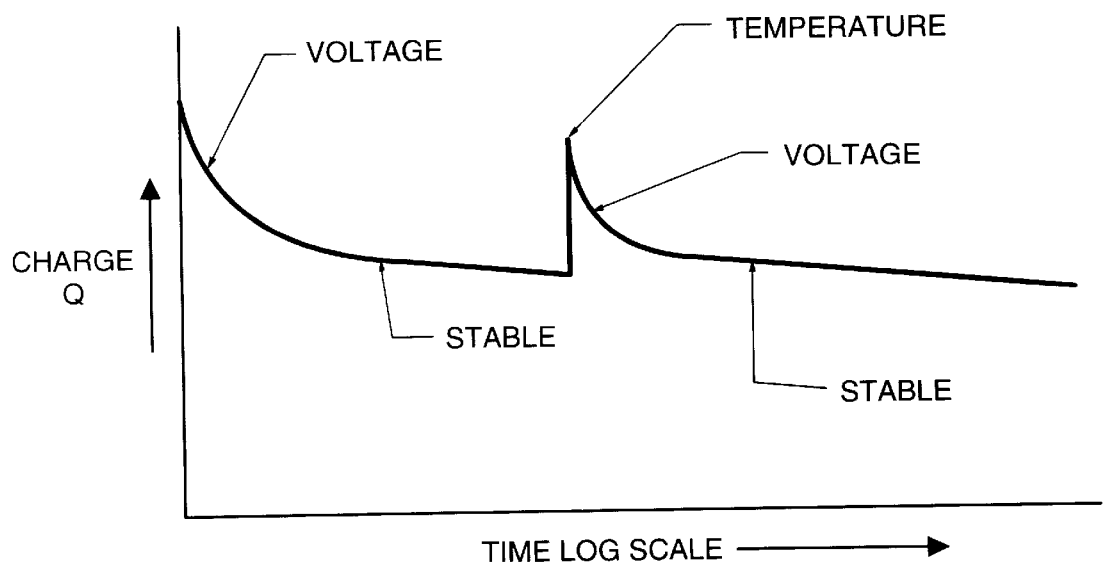
FIG. 13 is a graph of the linear charge of a ferroelectric capacitor versus time, showing perturbations due to changes in applied voltage and temperature.

When a ferroelectric device is integrated with CMOS circuitry certain undesirable electrical characteristics often develop. These characteristics are illustrated in FIGS. 12 and 13 in two different ways. In FIG. 12 they are represented by a shift in the hysteresis loop 39 along the X or voltage axis. Further they are shown in FIG. 13 as charge, Q, versus time on a logarithmic scale. The net result of these shifts is that the charge that a ferroelectric device produces varies with time and operating conditions. This charge movement can result from temperature variations that the device is subjected to under normal operating conditions. In addition, the change in charge can occur as a result of the time and direction of the applied voltages to the ferroelectric device. These changes in charge produce unwanted variations that reduce operating margins in a design. To minimize the variation associated with the reference cell it is beneficial to remove the variations of charge with time/temperature and the application of voltage. The graph shown in FIG. 13 shows the variation of the ferroelectric charge for two conditions. The first is charge degradation with applied voltage. The first portion of decrease in charge, labeled "voltage", represents this degradation in charge. The increase of charge labeled as "temperature" results if the device is subjected to a temperature excursion. There is a tendency for the charge for a given polarity of voltage to increase or return to its original value. The reference cell shown in FIG. 15 adds pre-charge devices, MPE and MPO to minimize this problem. Whenever the ferroelectric memory is powered up, the ferroelectric reference cell capacitor is immediately put under bias. This causes the ferroelectric device charge to move along the first portion of the curve of FIG. 13. Since this is a logarithmic scale, the ferroelectric device begins to reach equilibrium during the time of power up. Further, during each subsequent pre-charge cycle the ferroelectric reference cell capacitors CRE and CRO are under bias/pre-charge, and operate along the flat portion of the curve, labeled "stable" of FIG. 13. The "stable" portion of the curve is typically reached in hundreds of microseconds, but may take up to a millisecond to achieve. This time interval, however, is highly dependent upon the ferroelectric material used, as well as other processing factors.

A further advantage of this reference configuration shown in FIG. 15 is the simplicity of operation. The reference level is already established at the beginning of the cycle and the only control needed is to turn off the associated pre-charge signal PCE or PCO to either transistor MPE or MPO. The reference cell can then be accessed like a normal memory cell. Further, the layout and associated control logic are simplified since there is no need to provide a plate control signal or drive circuitry, unless desired.

The charge developed by the reference cell 32 for the design of the present invention is determined as follows. Referring to FIG. 15, a ferroelectric capacitor CRE or CRO is connected to a memory access device MRE or MRO similar to a normal memory cell 28. An additional P-channel device, MPO or MPE, is connected to the ferroelectric capacitor CRE or CRO to initialize the internal node 34 or 36 of the cell to the VCC power supply level (typically 3.0, 3.3, or 5.0 volts). This initialization occurs via the control signals PCE or PCO. If an odd word line is accessed, an even reference cell is used to set the level of each of the even bit lines. The even reference of cell 32 is then left in a state that corresponds to point 2 on the hysteresis loop 38 of FIG. 10. First the pre-charge signal PCE is turned off. Next, the reference word line, WRE, is activated and the charge stored on the ferroelectric capacitor CRE is shared with the capacitance of the bit line. Since the capacitance of the bit line is larger than the reference cell capacitance the resultant voltage decreases. The relationship to determine the final voltage on the bit line, $V_f$, is:

$$V_f = (Vbl \times Cbl + Vcre \times Cre)/(Cre + Cbl).  \quad [1]$$

The following definitions apply for equation [1]:
Cbl=Bit line capacitance
Cre=Ferroelectric cell capacitance defined as Ccre=Qcre/Vcre
Vcre=Voltage across the ferroelectric cell
Vbl=Bit line voltage ("0" volts for this case)

Figure 1:
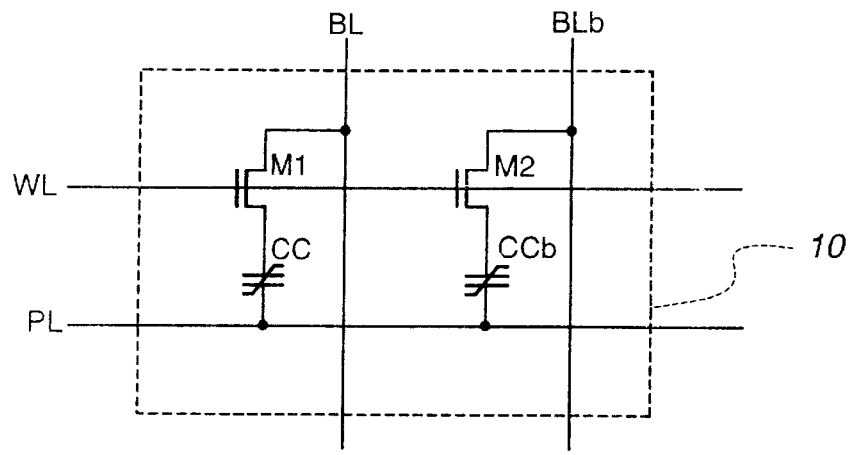
FIG. 1 is a schematic diagram of a prior art 2T/2C ferroelectric memory cell.
Figure 2:
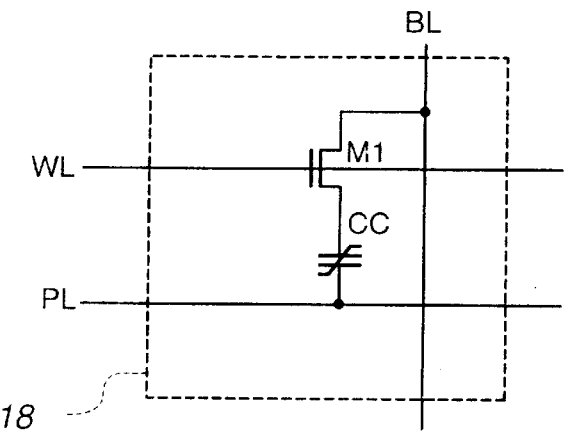
FIG. 2 is a schematic diagram of a prior art 1T/1C ferroelectric memory cell.
Figure 3:
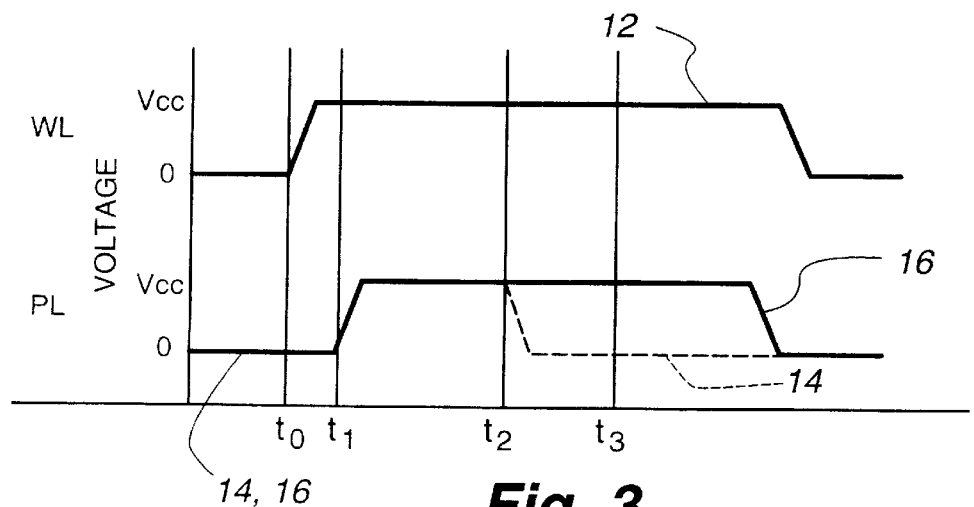
FIG. 3 is a timing diagram for the ferroelectric memory cell shown in FIG. 1.
Figure 4:
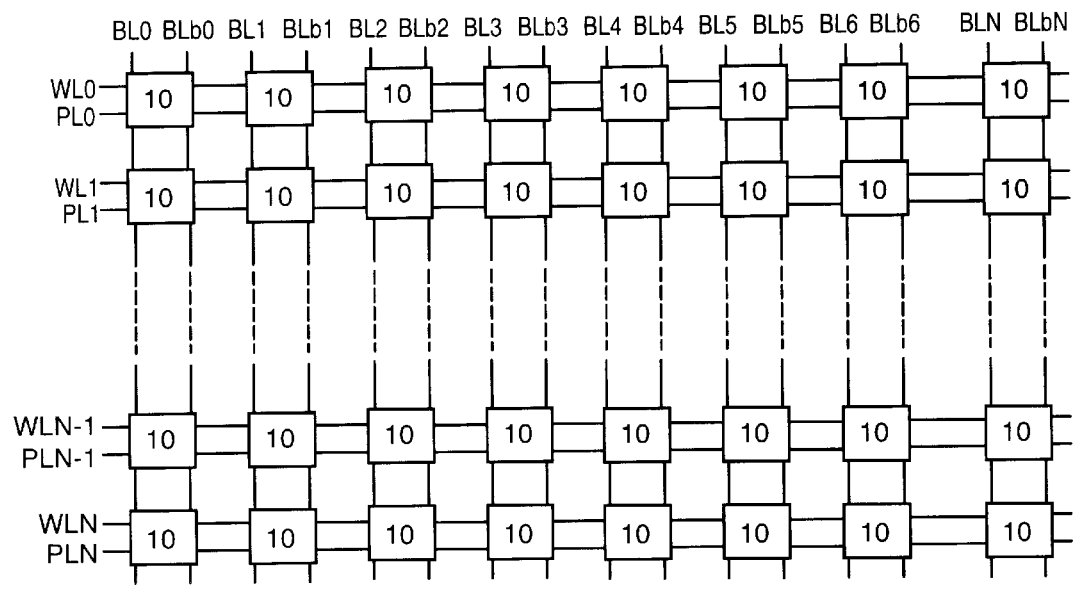
FIG. 4 is a block diagram of an array of the 2T/2C ferroelectric memory cell shown in FIG. 1.
Figure 5:
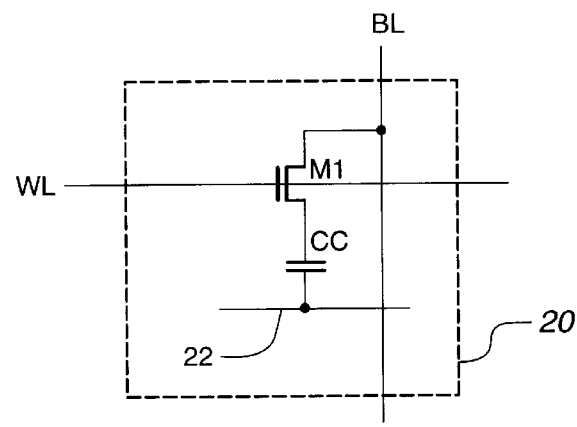
FIG. 5 is a schematic diagram of a prior art 1T/1C DRAM memory cell.
Figure 6:
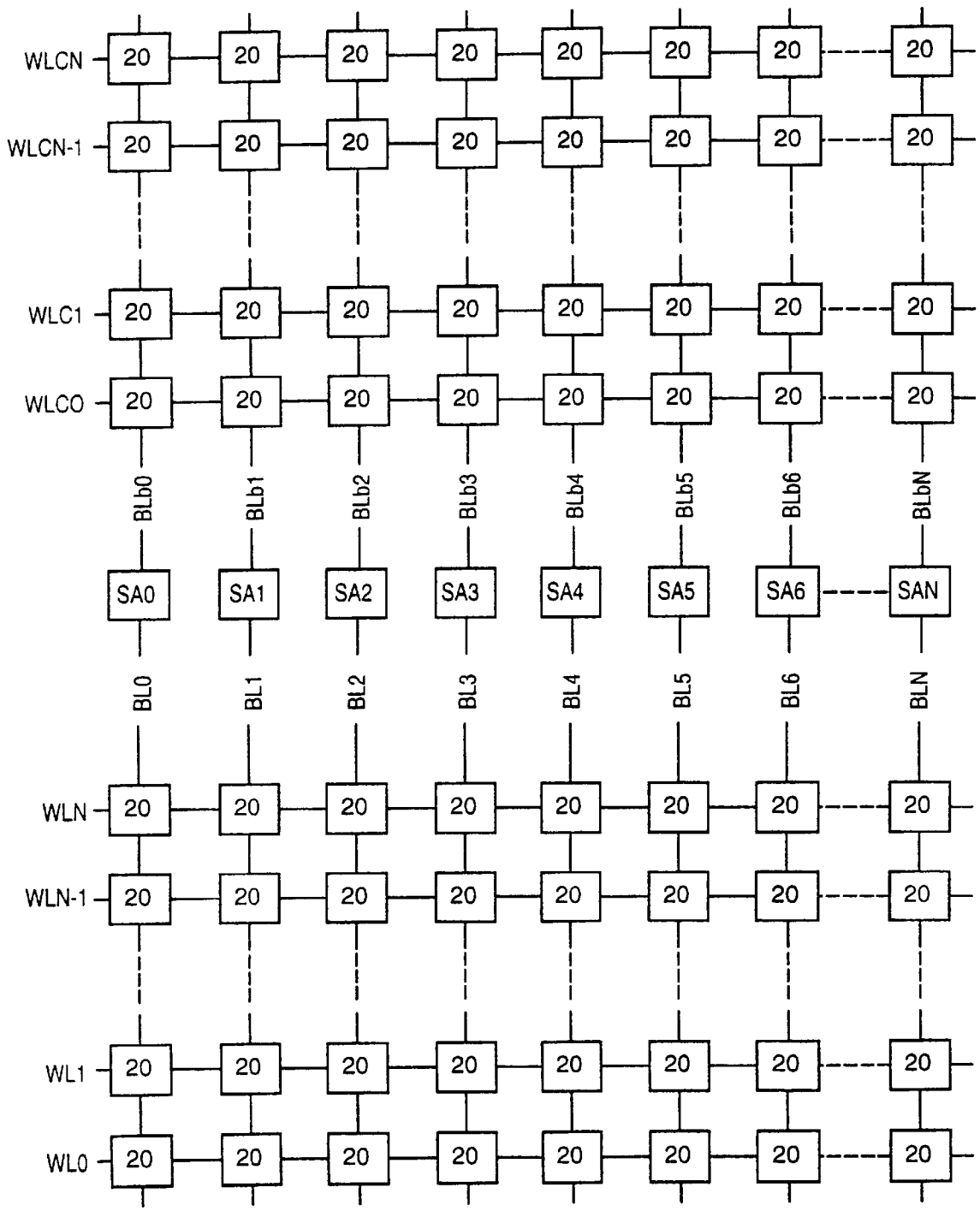
FIG. 6 is a block diagram of an open bit line array of the 1T/1C DRAM memory cell shown in FIG. 5.
Figure 10:
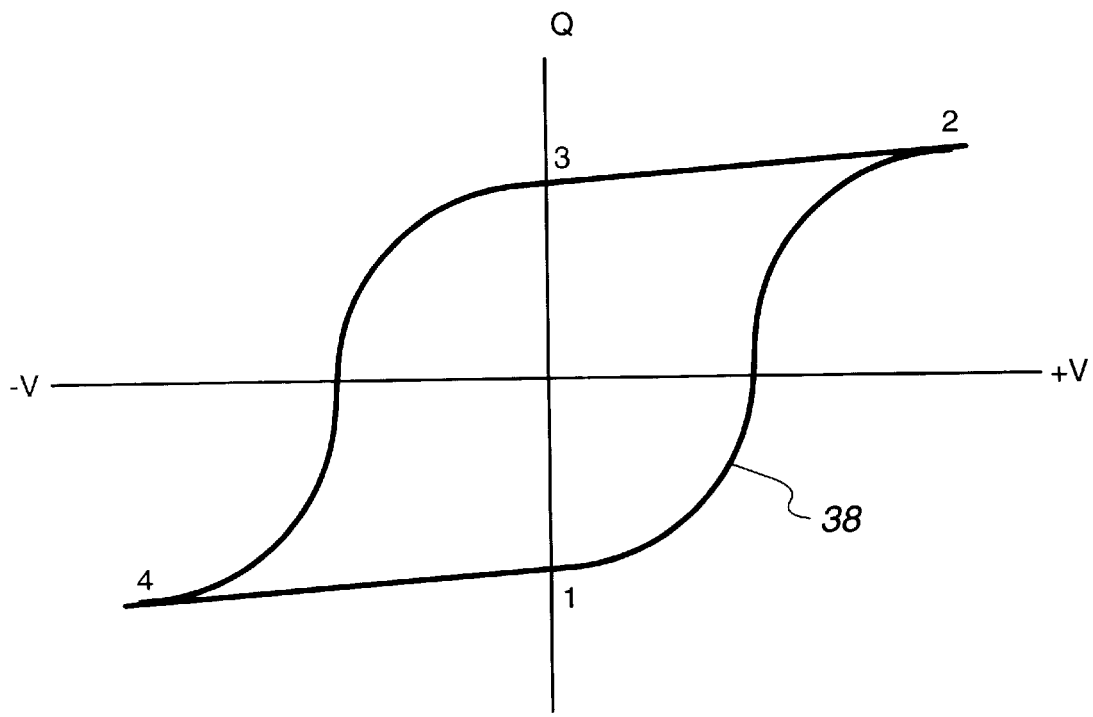
FIG. 10 is plot of a hysteresis loop showing the output charge Q plotted against the input applied voltage V, and in particular specific charge points 1–4 are identified on the hysteresis loop.
Figure 11:
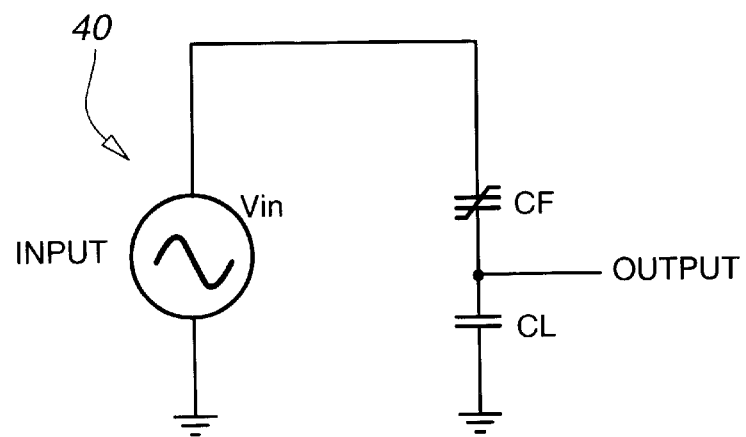
FIG. 11 is a schematic diagram of a prior art Sawyer-Tower circuit having an input voltage source, a ferroelectric capacitor or device CF under test, and a load capacitor CL.

Utilizing the hysteresis loop 38 of FIG. 10, the ferroelectric capacitor moves from point 2 towards point 3 delivering a linear, non-switching charge, $Q_{NS}$, to the bit line and establishing a reference level. If the ferroelectric capacitor were the identical size as the memory cell capacitor then a "0" or non-switching value from the memory cell would deliver exactly the same charge to the bit line as the reference cell. For the memory cell 28 the charge delivered is represented on the hysteresis loop 38 of FIG. 10 as moving from point 3 to point 2 and for the reference cell 32 from point 2 to point 3. Since the capacitance of the bit lines are all the same, then if the capacitor sizes are the same, the resultant voltages are identical via the relationship of: Q=CV. To set the reference level charge to allow the sensing of the data state of the, the reference cell capacitor CRE or CRO is made larger in area than an actual memory cell capacitor. The capacitance is directly related to the area via the relationship:

$$C = (A_f \epsilon_0 \epsilon_f)/t_f \quad [2]$$

The following definitions apply for equation [2]:
$A_f$=ferroelectric capacitor area
$\epsilon_0$=permittivity of free space
$\epsilon_f$=permittivity of the ferroelectric material
$t_f$=thickness of the ferroelectric material The area of the reference cell capacitor is determined by the desired margins needed between a "1" level of switching, $Q_S$, and a "0" level of non-switching, $Q_{NS}$, in a memory cell. The final reference level can be set closer to the "0" charge level, by appropriately adjusting the reference cell capacitor value if the switching value, $Q_S$, of the ferroelectric material used in the memory has a tendency to fatigue with operational cycles or to decay over time.

Second Reference Option

The present invention includes a second reference option which can be a mask programmable variation of the first reference. For this option, the P-channel devices MPO and MPE are physically disconnected from the reference ferroelectric capacitors CRO and CRE. Note that the pre-charge devices MPE and MPO are not shown in FIG. 16 to indicate that they have been removed from the circuit. Also, the plate line or bottom electrode terminals of CRO and CRE are disconnected from ground and actively driven by a reference plate driver cell which is the same as the plate driver cell shown in FIG. 33, described in detail below. This second reference option results in essentially the same type of linear ferroelectric capacitance term being developed on the reference bit lines WRO and WRE as the first reference option, with the only difference being that instead of traversing the hysteresis loop 38 of FIG. 10 from point 2 to point 3, this second reference option traverses the loop from point 3 to point 2.

Figure 16:
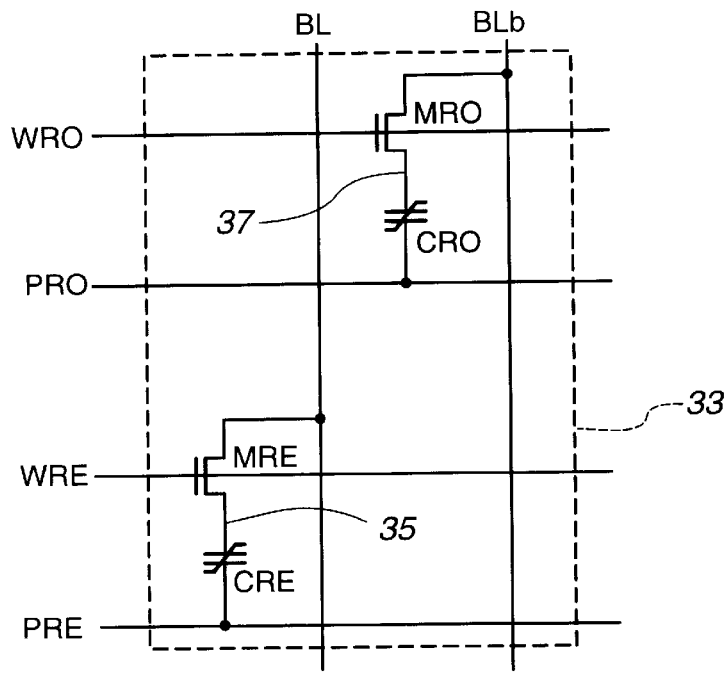
FIG. 16 is a schematic diagram of two 1T/1C ferroelectric reference cells utilizing plate line pulsing.
Figure 17:
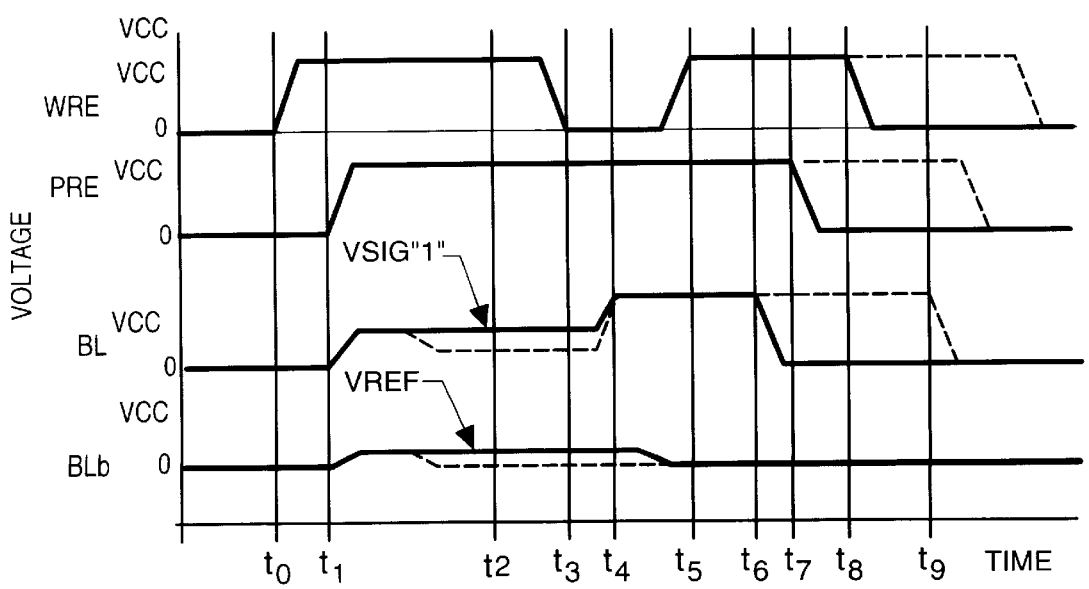
FIG. 17 is a timing diagram for the ferroelectric reference cells of FIG. 16.

The timing associated with the reference control signals for this second optional reference is different than the charge-shared reference shown in FIG. 15. The timing diagram for the pulsed plate reference of FIG. 16 is shown in FIG. 17. Referring to reference cell 33 of FIG. 16 and the timing diagram of FIG. 17 the operation is as follows: assuming that an even reference cell is used, at time $t_0$ the reference word line, WRE, is pulsed from zero volts to the VCC power supply level. At time $t_1$ the reference plate line PRE is pulsed from zero volts to the VCC power supply level, establishing the reference signal level as indicated at time $t_2$. At time $t_3$ the reference word line, WRE, is brought to zero volts to isolate the plate line noise as described in more detail below. At time $t_3$ the sense amplifiers, not shown, are latched, driving one of the bit lines to the power supply level, VCC, based on the data state stored in the memory cell. At time $t_5$ the reference word line WRE is reactivated to restore the information back into the memory cells. For the case in which the memory cells are set to zero volts at the end of the cycle, which is the return to zero case (RTZ), the bit lines are set to zero volts at time $t_6$. At time $t_7$ the reference plate line PRE is returned to ground with the reference word line WRE still active. This guarantees that the polarization state for the reference cell always remains in the same direction and avoids undershoot in the reference cell that would occur if the reference word line, WRE, is turned off before the reference plate line, PCE, is driven to ground. This avoids fatigue in the reference cell 33 of FIG. 16. At time $t_8$ the reference word line is driven to zero volts, completing the cycle. Optional dashed waveforms are shown in FIG. 17 for the non-return to zero case (NRTZ). It is important to note that for the reference cell to work properly the bit lines are ideally set to ground (zero volts)

first, and that the reference plate line is ideally also returned to ground before the reference cell is isolated from the respective bit lines as is shown in FIG. 17.

Memory Cell Operation

Figure 20:
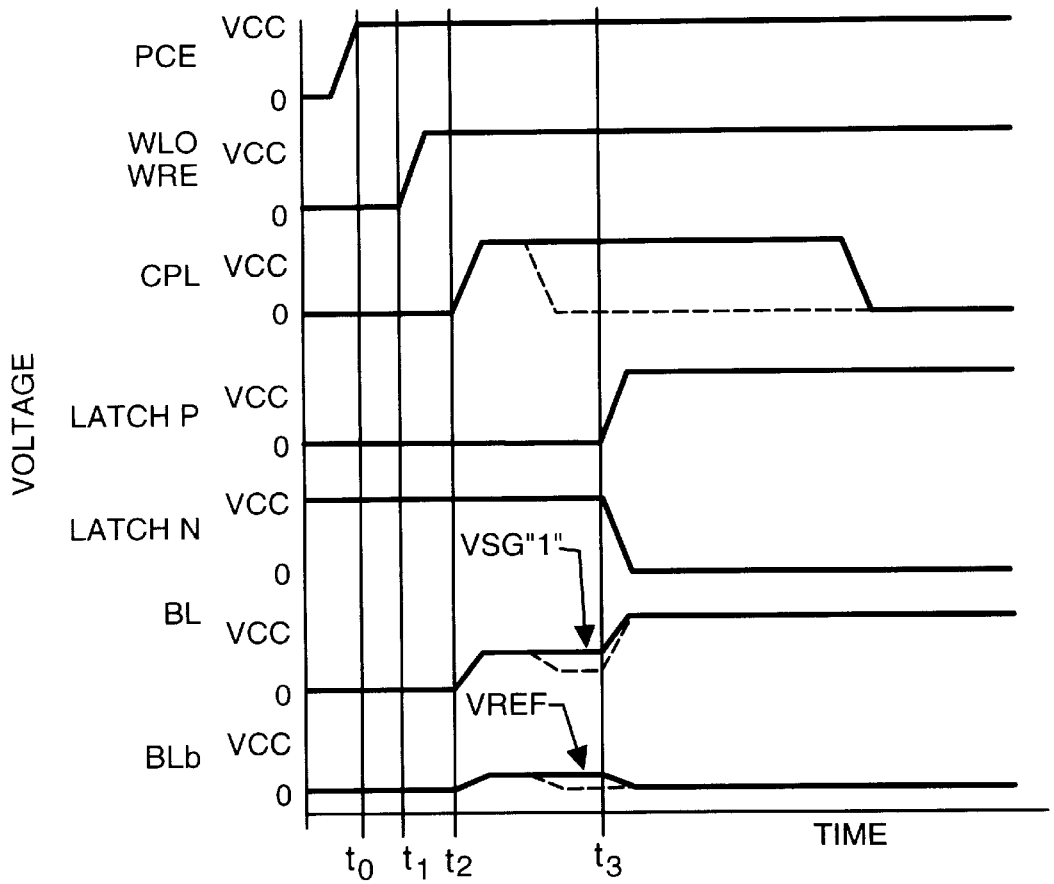
FIG. 20 is a timing diagram for a 1T/1C memory cell, including the "LATCH P" and "LATCH N" sense amplifier waveforms for latching the sense amplifier shown in FIG. 21.
Figure 21:
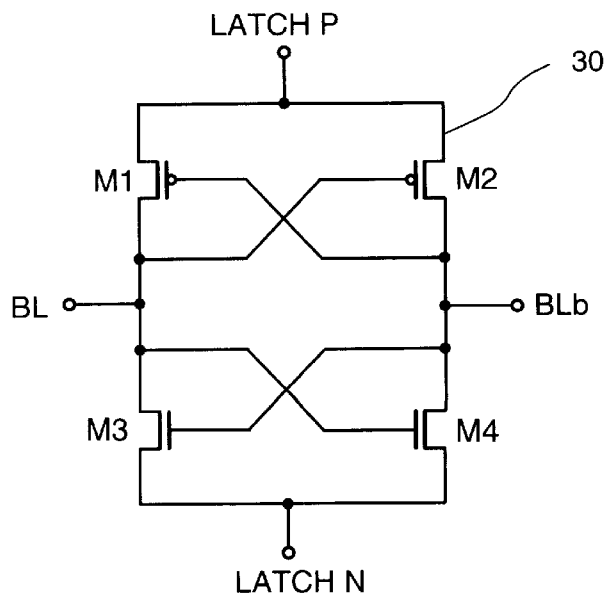
FIG. 21 is a schematic diagram of a prior art sense amplifier including "LATCH P" and "LATCH N" latching nodes.

A timing diagram is shown in FIG. 20 for accessing the memory cells in the memory array shown in FIG. 18. The individual memory cells 28 and reference cells 32 were previously described with reference to FIGS. 14 and 15, respectively. The bit lines BL0/BLb0 through BLN/BLbN are initialized to zero volts and then left tri-stated or floating at time $t_0$. The reference cell pre-charge signal PCE is driven high at time $t_0$. A representative word line, WL0, and reference word line, WRE, are activated at time $t_1$, and the corresponding plate line CPL, is pulsed at time $t_2$. At time $t_3$, the sense amplifier 30 shown in FIG. 21 is latched by pulsing the LATCH P and LATCH N nodes. As the LATCH P node rises, the cross-coupled bit lines BL/BLb start to drive one of the bit lines toward the power supply rail depending on the voltage that is on each bit line. Since the word line is still active, the internal cell nodes of the accessed memory cells follows the bit line potentials. If the data pattern along the word line is a single "0" in a field of "1's" as described earlier, then all but one bit line attached to the cells in the memory array begins to rise. Conversely, all the opposite bit lines except for one tends to remain near ground potential. As all the bit lines rise then all the internal memory cell nodes rise. The memory cells 28 of FIG. 14 are tied directly to the common plate line, CPL, in the array via the memory cell capacitors CC0 and CC1. This causes a great deal of charge to be coupled into the common plate line. The plate line driver is of finite "on" resistance and therefore cannot hold the plate line exactly at the power supply level but allows the plate line to have a slightly positive excursion depending on the speed of bit line transition and the impedance of the plate line driver.

Figure 19:
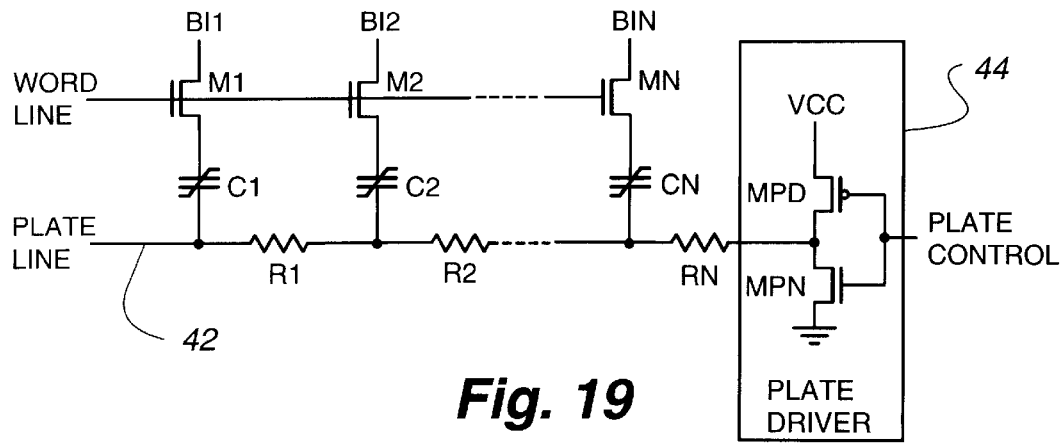
FIG. 19 is a schematic diagram of a portion of a single memory row showing in particular the distributed resistance of the plate line, and the plate line driver.

This coupling can be better understood by referring to the simplified drawing of FIG. 19. In this drawing, the plate line 42 is represented by a resistive line including resistive segments R1, R2, through RN. The conductor for plate line 42 may be metal, but there is still some resistance associated with the interconnect. The plate line driver 44 has some finite "on" impedance through the P-channel device MPD. As the majority of the bit lines BL1–BLN rise, the plate line 42 also rises. This signal is then coupled back through the one ferroelectric capacitor tied to the single bit line along the word line trying to stay low with the opposite data state. Depending upon the cell to bit line ratio, (generally low for a ferroelectric memory design) a large noise signal can be coupled through the plate line to this bit line and disturb the cell signal. If the reference plate line and the memory array plate line could be directly coupled together through zero resistance then this signal would be common mode. This, however, is not practical. The plate lines for the reference are generally located on one end of the array and may in fact have separate drivers, thus further isolating them from the memory array plate lines.

Solution for Minimizing Plate Line Noise

Two possible solutions exist for minimizing plate line noise, one of which has two separate implementations. One is to connect the plate lines together with a very low resistance path such that the time constant, Tc, of this path, (the resistance times the capacitance of the plate line; Tc=Rp×Cp), is much smaller than the edge rate of the latching bit lines. This is not practical for several reasons. One reason is that it is physically difficult to make electrical connections of low enough resistance to satisfy the time constant. A second reason is that it unduly complicates the layout of the reference cells.

A second solution is to isolate this noise mechanism from the bit lines. This isolation can be implemented in two different ways. The first is to place isolation devices between the memory array and the sense amplifier, (see U.S. Pat. No. 5,381,364 entitled "Ferroelectric-Based Ram Sensing Scheme including Bit-Line Capacitance Isolation", assigned to the assignee of the present invention and hereby incorporated by reference. The teachings of this patent are directed to the isolation of capacitive loads. This isolation technique, however, adds extra control wires to the chip layout. If it is necessary to write the full power supply level back into the memory cell, then both a P-channel and an N-channel device should ideally be used to isolate the sense amplifier from the bit lines. This often is difficult to implement in the narrow pitch of bit lines associated with a ferroelectric memory array.

The second approach for isolation, described here, is to isolate the noise coupling by turning off the selected word lines prior to latching the sense amplifier to prevent the noise coupling.

Figure 24:
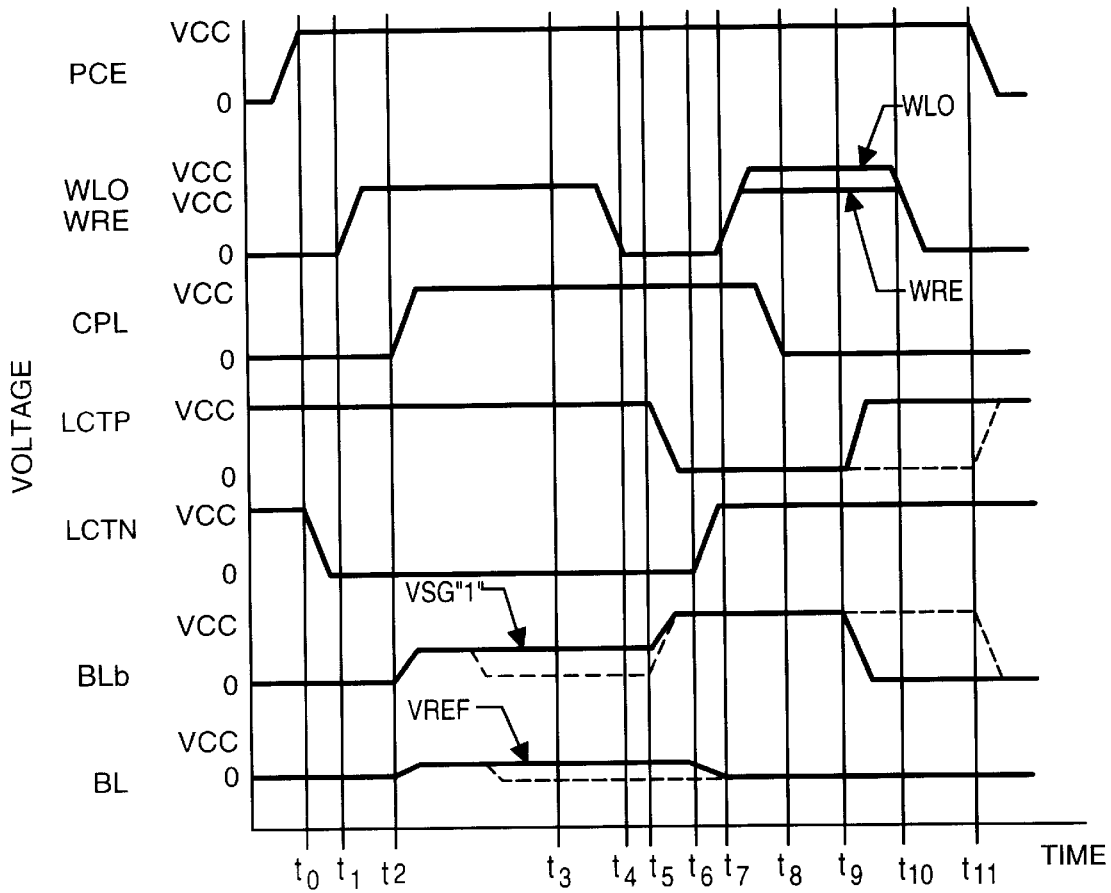
FIG. 24 is another timing diagram according to the present showing the waveforms of FIG. 22 and further including the waveforms of the signals for operating the sense amplifier of FIG. 23.

Referring to the timing diagram of FIG. 24, the operating sequence that follows is for isolating the noise coupling by turning off the selected word line WL0 and reference word line WRE prior to sensing. After the common plate line CPL is pulsed at time $t_2$, either in the "up-only" (solid line) or "up-down" (dashed line) mode, and the reference information has been transferred from the reference cells to the appropriate bit lines at time $t_3$, then the accessed word lines for the memory array, WL0, and reference, WRE, are brought to ground at time $t_4$. This then isolates the noise transferred along the shared plate lines (both reference and memory array plate lines) through the cell and reference capacitors and access devices to the bit lines.

To minimize the additional delay associated with turning off the word line a clamp device is added along the word line. This clamp device 59, shown in FIG. 30 is turned on at the same time as the word line clock is driven to ground. A key feature of clamp 59 is that it is placed along the word line to achieve maximum benefit in reducing the time interval required to bring the word line wire to ground. Since the WL word line interconnect is often a refractory metal there can be a significant delay associated with its discharge. Clamp 59 is positioned generally at the opposite end from the word line decoder/driver circuit 58 of FIG. 29 to achieve the minimum time constant. Further, since all the unselected word lines are already actively held at ground potential the clamp device control signal, CLMP, requires no special timing or decoding and can be globally routed, thus simplifying the overall layout and control logic.

Referring again to FIG. 24, the sense amplifiers begin latching at time $t_5$. The word lines are then reactivated at time $t_7$ to restore the information back into the memory cells. Adequate provision should be made to determine when all the data along a given word line has been transferred to the bit lines before the word line is turned off at time $t_4$. Also, before the word line is reactivated the sense amplifiers need to have adequate differential signal not to be overturned when the word lines are reactivated at time $t_6$ and the plate lines couple noise through the internal cell nodes as described above.

Sense Amplifier Noise

Figure 22:
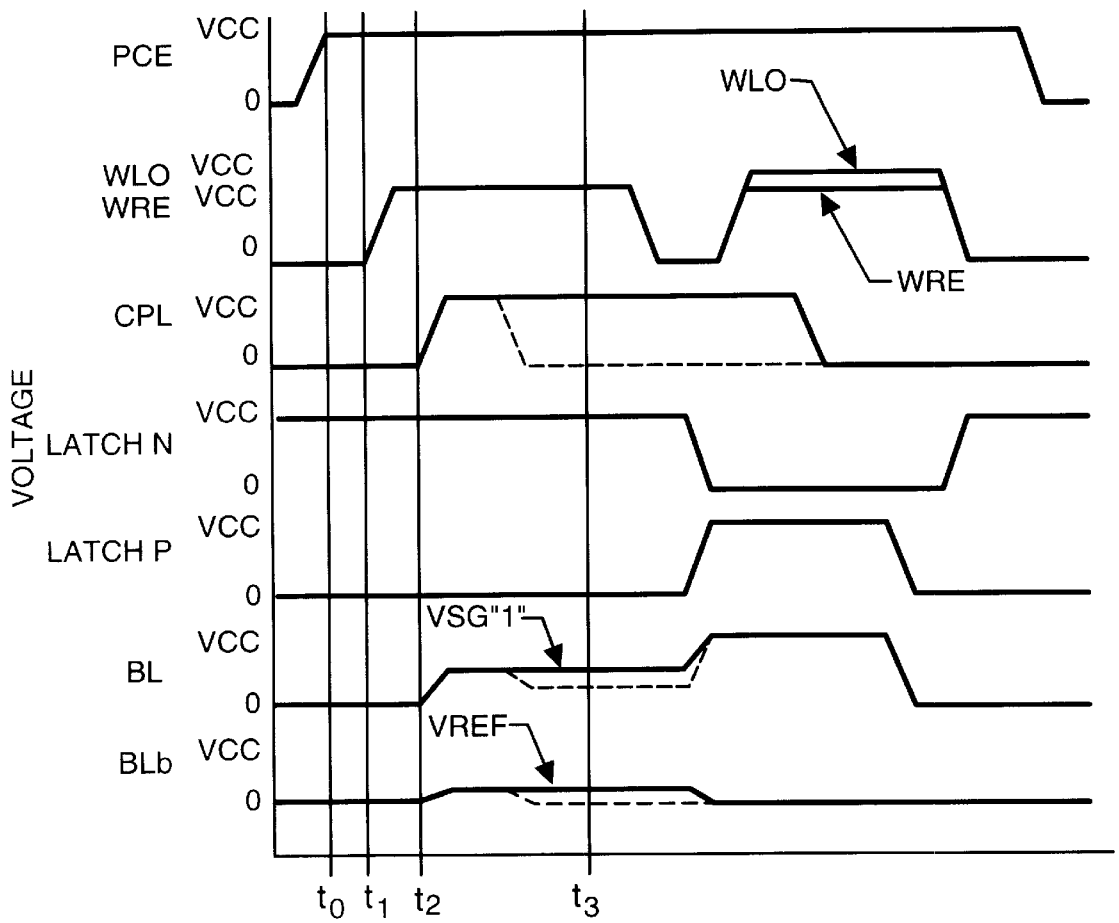
FIG. 22 is a timing diagram showing the waveforms necessary for operating a 1T/1C memory cell, 1T/1C reference cell, and associated sense amplifier of FIG. 21.

The following signals associated with control lines for the memory array of FIG. 18 and the sense amplifier of FIG. 21 are shown in the timing diagram of FIG. 22: the memory cell word line WL0, the reference cell word line WRE, the common plate line CPL, the reference cell pre-charge line PCE, the bit, BL, and bit bar, Blb, bit lines and the sense amp enable control lines LATCH N and LATCH P. Prior to time $t_0$, all signals are low except for the LATCH N signal. At time $t_0$, the reference cell pre-charge line is taken high. At time $t_1$, the word lines for the memory, WLO, and reference cell, WRE, are taken high. At time $t_2$, the common plate line is taken high. At time $t_3$, the charge information from the memory and reference cell ferroelectric capacitors has been transferred to the corresponding bit lines. If the voltage levels created by the charge transfer of the information from the memory and reference cell capacitors exceeds the thresholds of the cross-coupled devices of sense amplifier 30 shown in FIG. 21, then noise is coupled along the common latch nodes LATCH P and LATCH N to other sense amplifiers.

Solution for Minimizing Sense Amplifier Noise

Figure 23:
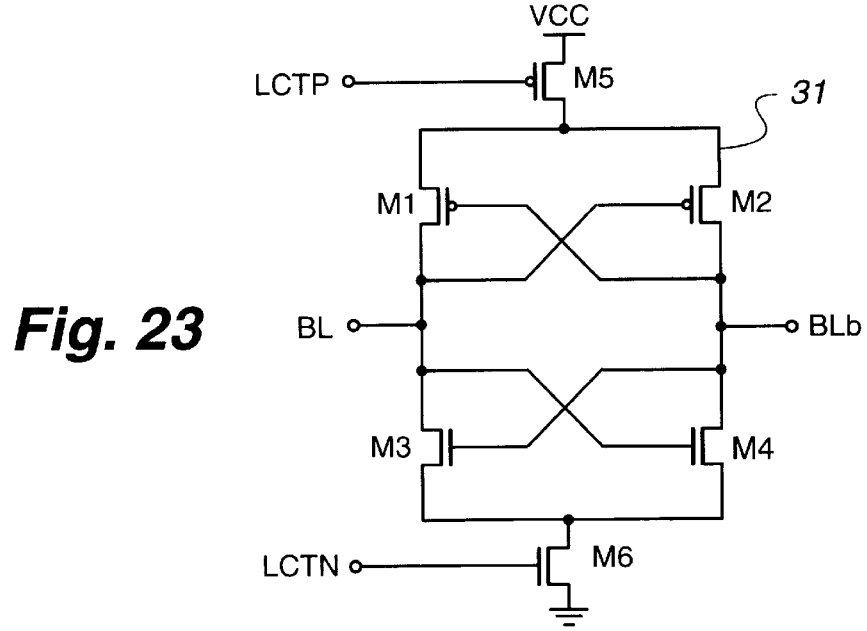
FIG. 23 is a schematic diagram of a sense amplifier modified according to the present invention to include separate latch transistors.

To resolve the sense amplifier noise issue whereby the common latch nodes transmit noise from one set of bit lines to another in an array it is necessary to isolate the latching of each sense amplifier with a separate latch transistor for the LATCH P node and the LATCH N node. The isolation of the sense amplifier is shown in FIG. 23. Note, however, that in FIG. 24 that the polarities of the latch signals are reversed with respect to FIG. 22 since the gates of the transistors M5 and M6 are driven, which adds a logic inversion. The modified timing diagram is shown in FIG. 24. The LATCH P and LATCH N signals are replaced by the LCTP and LCTN signals, respectively. In FIG. 24, the voltage of bit lines BL and BLb are also shown.

Referring now to the timing diagram of FIG. 24, sense amplifier 31 of FIG. 23, memory cell 28 of FIG. 14 and reference cell 32 of FIG. 15, the following timing sequence is described. Before time $t_0$ all signals are low, except for the LCTN signal. At time $t_0$, the PCE pre-charge signal is brought high and the LCTN signal begins its transition to a low data state. At time $t_1$, an representative odd word line WLO and even reference word line WRE are brought high. At time $t_2$, the common plate line CPL is brought high. Note that the solid CPL waveform is used for "up-only" sensing and the dashed CPL waveform (seen between times $t_2$ and $t_8$) is used for "up-down" sensing. In response to the CPL waveform transitioning to a high logic state, voltages are formed on the BL and BLb bit lines. The solid bit line traces are the bit line voltages responding to the "up-only" CPL waveform, whereas the dashed bit line traces are the bit line voltages responding to the "up-down" CPL waveform. The BLb waveform is the signal generated by a memory cell having "1" data state, and the BL waveform is the signal generated by a reference cell. At time $t_4$, the WLO and WRE word lines are brought low to provide noise isolation according to the present invention. At time $t_5$ the LCTP signal is brought low, which starts the latching of the sense amplifier. At time $t_6$ the LCTN signal starts the transition high, which is completed at time $t_7$. At time $t_7$, the full logic states are established on the BL and BLb lines. At time $t_7$, the WLO and WRE word lines are again brought high. Note that the WLO waveform is bootstrapped to a voltage above the VCC supply level in order to fully rewrite the logic state into the ferroelectric memory cell capacitor. At time $t_8$, the common plate line is driven low. At time $t_9$ the LCTP signal is brought high and the bit line pre-charge timing signal, not shown, is activated, which resets the bit lines to the initial low voltage condition. At time $t_{10}$, the word lines are brought low. The solid lines from time $t_9$ on represent a "return to zero (RTZ)" sensing method option whereby no charge is left in the memory cells at the time the word lines are turned off. An alternative "non-return to zero (NRTZ)" sensing method is represented by the dashed LCTP and BLb waveforms from time $t_9$ on whereby charge remains in the logic one data state memory cells at the time when the word lines are turned off. Either the RTZ or NRTZ method may be used in the noise isolation sensing method of the present invention.

Ferroelectric 1T/1C Memory Block Diagram

Figure 25:
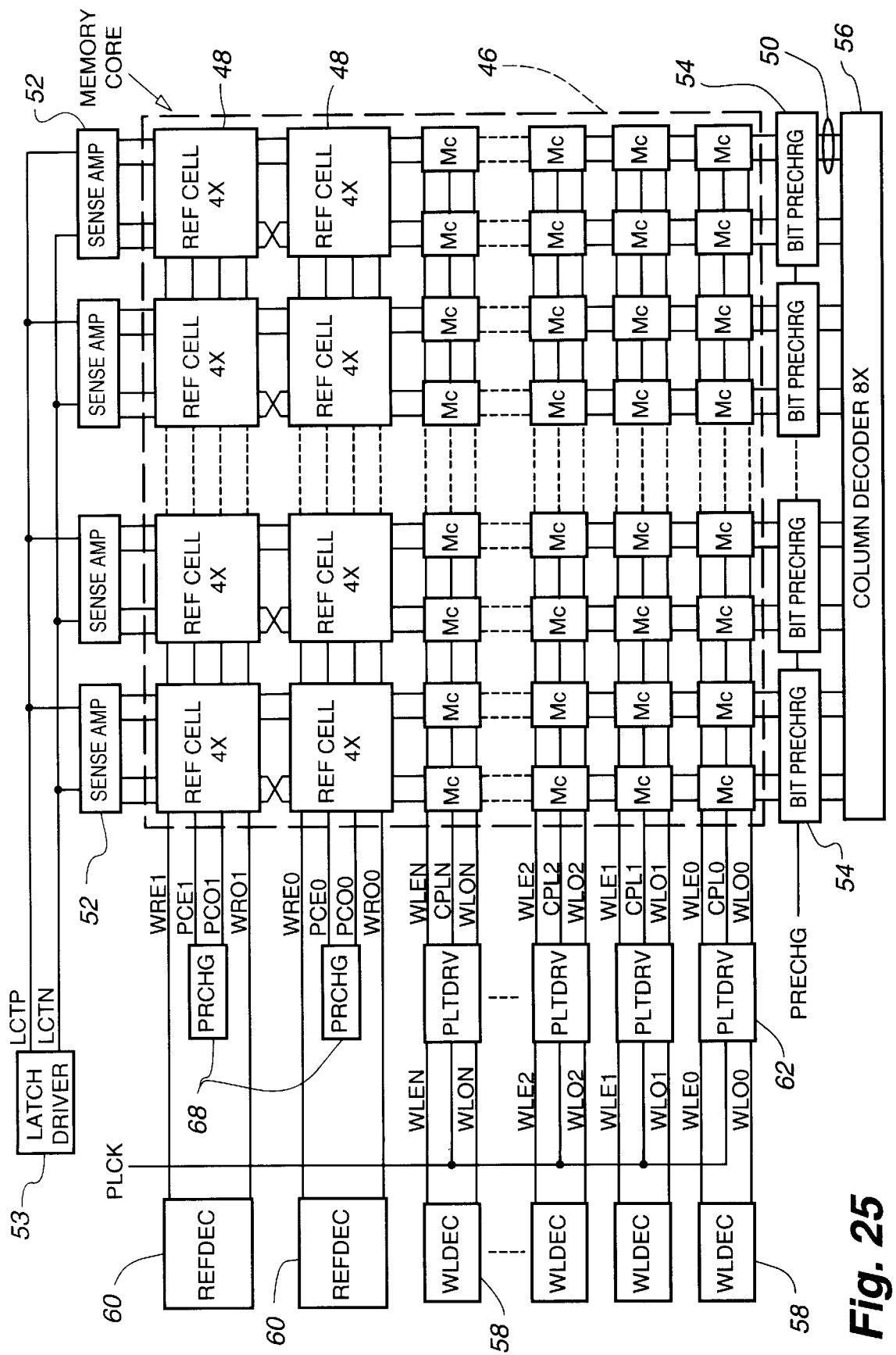
FIG. 25 is a block diagram of a 1T/1C memory according to the present invention including a 1T/1C memory array including memory cells and reference cells, word line decoders, reference word line decoders, plate drivers, reference cell pre-charge blocks, sense amplifiers, latch driver, bit pre-charge blocks and column decoder.

FIG. 25 shows a block diagram for a ferroelectric memory design showing a single memory core array 46. This block diagram shows the basic direct peripheral circuitry needed to interface with the memory array 46. The blocks shown in FIG. 25 are shown and described in greater detail with reference to FIGS. 27–30 and FIGS. 33–38.

Figure 27:
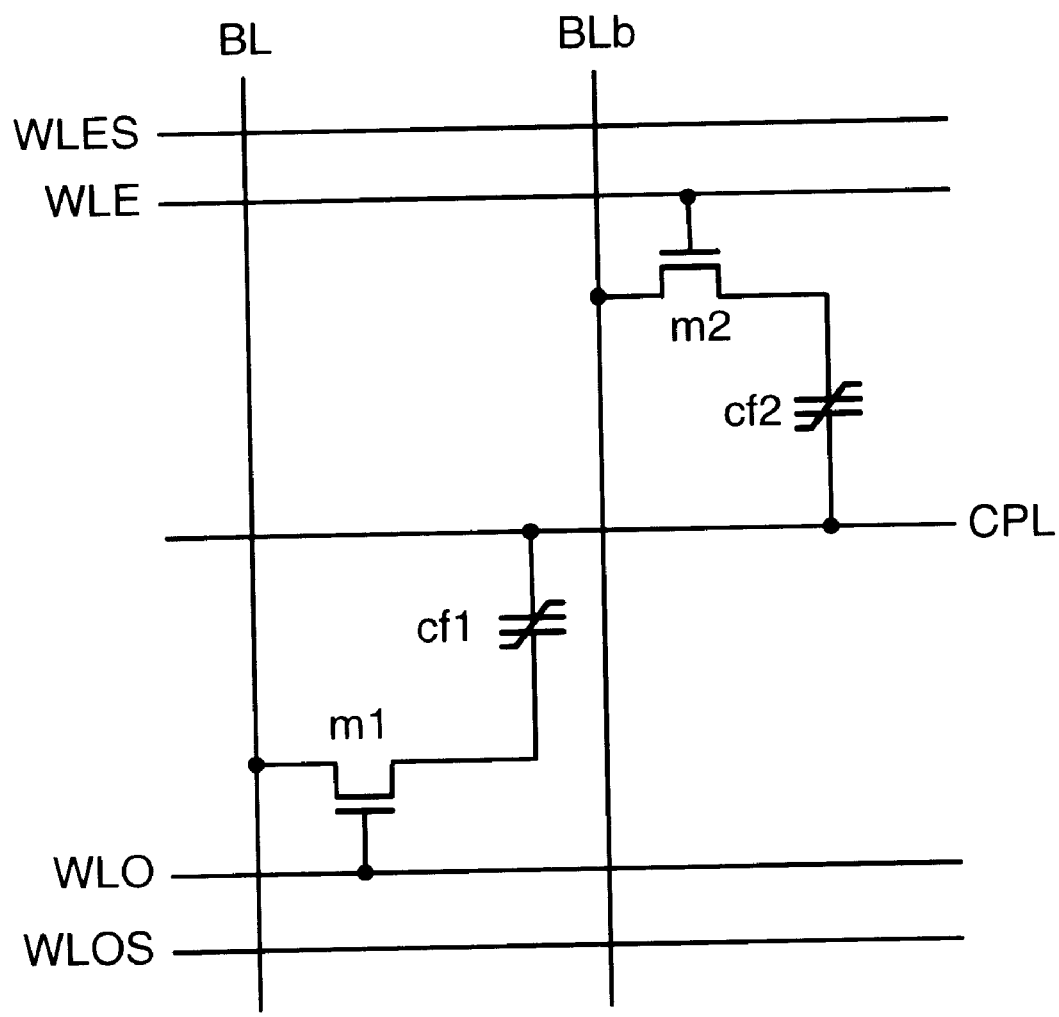
FIG. 27 is a schematic diagram of two 1T/1C memory cells used in the memory cell blocks of FIGS. 25 and 32.
Figure 28:
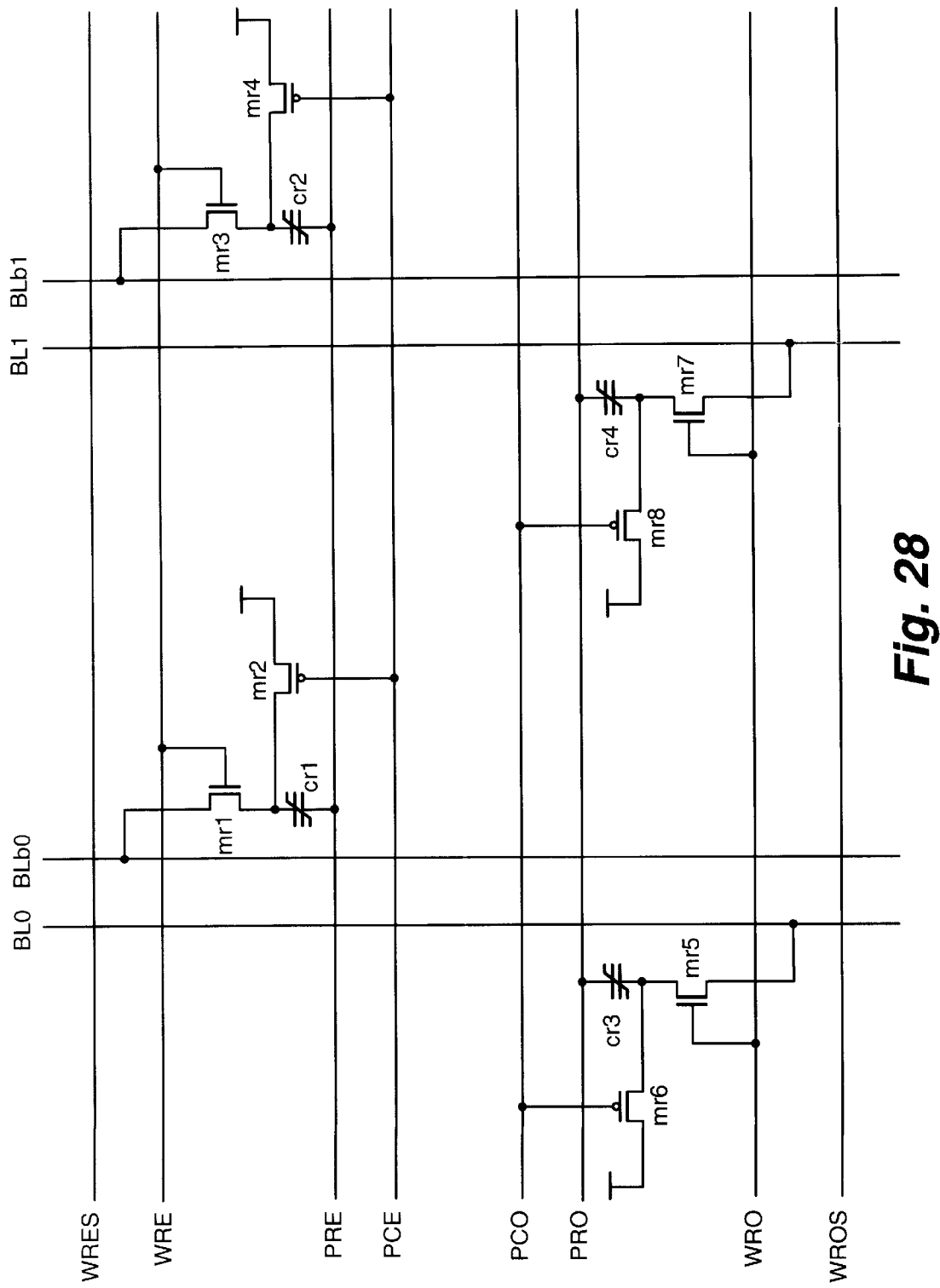
FIG. 28 is a schematic diagram of four 1T/1C reference cells used in the reference cell blocks of FIGS. 25 and 32.

The memory array of the present invention uses a folded bit line architecture as previously described. The memory core 46 of the 1T/1C memory shown in FIG. 25 is built up by arranging the individual memory and reference cells shown in FIGS. 27 and 28 into rows and columns. Each memory cell, Mc, is comprised of a pair of 1T/1C memory cells. These memory cells are shown in FIG. 27. One of the 1T/1C memory cells is connected to an even word line, WLE, and the other 1T/1C memory cell is connected to an odd word line, WLO. It should be further noted that in the configuration shown in FIG. 25, the common plate line, CPL0 through CPLN, is shared between adjacent rows of memory cells although separate plate lines can be used if desired. In addition to a folded bit line architecture, the memory array of FIG. 25 also employs twisted bit lines (not shown in FIG. 25; see FIG. 32). The twisting of bit lines requires the use of four reference rows for proper sensing. Eight representative reference cell blocks 48 are labeled "REF CELL 4X" in the block diagram of FIG. 25. Each reference cell block 48 is shown in greater detail in the circuit diagram of FIG. 28. Each Ref Cell 4X reference block 48 contains four individual reference cells connected to two columns and two reference rows, i.e. two sets of bit line pairs 50 (BL/BLb), or to four total bit lines. A detailed circuit schematic for the four individual 1T/1C reference cells is shown in FIG. 28. Whenever a word line is accessed for the memory cell Mc the appropriate reference cell in block 48 is connected to the complement bit line so that bit lines are paired together. One bit line is connected to one memory cell Mc and an adjacent bit line is connected to one reference cell in block 48. The connection of reference cells is determined logically based on the location of the particular word line accessed. The physical layout of the memory cells Mc in array 46 is such that each word line WL accesses a memory cell on every other bit.

Figure 35:
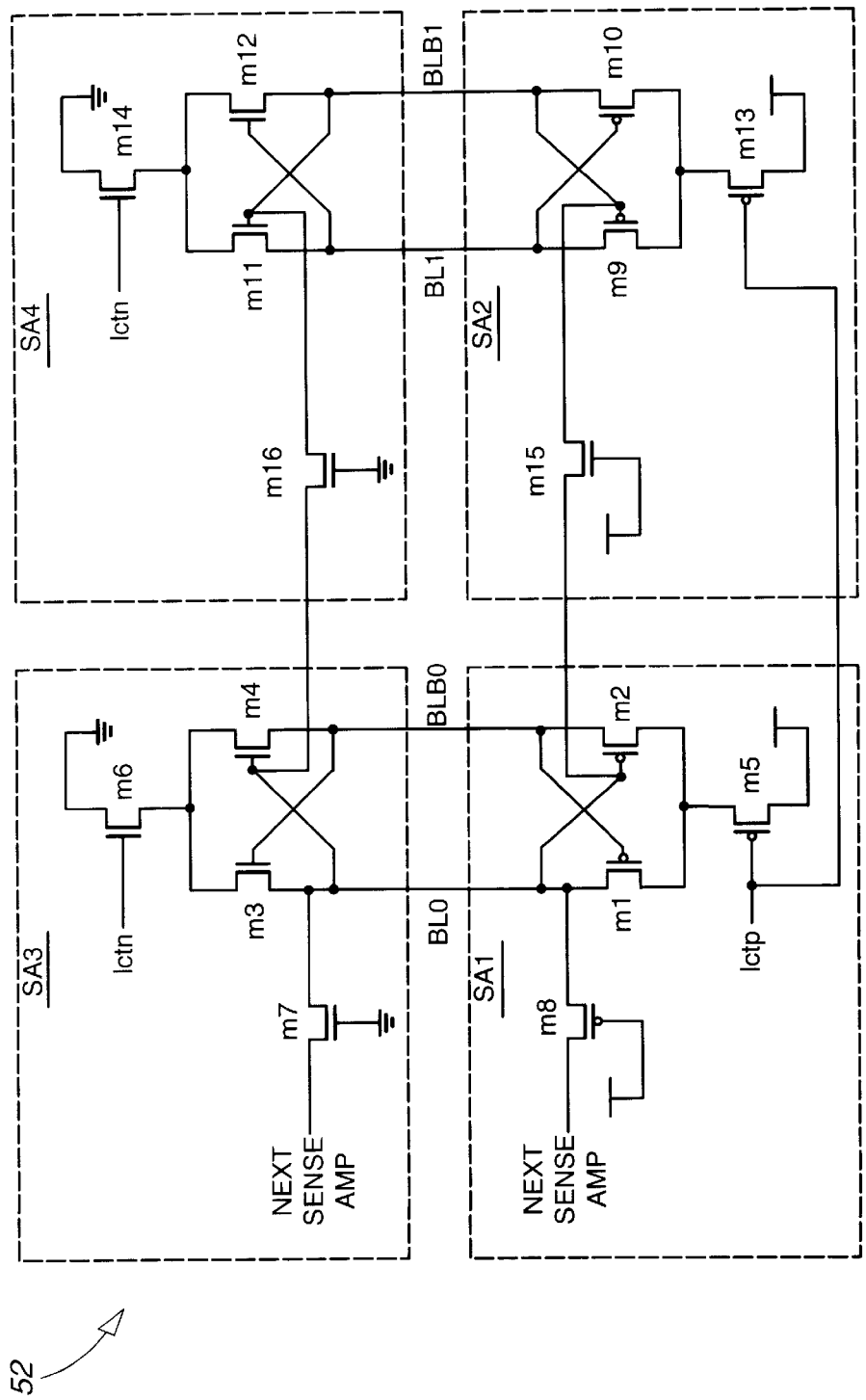
FIG. 35 is a schematic diagram of two sense amplifiers used in the sense amplifier blocks of FIGS. 25, 26 and 32.
Figure 37:
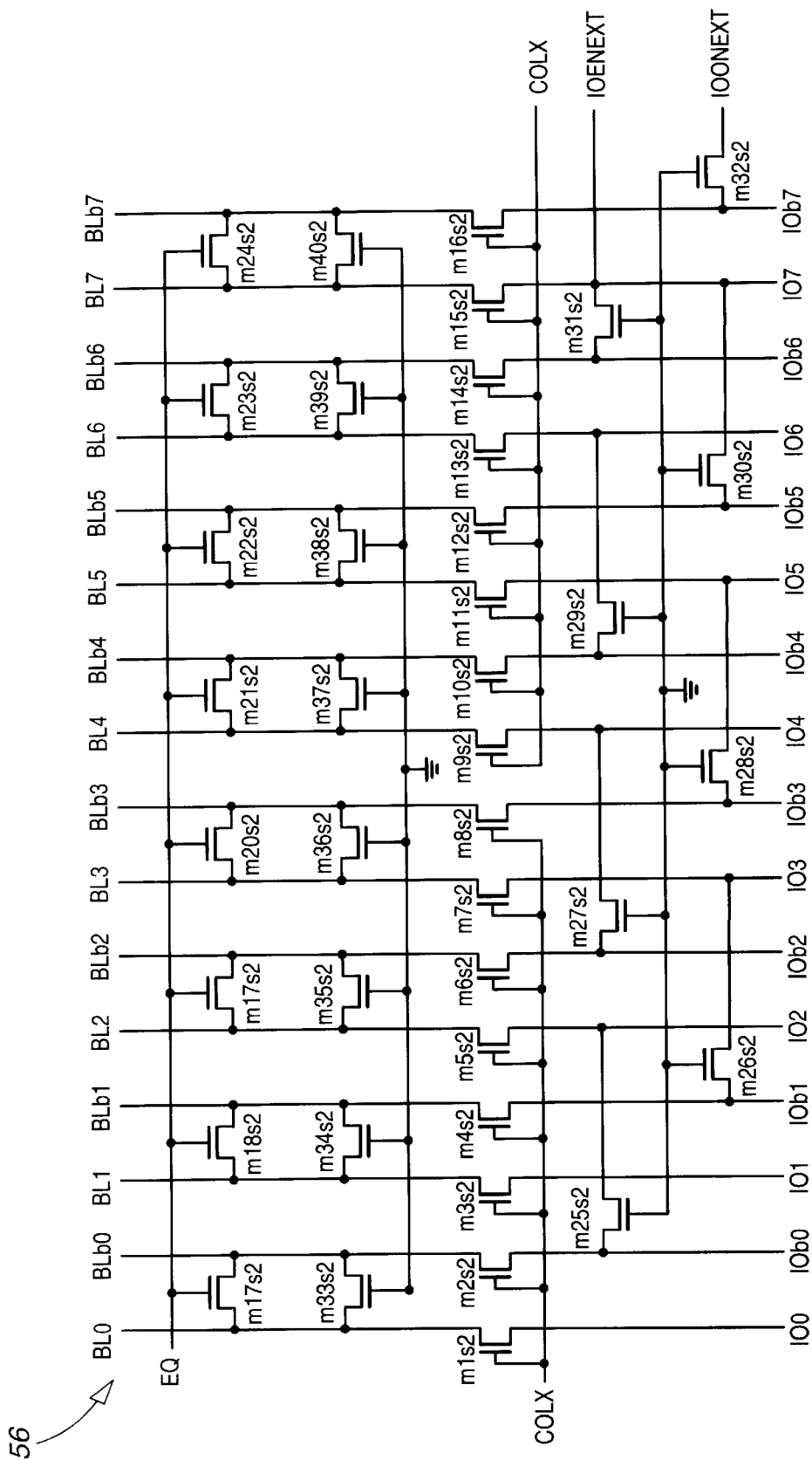
FIG. 37 is a schematic diagram of a column decoder used in the column decoder blocks of FIGS. 25, 26 and 32.
Figure 38:
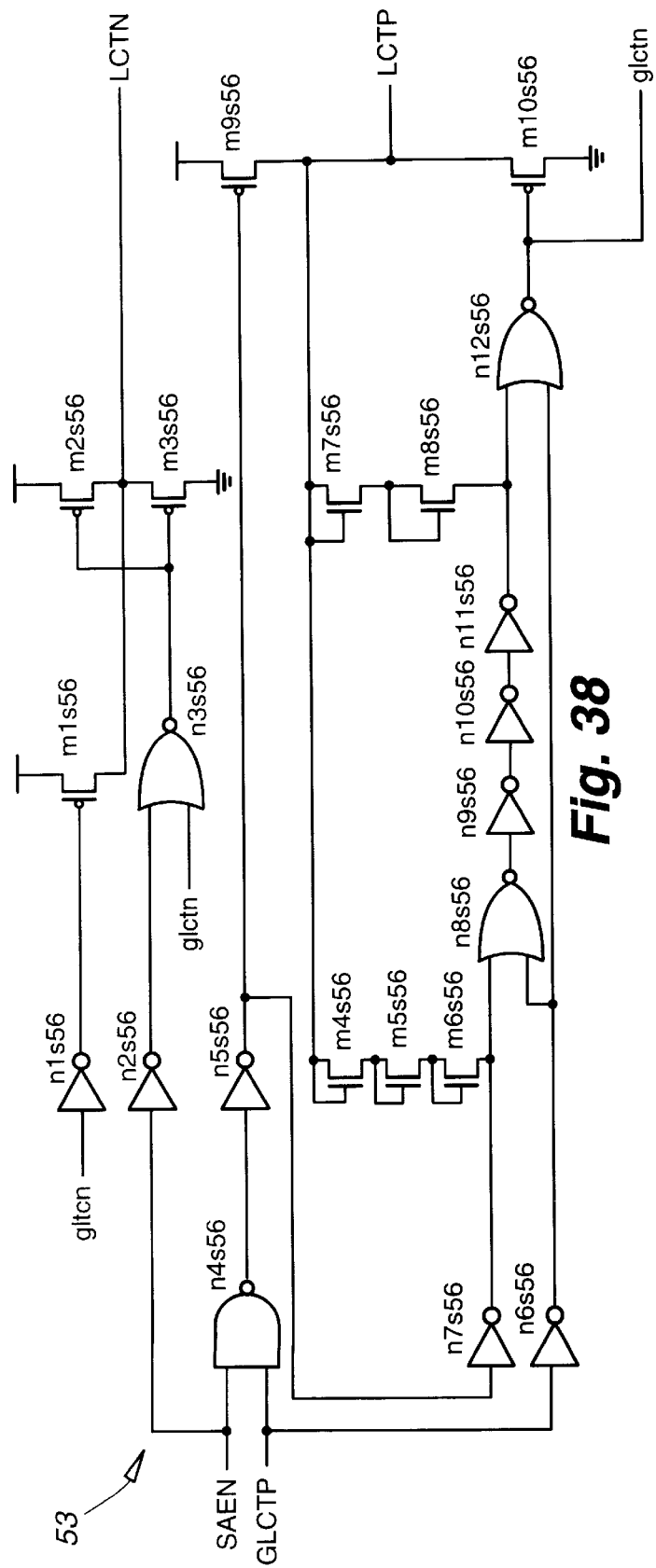
FIG. 38 is a schematic diagram of a latch driver used in the latch driver blocks of FIGS. 25 and 26.

Bit line pairs 50 comprise columns that are connected to two sense amplifiers in block 52 as indicated in the block diagram of FIG. 25. The detailed circuit schematic for the sense amplifier block 52 is shown in FIG. 35. Each sense amplifier block 52 includes two individual sense amplifiers serving two columns or two bit line pairs 50. The sense amplifiers are driven by latch driver 53, which provides the LCTP and LCTN drive signals. The detailed schematic diagram for latch driver 53 is shown in FIG. 38. At the bottom of array 46 and extending further in the column direction are blocks 54 labeled "BIT PRECHRG" that contain devices to initialize the bit lines 50 to zero volts. The bit line pre-charge schematic is shown and described in further detail below with respect to FIG. 36. At the very bottom of FIG. 25, eight columns are connected to a column decoder 56 labeled "COLUMN DECODER 8X". The schematic for decoder block 56 is shown in FIG. 37 and described in further detail below. Column decoder 56 connects to eight bit line pairs or columns 50 and transfers the data for the selected word line out to other peripheral circuitry in bytes (8 bits).

Figure 33:
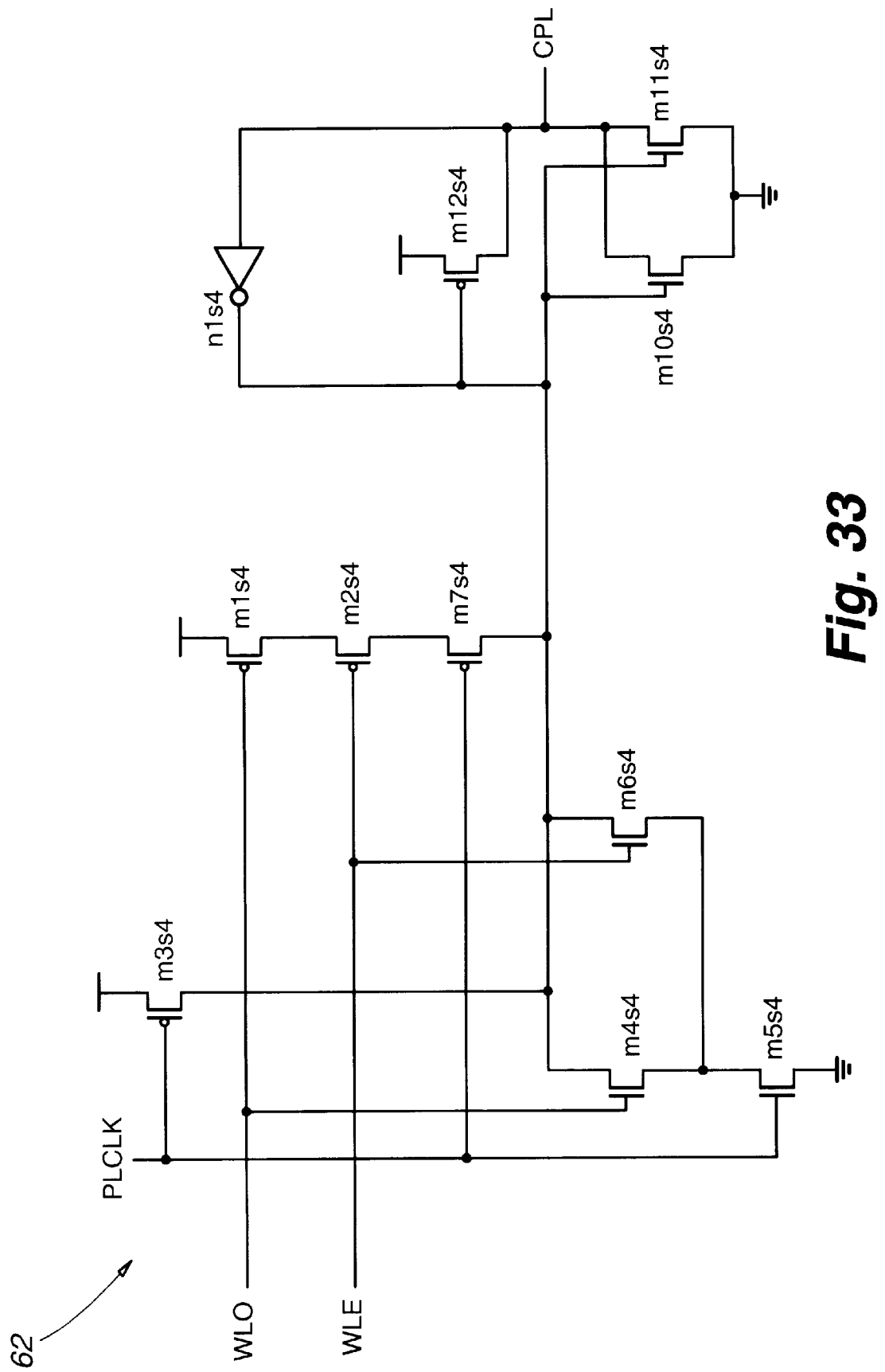
FIG. 33 is a schematic diagram of a plate line driver used in the plate line driver blocks of FIGS. 25, 26 and 32.
Figure 34:
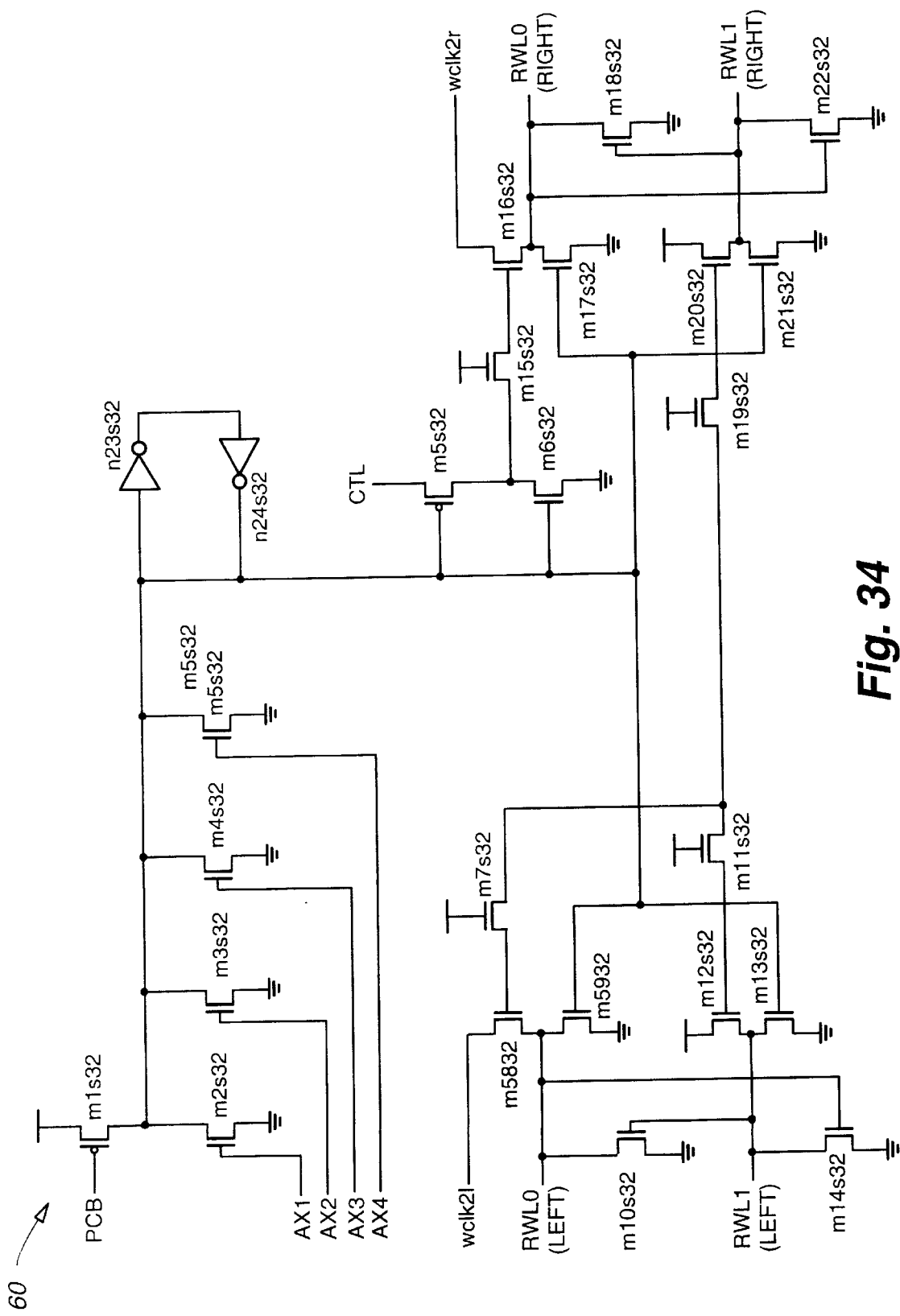
FIG. 34 is a schematic diagram of two reference word line decoders used in the reference word line decoder blocks of FIGS. 25 and 26.

The word lines WL are selected and driven by the word line decoder blocks 58 labeled "WLDEC". The schematic for the word line decoder is shown in FIG. 29 and described in further detail below. Similarly, the reference word lines WRE and WRO are selected and driven by the reference word line decoder blocks 60 labeled, "REFDEC". The schematic for the reference word line decoder is shown in FIG. 34 and described in further detail below. Each word line decoder 58, when selected, also selects a plate line driver 62 in the array. The plate line drivers 62 are labeled "PLTDRV". The detailed schematic for plate line driver 62 is shown in FIG. 33 and described in further detail below. For the array configuration shown in FIG. 25, the plate lines CPL0–CPLN are common for a pair of adjacent rows. Each common plate line, CPL0–CPLN, is then driven by a respective PLTDRV plate driver 62.

Optional reference plate line drivers are not shown in the block diagram of FIG. 25. Plate drivers can be used to drive the reference plate lines in the same manner as the memory array plate lines if desired, or the reference plate lines may be simply grounded. Either function is metal-mask programmable on the memory chip or otherwise programmable, if desired. If the pulsed drive option is desired, a plate line driver circuit such as plate line driver circuit 62 can be used, which is shown in FIG. 33.

The pre-charge driver 68 shown in the FIG. 25 block diagram can utilize any standard CMOS driver circuit with suitable timing and functionality. Pre-charge driver 68 is used to drive the control signals labeled PCO0, PCE0, PCO1, and PCE1 in FIG. 25 used to initialize the ferroelectric reference capacitor.

Figure 26:
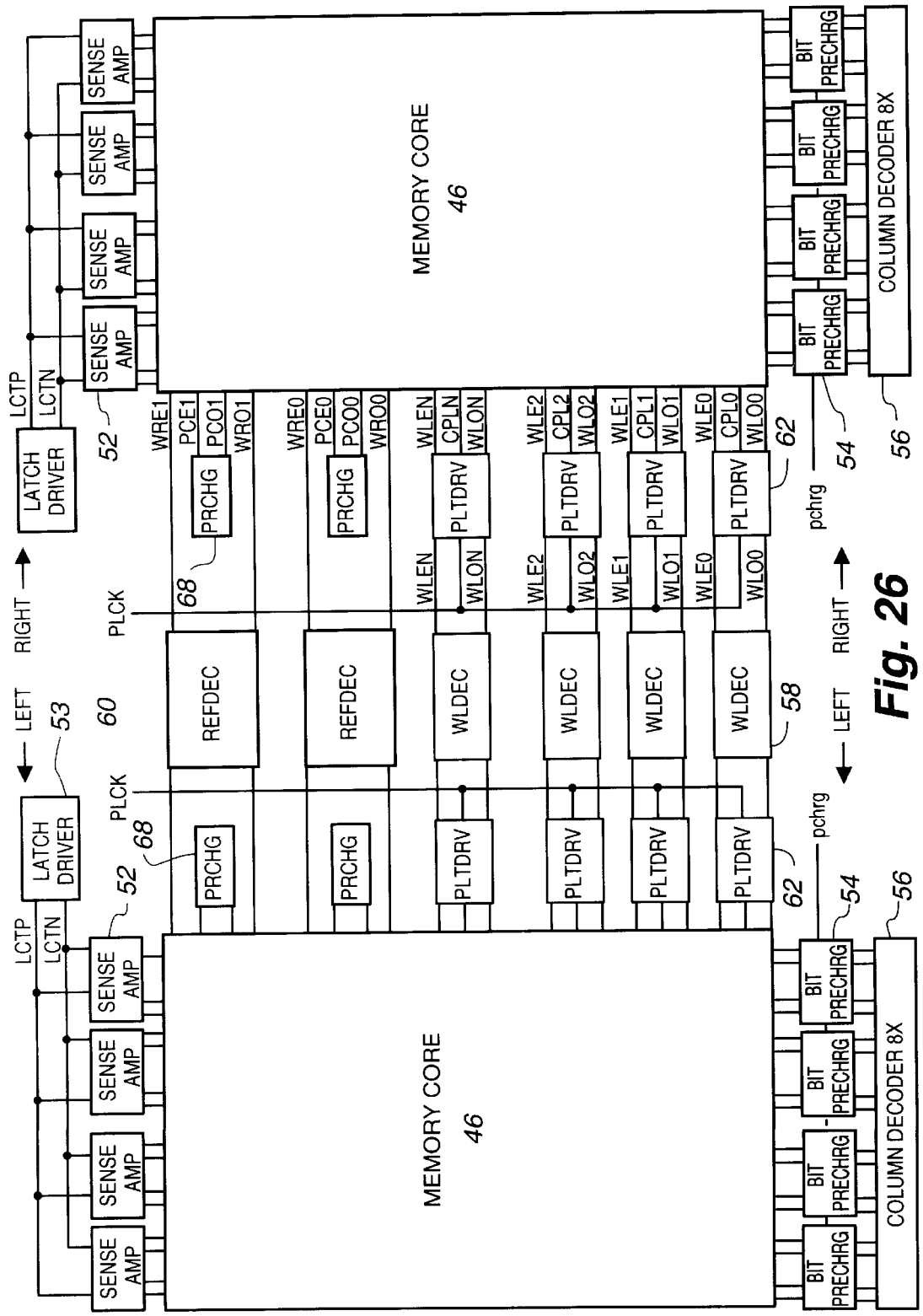
FIG. 26 is a block diagram of a 1T/1C memory according to the present invention showing the same blocks as in FIG. 25, but further including two memory cores.

Turning now to FIG. 26, a block diagram of a 1T/1C memory is shown that more closely resembles an actual memory chip layout. Note that there are two memory cores 46, and that the WLDEC word line decoders 58 have two sets of outputs coupled to plate drivers 62. The word line decoders 58 are placed between the two memory cores 46. The plate drivers 62 are actually placed at intervals (not shown in FIG. 26; best seen in FIG. 32) within the memory cores 46. It can be seen from the individual schematic diagrams of the reference row line decoders 60 and the memory array word line decoders 58 that the both sets of decoders drive the memory cores 46 symmetrically on either side.

The individual schematic diagrams for the blocks shown in FIGS. 25 and 26 are shown and the structure, timing and operation described in further detail below with respect to FIGS. 27–30 and FIGS. 33–38.

Turning now to FIG. 27, two 1T/1C memory cells are shown that comprise the Mc memory cells blocks shown in FIG. 25. A first cell includes access transistor M1 coupled to ferroelectric capacitor CF1. Transistor M1 is coupled to the BL bit line and the WLO word line. Ferroelectric capacitor CF1 is coupled to the CPL common plate line. A second cell includes access transistor M2 coupled to ferroelectric capacitor CF2. Transistor M2 is coupled to the BLb bit line and the WLE word line. Ferroelectric capacitor CF2 is also coupled to the CPL common plate line. Note the extra wires WLES and WLOS in the cell. These wires are shunt polysilicon wires used in the cell layout to reduce the overall word line delay and are described in further detail below with respect to FIGS. 40 and 41. The WLES and WLOS wires run parallel to the actual word lines and do not add any additional space in the layout. The WLES and WLOS wires are only connected at breaks in the array such as occur at the connection to the plate drivers and word line decoders, and at the edges of the array.

Referring now to the reference cell schematic of FIG. 28, the operation and structure is the same as described previously with respect to FIG. 15. Note that the schematic includes four separate 1T/1C reference cells. A first reference cell includes an N-channel transistor MR1 and a P-channel transistor MR2, as well as a ferroelectric reference capacitor CR1. A second reference cell includes an N-channel transistor MR3 and a P-channel transistor MR4, as well as a ferroelectric reference capacitor CR2. The first and second reference cells are coupled to the reference word line WRE, the reference plate line PRE, and the reference pre-charge line PCE. The first reference cell is also coupled to bit line BLb0, and the second reference cell is also coupled to bit line BLb1. A third reference cell includes an N-channel transistor MR5 and a P-channel transistor MR6, as well as a ferroelectric reference capacitor CR3. A fourth reference cell includes an N-channel transistor MR7 and a P-channel transistor MR8, as well as a ferroelectric reference capacitor CR4. The third and fourth reference cells are coupled to the reference word line WRO, the reference plate line PRO, and the reference pre-charge line PCO. The third reference cell is also coupled to bit line BL0, and the fourth reference cell is also coupled to bit line BL1.

As explained with respect to FIG. 15, the key function of the reference cells shown in FIG. 28 is to provide a charge-shared reference voltage on the bit line that is set between the logic zero and logic one voltages produced by the Mc ferroelectric memory cells. The timing diagram for the reference cells shown in FIG. 15 and FIG. 28 was described with respect to FIG. 24; the layout for a reference cell according to the present invention is described below with respect to FIGS. 43–46.

Referring now to FIG. 29, the word line decoder provides standard decoding, clamps for unselected word lines, and bootstrapping for applying the is full power supply potential to the word lines. The basic operation of the word line decoder is described in co-pending patent application, Ser. No. 08/663,032, assigned to the assignee of the present invention and entitled "Low Voltage Bootstrapping Circuit", which is hereby incorporated by reference. The word line decoder circuit of FIG. 29 also provides a means for isolating the word line clocks WLCLK1L, WLCLK2L, WLCLK1R, and WLCLK2R from the word lines WLE and WLO when the bootstrapping is applied. The word line isolation is accomplished via the control signal CTL.

The word line decoder circuit 58 shown in FIG. 29 includes transistors M1 through M22, and inverters N23 and N24, which form a latch. P-channel transistor M1 receives the pre-charge control signal PCB, and N-channel transistors M2 through M4 receive address line signals AX, AY, and AZ. The output at node 64 is maintained by the operation of latch N23, N24. Transistors M5 and M6 form an inverter whose power terminal is controlled by the CTL signal. Transistors M7, M11, M15, and M19, are the isolation transistors that allows the gates of transistors M8, M12, M16, and M20 to bootstrap the selected WLE and WLO word lines. Note that word line driver circuit is symmetrical, providing two odd and two even word line signals for the left and right portions of the memory array. Word line decoder 58 also receives four word line clock signals WLCLK1L, WLCLK1R, WLCLK2L, and WLCLK2R, which select the desired word line.

Plate Line Segmentation

In building up large arrays of cells in the design of a ferroelectric memory consideration should be given to the architecture utilized. Ferroelectric memories have the additional requirement over conventional DRAMs of an extra control wire, the plate line, to allow for polarization of the ferroelectric memory cells. The power consumption in a ferroelectric memory is generally dominated by the charging and discharging of the bit line capacitance. This is similar to the nature of power consumption in a DRAM. A scheme for segmenting the plate lines and for the overall array architecture for a 1T/1C ferroelectric memory according to the present invention is described below. The segmentation of the plate line and division of the memory blocks reduces the overall fatigue requirements for a ferroelectric memory cell and in addition, reduces the chip operating power and current transients that are created.

Figure 31:
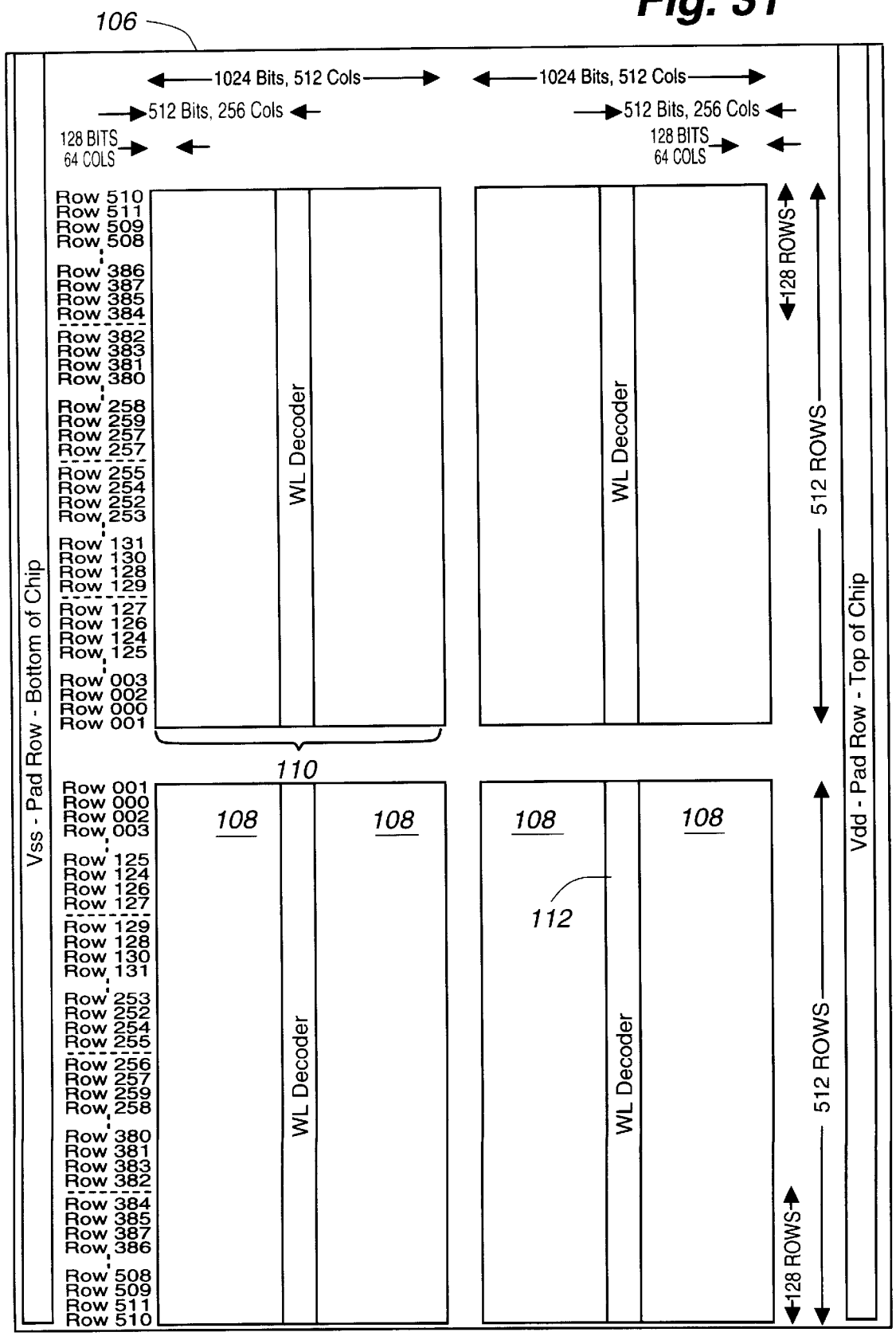
FIG. 31 is an architectural diagram of the memory chip of the present invention showing the major memory blocks.

FIG. 31 is the overall chip architecture for a 1-Megabit memory. The same architectural approach of the present invention is easily extended to higher or lower densities as desired. The architecture shown in FIG. 31 divides the memory into four major blocks 110 of 256K bits each wherein "K" refers to the binary value of 1024 or in decimal form a total of 262,144 bits. Each major block 110 contains a word line decoder 112 that symmetrically divides and drives memory array sections 108 in both directions. Word line decoder 112 is capable of selecting one of 512 rows and further can be selected to drive either the left or right half memory array 108. The decoding allows the selection of 256 columns in either the right or left half memory array.

Figure 32:
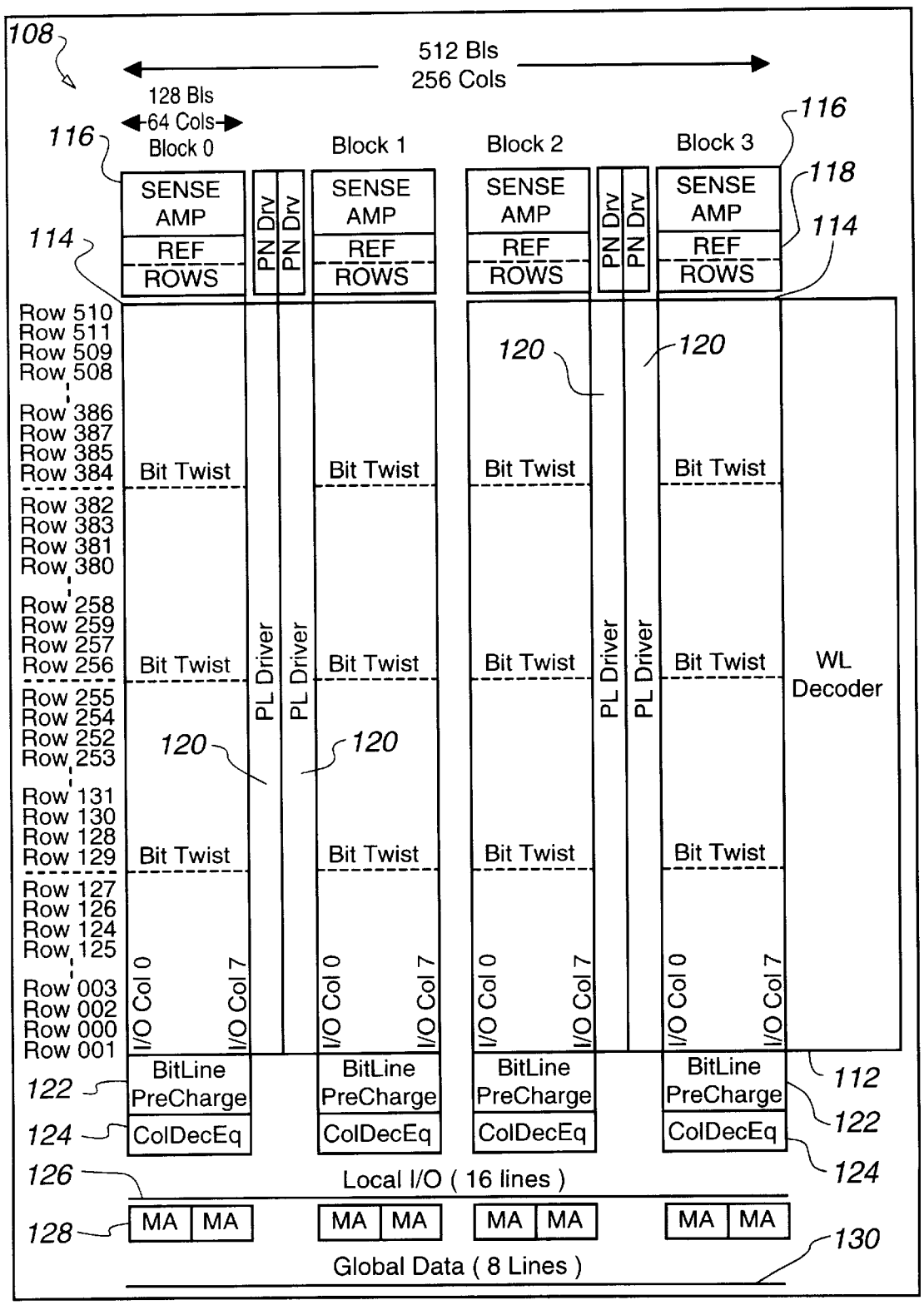
FIG. 32 is a more detailed block diagram of one of the major memory blocks shown in FIG. 31.

FIG. 32 shows further detail of the word line decoder 112 and one of the memory arrays 108 of FIG. 31. FIG. 32 further shows the division of the memory array 108 into four column sections 114, four blocks of sense amplifiers 116, four blocks of reference rows 118, four blocks of plate line drivers 120, four blocks of bit line pre-charge circuits 122 and four blocks of column decoders 124. Also shown in FIG. 32 are local I/O lines 126, eight main sense amplifiers 128 labeled "MA", as well as global data lines 130. Each plate driver circuit 120 shown in FIG. 32 drives a column section 114. It is important to note that each column section 114 contains 64 columns/bit line pairs. Plate line drivers 120 are paired together in two places along the word line between column sections 114 to allow for the minimum use of chip area as shown in FIG. 32. Also, this is placement optimizes (minimizes) the delay in driving any one of the four segments of column sections 114 along the total word line length of 256 columns. Pairing the plate line driver circuitry in this fashion allows the sharing of various control circuitry and power bus routing to reduce the overall chip area used. The selection of one of four plate drivers 120 that drive only one column section 114 of memory array 108 reduces the fatigue applied to the memory cells. Previous approaches activated plate lines for all accessed cells along a word line thus exposing all cells along the selected word line to fatigue.

Referring again to FIG. 31, whenever a particular word line decoder 112 is accessed in one of the four major blocks 110, either the right or left half memory array 108 is accessed. All 256 ferroelectric memory cells of the four blocks of column sections 114 of FIG. 32 are activated connecting the ferroelectric memory cells to bit lines. Along this word line only one of the column sections 114 has its sense amplifiers 116, plate drivers 120, column decoders 124 and bit line pre-charge blocks 122 in the active mode. To insure that the remaining three column sections 114 are not disturbed the remaining bit line pre-charge blocks 122 are left active. Further, the plate drivers 120, sense amplifiers 116 and column decoders 124 for these blocks are also kept off. This insures that even though the ferroelectric memory cells are connected to the associated bit lines via the activated word line, no voltage potential is applied to disturb the polarization state of the memory cell. By segmenting the plate lines in this fashion and further decoding the sense amplifiers so that only the selected column section 114 is activated the overall power consumption is greatly reduced. Since only 64 of a possible 256 columns are driven by the plate line segment the overall plate line delay is reduce by a factor of 16. Both R (the resistance of the plate line) and C (the capacitance of the ferroelectric memory cells and plate line wire) are reduced by one-fourth. This reduces the overall RC delay to ¼×¼ or ¹⁄₁₆, greatly reducing chip power and improving access time.

Each column decoder block 124 interfaces to a common set of sixteen wires (eight true/complement pairs) of local I/O lines 126. These local I/O lines 126 transfer the signal from the bit lines through the column decoder to eight main amplifiers 128. These main amplifiers 128 then drive onto eight global data lines 130 that interface to all four major blocks 110 of FIG. 31.

The present invention therefore utilizes a segmented plate line scheme. This segmented plate line approach allows for a reduction in power consumption, a reduction in area consumption, a reduction in memory access time, and a lessening of the number of read/restore cycles seen by the ferroelectric storage capacitors during normal circuit operation. Although the present invention utilizes a plate line segment length that is one quarter of that of the word line length, any subdivision of the word line which produces a plate line segment smaller than that of the word line segment would achieve a similar benefit. A detailed analysis of the tradeoff between area efficiency versus plate driver performance can be done to predict the optimum plate segment subdivision with respect to the word line length. This segmented plate line approach allows for a reduction in power consumption as only the columns that are connected to the selected plate line segment are read and restored, thus only these columns require the enabling of their respective sense amplifiers. Since the driving of the bit line capacitance by the column sense amplifiers is typically the largest contributor to operating current for a ferroelectric memory, significant power reduction is possible. All bit lines connected to the selected word line but not to the selected plate line segment remain held at ground potential, and this, combined with an inactive plate segment, results in no disturb to the ferroelectric capacitors attached to these deselected plate line segments. Area is saved as the word line decoder block is only repeated once for every N plate line segments. Access time is reduced as the capacitive load seen by the plate driver is less due to the shorter plate line segment resulting in only a fraction of the capacitance as compared to a non-segmented approach. This is significant since the effective capacitance of the plate line segment can be quite high due to its connection to a plurality of ferroelectric capacitors with an inherently high dielectric constant, requiring much more current drive capability than an in-pitch plate driver cell can provide, unless the plate line is segmented as in the present invention. Without plate line segmentation the rise or fall time of the selected plate line would be significantly higher than that realized with segmentation, and the slew rate of the plate line edges are critical to overall circuit speed as they are included in the critical path of the memory's access and cycle time. The ferroelectric capacitors experience less fatigue in that only those cells attached to the selected plate line segment go through the destructive readout operation which, depending on the data state present in the cell of interest, can involve switching the polarization state of the capacitor undergoing interrogation which results in a decrease in the practical remnant life of the capacitor as a reliable non-volatile data storage element.

The schematic diagram for the common plate line driver circuit 62 is shown in FIG. 33. A complex logic gate was developed to be consistent with both the common plate line scheme as well as the fact that the present invention involves driving the selected word line (WLO or WLE) low prior to sensing in order to mitigate undesired data dependent noise effects. Selection of the common plate line is accomplished by utilizing the signals WLE or WLO from the selected word line decoder 58, plus the PLCLK input. Address decoding is used in generating the PLCLK signal consistent with the subdivided plate line segment scheme described above. The PLCLK input runs vertically through the plate driver block 62, perpendicular to the plate line and word line but parallel to the bit lines. This signal provides two functions, timing control for the common plate line as well as selection of the proper plate line segment. Logically the circuit is an OR function of the word line inputs, WLE and WLO, followed by an AND function between the OR output and the PLCLK input, finally followed by an inverter which provides the proper data state at the CPL output along with increased current drive. There is a latch comprised of the output inverter (M10, M11, and M12) and the inverter N1. This is needed to address the requirement that the plate line segment CPL be held at VCC even though the selected word line, WLE or WLO, is driven low just prior to sensing. This combination of signals can occur during "up-only" sensing. The latch is also required for a plate driver attached to a deselected word line pair, i.e. WLE and WLO are low, which is in a memory block with an active PLCLK signal, i.e. PLCLK is driven high. The logic gate's output is floating for this set of inputs, so the latch insures the output node CPL is actively held at ground.

The complex OR/AND logic gate includes P-channel transistors M1–M3 and M7, as well as N-channel transistors M4–M6. The gates of transistors M1 and M4, and transistors M2 and M6 receive the WLO and WLE signals, respectively. The PLCLK signal is received by the gates of transistors M3, M5, and M7. The output inverter/driver circuit includes inverter N1, P-channel transistor M12, and N-channel transistors M10 and M11. Separate N-channel transistors, M10 and M11 are shown for metal-mask programmable drive. As can be seen, the CPL node can only be driven high if either WLE or WLO is high and PLCLK is high. This overturns the latch and drives CPL high. Once this event occurs, PLCLK can now overturn the latch via M3 in order to drive CPL low, independent of the state of WLE or WLO. This allows for the "up-down" sensing method to function properly.

The schematic diagram for the reference word line decoder 60 is shown in FIG. 34. This circuit is similar to the word line decoder circuit 58 described above with respect to FIG. 29. One difference between the operation of the word line decoder 58 and the reference word line decoder 60 involves the addressing of the decoder. It is important to make sure that the reference decoder 60 selection connects the correct reference cell, based upon which word line is selected. Otherwise, operation is the same as the regular array word line decoder. The circuit schematic is also substantially the same as that for the word line decoder circuit 58.

The schematic diagram for two sense amplifiers 52 is shown in FIG. 35. Each individual sense amplifier utilizes two individual latch devices M6 and M5 or M14 and M13 for noise isolation as discussed above, and driven by the LCTN and LCTP signals, respectively. N-channel transistors M3 and M4 or M11 and M12, and P-channel transistors M1 and M2 or M9 and M10 form a cross-coupled latch circuit. N-channel transistors M7, M16 and P-channel transistors M8, M15 are connected between individual sense amplifiers as shown. Transistor M7 is coupled between the source/drain of transistor M3 and the source/drain of an equivalent transistor on an adjacent sense amplifier. Transistor M8 is coupled between the source/drain of transistor M2 and the source/drain of an equivalent transistor on an adjacent sense amplifier. Transistors M7, M8 and M16, M15 are referred to as "pinning devices." These devices do not appear on the block diagram of FIG. 25, and are always off. Note that the gates of transistors M7 and M16 are coupled to ground, and the gates of transistors M8 and M15 are coupled to the VCC power supply voltage. Transistors M7, M8 and M16, M15 are used to isolate adjacent diffusions from one another in the layout, and to allow for parasitic capacitance balance with misalignment so that the source/drain diffusion capacitance of transistors M3–M4, M1–M2, M11–M12, and M9–M10 are balanced. The placement and stacking of the cross-coupled P-channel and N-channel transistors M1–M4 and M9–M12 is therefore important and is explained in further detail below with respect to layout FIGS. 47–50, as well as FIG. 51. The physical layout of the devices allows the addition of the separate latch devices M5, M6 and M13, M14 and also eliminates an inherent resistive imbalance if transistors M1–M4 or M9–M12 were stacked vertically in one column pitch.

Figure 36:
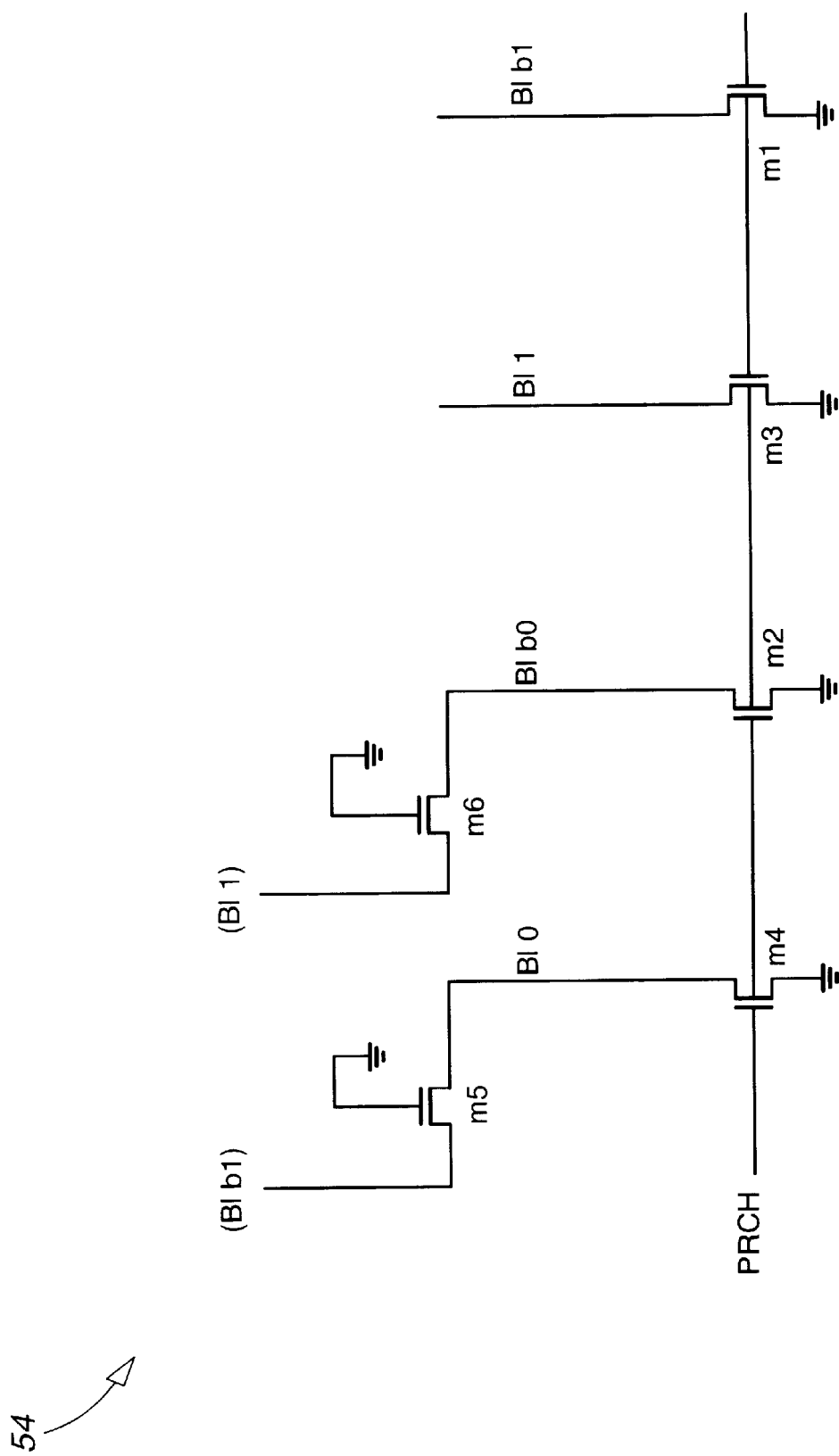
FIG. 36 is a schematic diagram of a bit line pre-charge circuit used in the pre-charge circuit blocks of FIGS. 25, 26 and 32.

The schematic diagram for the bit pre-charge circuit 54 is shown in FIG. 36. The common gate of N-channel transistors M1, M2, M3, and M4 receive the PRCH pre-charge signal for pre-charging the bit lines. Transistors M5 and M6 are off and are layout aids used to isolate adjacent bit line diffusions and to allow for capacitive balance with misalignment as described above.

The schematic diagram for column decoder 56 is shown in FIG. 37. Column decoder 56 uses a single N-channel transistor M1–M16 as a transmission gate, not a full N and P transmission gate. Reading and writing, therefore, is limited to a voltage swing of VCC–VTN (VTN is an N-channel transistor threshold voltage). A single N-channel transmission gate, however, is more suited to circuit designs with tight column pitches. The gates of N-channel transistors M17 through M24 are tied to the EQ control wire. These devices are one half of an isolation device placed between adjacent columns. Again, the isolation devices are used for a layout aid to solve a capacitance imbalance caused by misalignment of masks. Transistors M17–M24 are equilibration transistors used to maintain equal voltages between adjacent bit lines at the start of the read cycle. The physical stacking and layout placement of the individual column access devices is important and is explained further below with respect to FIG. 52. The layout allows for better bit-to-bit line and I/O-to-I/O capacitance and resistive balance and matching where the column layout pitch is tight. Transistors M33–M40 are the other half of the isolation device, and have their gates coupled to ground. They are used to electrically isolate adjacent bit lines. Transistors M25–M32 are used to further isolate I/O lines of IO0–IO7 and IOb0–-Iob7.

Figure 39:
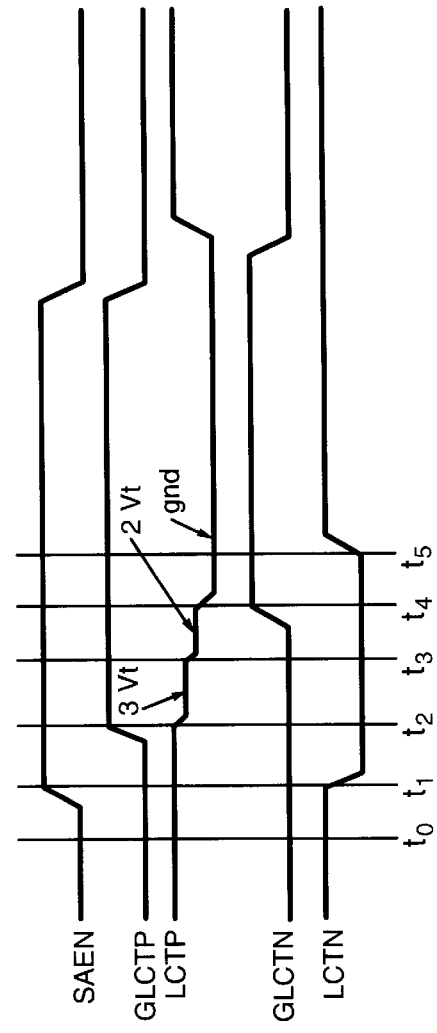
FIG. 39 is a timing diagram associated with the latch driver circuit of FIG. 38.

Latch Driver Circuit to Generate Voltage Staircase for Sense Amplifier Control Signals The detailed schematic for the latch driver 53 is shown in FIG. 38, and the associated timing diagram is shown in FIG. 39.

To optimize the sensitivity of a sense amplifier latch in a ferroelectric memory it is necessary to carefully control the rate of latching of the cross-coupled devices that are latched first. For a ferroelectric memory with bit lines pre-charged to ground, the P-channel devices are latched first. The slower the application of voltage to the common sources of the cross-coupled P-channel devices, the greater the sensitivity of the latch. There is a trade off between access time/performance and latch speed that applies to a particular design. Memories have taken advantage of the common latch node used in sense amplifier layouts to tailor the latch pulse waveform. Typically the latch node represents a large capacitive load to a driver circuit. This then allowed the latch node to be driven initially by a small device and to move very slowly providing maximum signal sensitivity. This driver was then paralleled with a larger driver to complete the latching process and provide a low impedance path between the high bit line and the power supply. As discussed in the ferroelectric memory design it is necessary to provide a separate latch device for each sense amplifier. It is not practical to include two separate latch devices for each latch node in the sense amplifier layout for two reasons. One reason is an undesirable increase in layout area. The second reason is that it is very difficult to provide a device small enough to significantly improve sensitivity with the first latch pulse. A compromise should be reached in selecting the size of a single latch transistor.

Utilizing the latch driver 53 of the present invention shown in FIG. 38, the need for two separate P-channel latch devices in each sense amplifier can be eliminated. Driver 53 supplies a stair-stepped voltage to the latch control wire LCTP. This stair-stepped voltage initially supplies a very small turn on voltage to the latch device control wire LCTP. This small turn-on voltage has the same effect as that of a small transistor. As time proceeds the voltage continues to stair-step and increase turn-on voltage rapidly. This provides a varying gate voltage to the latch devices and hence a varying impedance that starts high and becomes low with each stair-step. This allows the sense amplifier to provide maximum signal sensitivity without undo delay or circuit complexity. Each stage in the driver circuitry turns on a diode stack that stair-cases the voltage to the latch transistors one device threshold at a time. This avoids the complicated circuitry of a continuously analog output amplifier while still providing adequately controlled steps for the gate voltage. Latch 53 can be utilized for either a P-latch or N-latch by simply reversing the polarity of the pulses and the diode devices to generate either a staircase from VCC to ground or from ground to VCC.

Referring now to the schematic diagram of FIG. 38, latch driver 53 is driven by the sense amplifier enable SAEN and GLCTP signals, and provides the LCTN and LCTP sense amplifier drive signals. A first stage includes inverters N1 and N2, NOR gate N3, and transistors M1–M3 for generating the LCTN signal. As shown in the timing diagram of FIG. 39, the LCTN signal is a positive-going pulse that is generated by the SAEN signal and delayed from the GLCTN signal. The LCTN signal is generated when the internally-generated GLCTN signal goes high at time $t_4$. The remaining circuitry is used to generate the LCTP staircase signal and the GLCTN signal. This includes NAND gate N4, inverters N5–N7, NOR gate N8, inverters N9–N11, NOR gate N12, and transistors M4–M10. NAND gate N4 receives the SAEN and GLCTP signals and drives the gate of P-channel transistor M9 through inverter N5. A first diode stack comprised of diode-connected transistors M4–M6 initially creates a voltage equal to three threshold-voltage drops above ground potential at node LCTP at times $t_2$–$t_3$. After a programmable delay through inverters N9 and N10, which can be adjusted as desired, a second diode stack comprised of diode-connected transistors M7 and M8 creates a new voltage equal to two threshold-voltage drops above ground potential at node LCTP at times $t_3$–$t_4$. After a second delay through NOR gate N12 the LCTP node is driven to ground. Referring again to the timing diagram of FIG. 38, the staircase voltage waveform LCTP can be seen, transitioning from the full VCC voltage, to 3 VTN, 2 VTN, and finally ground potential. At time $t_4$ the GLCTN signal is generated, which in turn triggers the LCTN signal. At time $t_5$ the LCTN signal is driven high.

Memory Cell Resistive Shunt Layout

Figure 40:
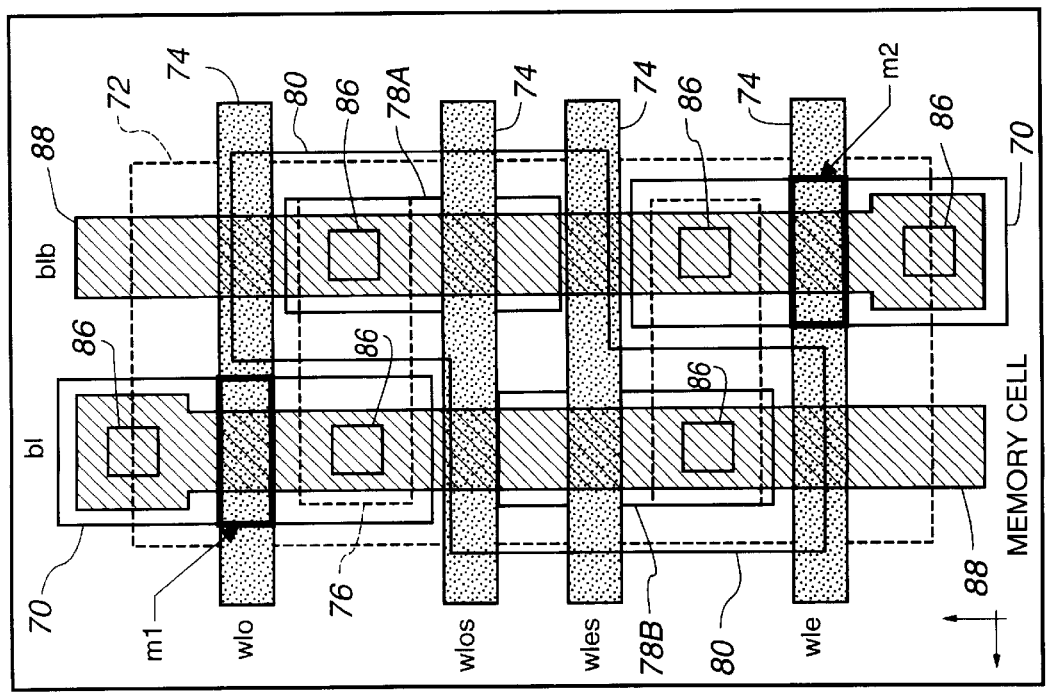
FIG. 40 is a plan view of a chip layout of the 1T/1C memory cells of FIG. 27.

The layout for the two 1T/1C memory cells is shown in FIG. 40 corresponding to the schematic diagram of FIG. 27. The following structures can be seen in the layout of FIG. 40: two solid rectangles 70 represent the N+doped active areas that form the underlying structure of transistors M1 and M2; the memory cell boundary 72 is defined by a dashed rectangle and is repeated in the row and column directions to form the memory array; and the WLO, WLOS, WLES, and WLE word lines are shown as polysilicon/silicide lines 74 extending across the memory cell in the row direction. Note that the intersection of the WLO word line 74 and one active area 70 forms the M1 transistor (inside a bolded rectangle and labeled "M1") and the intersection of the WLE word line 74 and the other active area 70 forms the M2 transistor (inside a bolded rectangle and labeled "M2"). The layout of FIG. 40 also includes: local interconnects 76, typically formed of titanium nitride (TiN) and used for connecting the cell capacitor to the access transistor; and platinum top electrodes 78A and 78B, defining the capacitor size for the CF1 and CF2 ferroelectric capacitors in the cell. The S-shaped solid feature 80 defines two layers: the platinum bottom electrode, shared with both capacitors CF1 and CF2; and the lead zirconate titanate ("PZT") ferroelectric layer, which is also shared between both capacitors. The BL bit line and BLb complementary bit line are identified as metal lines 88 extending in the column direction across the cell. Metal lines are typically aluminum or an aluminum/copper/silicon alloy. Finally, six square contacts 86 are shown allowing contact between local interconnect and source/drains, local interconnect and top electrode, and aluminum and source/drains.

In the layout of memory cells the memory transistor's gate is used as the interconnect wire for providing the electrical connection for the word lines. The gate material used is typically polysilicon. This material is often highly resistive and can create significant delays when accessing a large array of memory cells, (i.e., many columns along a single word). Often, the polysilicon is combined with some type of refractory material to reduce the overall delay and in addition may be shunted by a higher level of interconnect. Because of the layout according to the present invention of the ferroelectric memory cell shown in FIG. 40 additional wires labeled WLES and WLOS are added to the cell without an additional layout area penalty.

Figure 41:
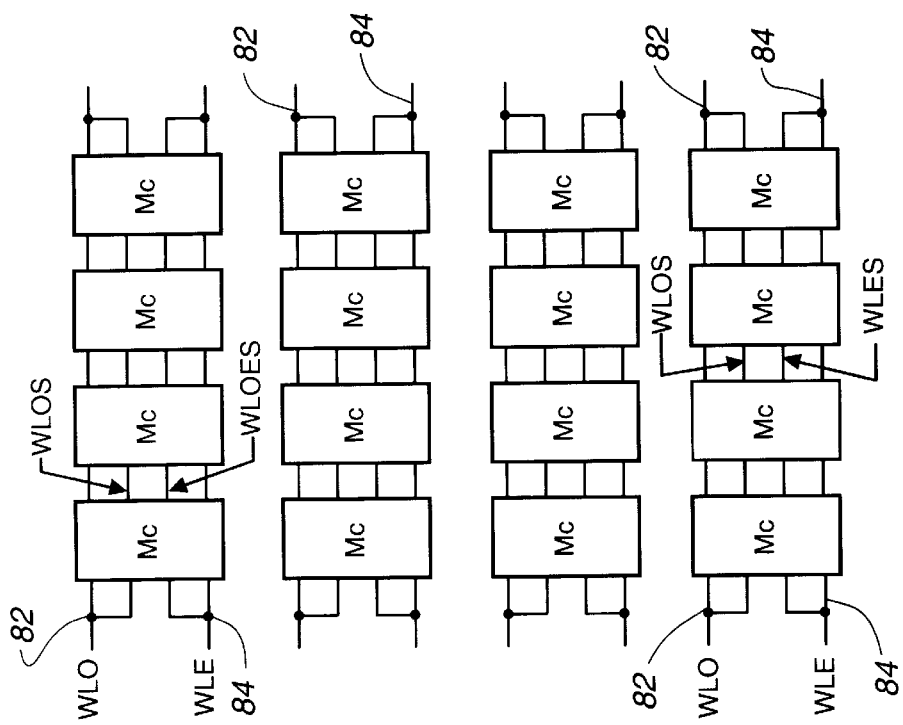
FIG. 41 is a block diagram of a representative 4×4 array of 1T/1C memory cells showing the word lines and the connection thereof to the shunt word lines.

Turning now to the block diagram of FIG. 41, a representative 8×8 array of memory cells is shown. The WLO, WLOS, WLES, and WLE word lines are shown extending to each memory cell Mc in the array. The WLO and WLOS word line wires are tied together at node 82, and the WLE and WLES word line wires are tied together at node 84. Note that the shunting nodes 82 and 84 for joining the two word lines occur at breaks in the array. Note also that the WLO, WLOS, WLES, and WLE word lines are all on the same level of polysilicon, but physically spaced apart in the cell. These four word lines are not formed of different metal or polysilicon layers in the present invention. The layout shown in FIG. 40 and block diagram of FIG. 41 having shunt word lines joined at nodes 82 and 84 reduces the overall RC delay of the word line and improves chip performance.

Figure 42:
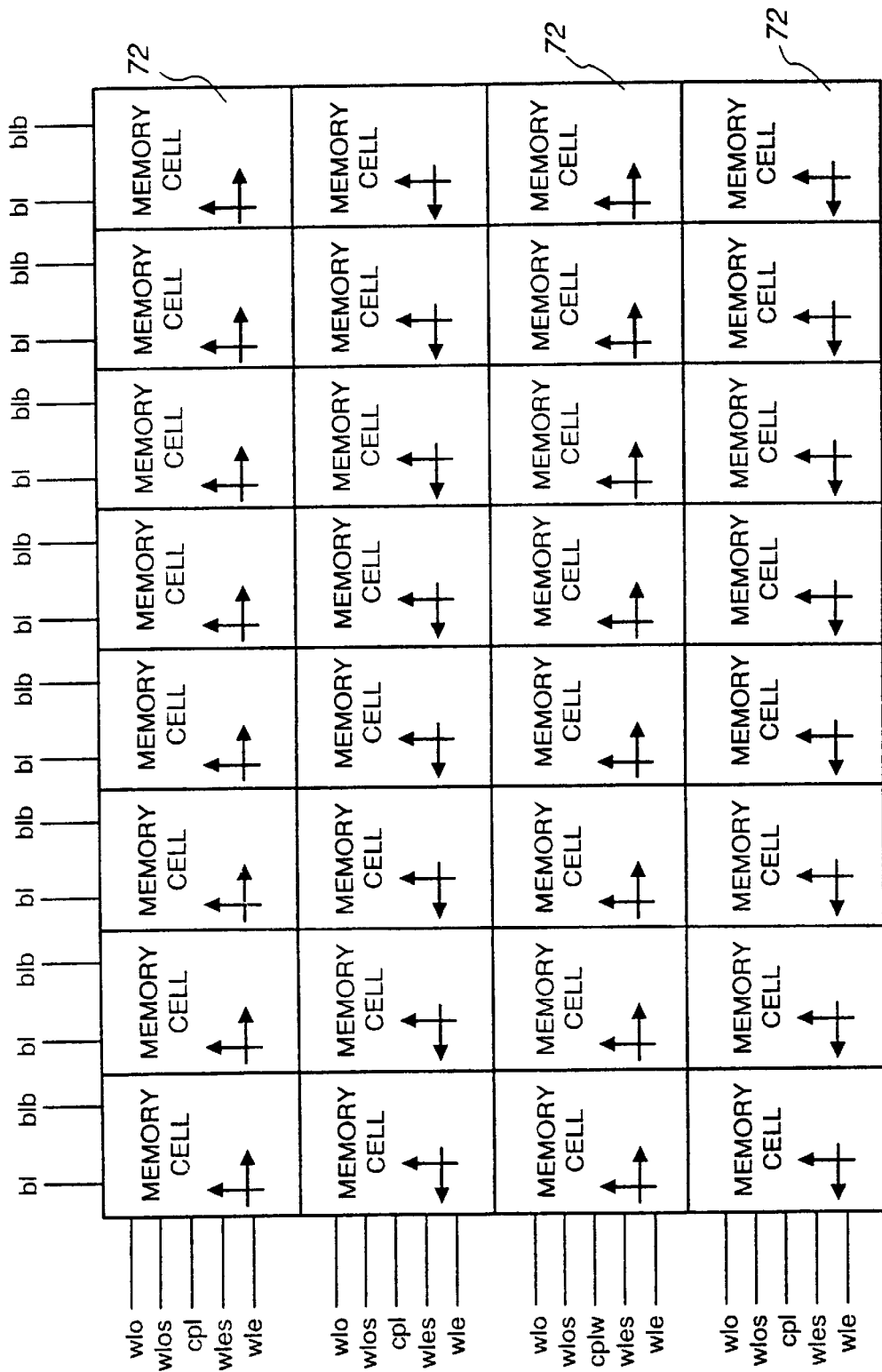
FIG. 42 is a block diagram of a representative 8×8 array of 1T/1C memory cells using the layout of FIG. 40, and in particular showing the orientation of each cell in the array.

A further layout diagram is shown in FIG. 42 using a representative 8×8 array of memory cells. Each memory cell block 72 is equivalent to the two memory cells shown in FIG. 40. Note that in FIG. 42, the bottommost row of memory cell blocks is arranged in the same orientation as the memory cells shown in FIG. 40, and the cells are reproduced along the row direction. In the row of memory cells directly above the bottommost row, the orientation of the cells is reversed along the row direction. In the next row of memory cells, the original orientation is restored. The pattern is then repeated throughout the array.

Reference cell layout

Figure 43:
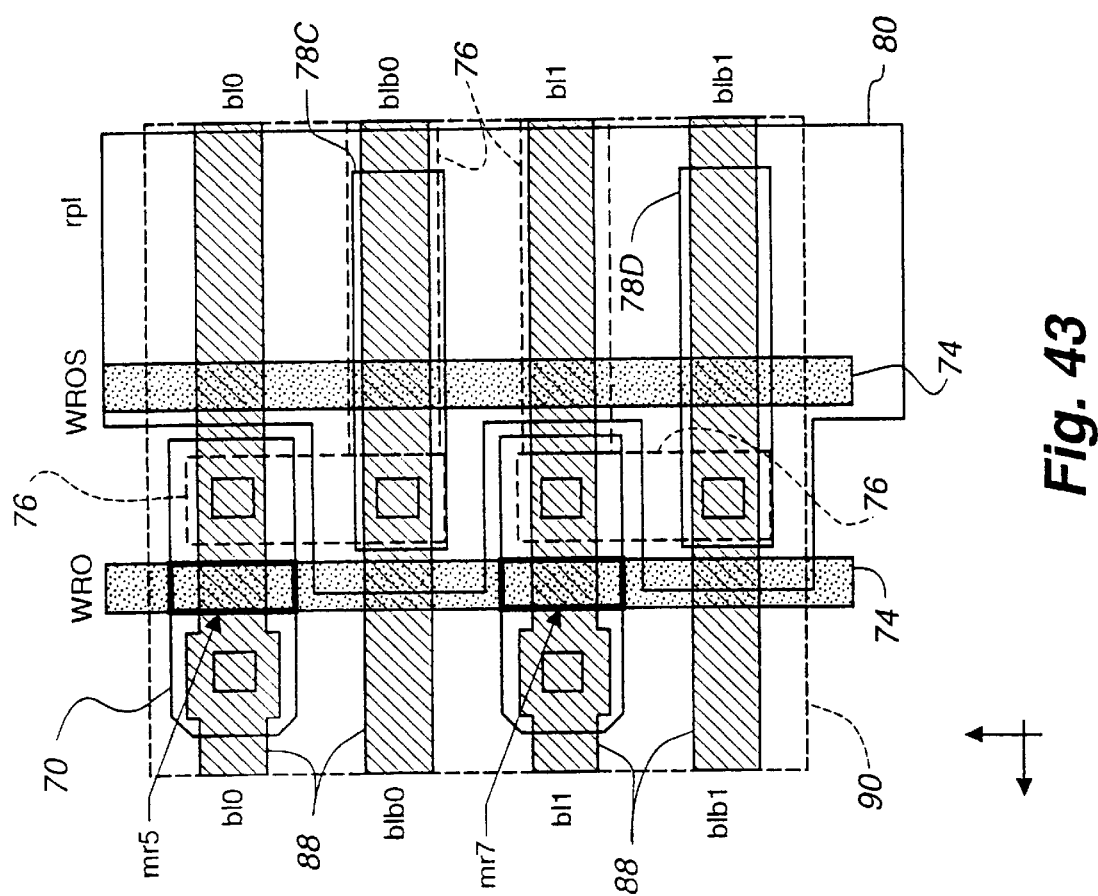
FIG. 43 is a plan view of a chip layout of a first portion of the 1T/1C reference cells of FIG. 28.
Figure 44:
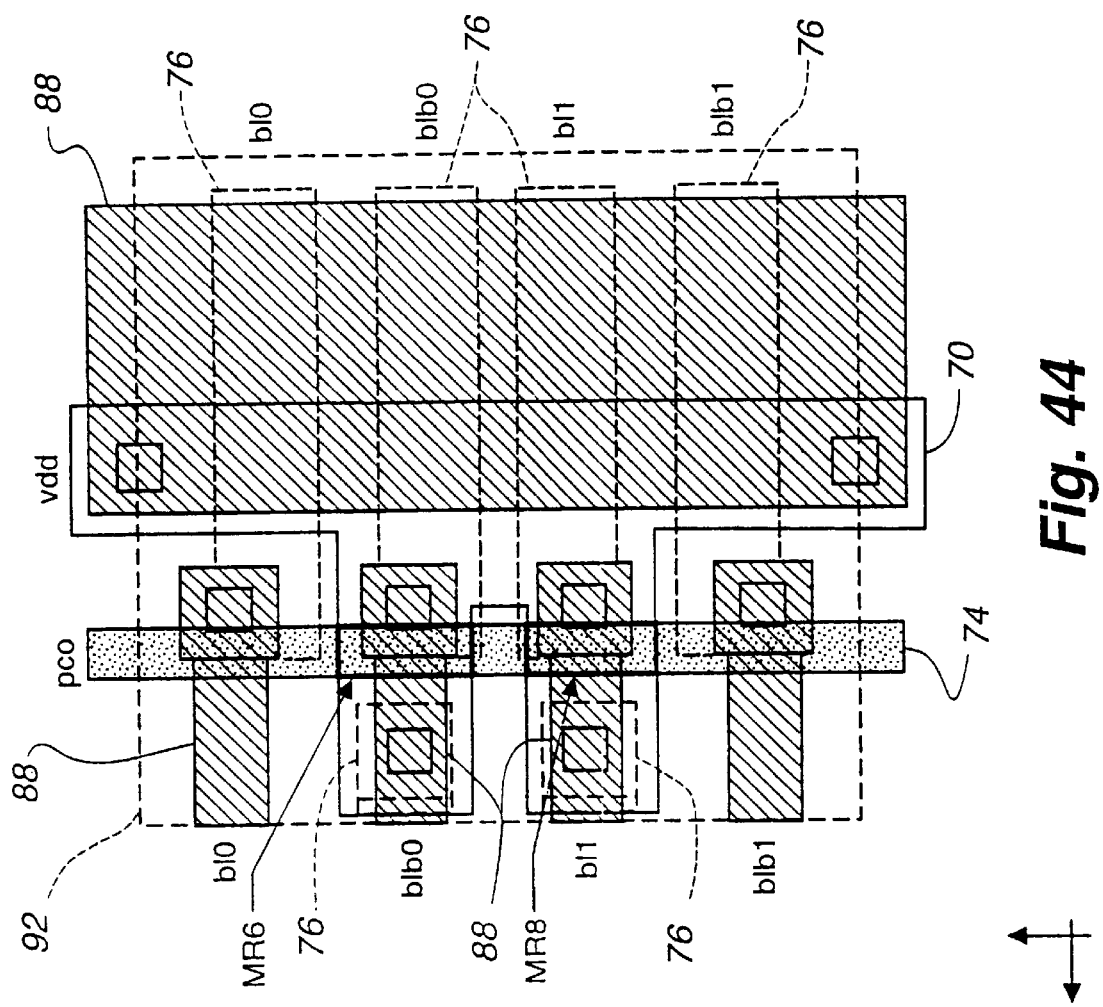
FIG. 44 is a plan view of a chip layout of a second portion of the 1T/1C reference cells of FIG. 28.

The layout for the two reference cells is shown in two portions (REF1 and REF2) in FIGS. 43 and 44, corresponding to one half of the schematic diagram of FIG. 28. The REF1 portion shown in FIG. 43 corresponds to transistors MR5 and MR7, and ferroelectric capacitors CR3 and CR4 in FIG. 28. The REF2 portion shown in FIG. 44 corresponds to pre-charge transistors MR6 and MR8 in FIG. 28.

The following structures can be seen in the layout of the REF1 portion of the reference cell in FIG. 43 (note that some of the same identification numerals used previously are used here to identify like layers): two solid areas 70 represent the N+doped active areas that form the underlying structure of transistors MR5 and MR7; the REF1 portion of the reference cell boundary 90 is defined by a dashed rectangle; and the WRO and WROS reference word lines are shown as polysilicon/silicide lines 74 extending across the reference cell portion in the row direction. Note that the intersection of the WRO word line 74 and one active area 70 forms the MR5 transistor (inside a bolded rectangle and labeled "MR5") and the intersection of the WRO word line 74 and the other active area 70 forms the MR7 transistor (inside a bolded rectangle and labeled "MR7"). The layout of FIG. 43 also includes: local interconnects 76, typically formed of titanium nitride (TiN) and used for connecting the cell capacitor to the access transistor; and platinum top electrodes 78C and 78D, defining the capacitor size for the CR3 and CR4 ferroelectric capacitors in the reference cells. The solid feature 80 defines two layers: the platinum bottom electrode, shared with both capacitors CR3 and CR4; and the lead zirconate titanate ("PZT") ferroelectric layer, which is also shared between both capacitors. The BL0, BLb0, BL1, and BLb1 bit lines are identified as metal lines 88 extending in the column direction across the cell. Metal lines are typically aluminum or an aluminum/copper/silicon alloy. Finally, six square contacts 86 are shown allowing contact between local interconnect and source/drains, local interconnect and top electrode, and aluminum and source/drains.

The following structures can be seen in the layout of the REF2 portion of the reference cell in FIG. 44: a single solid area 70 represents the P+doped active areas that form the underlying structure of pre-charge transistors MR6 and MR8; the REF2 portion of the reference cell boundary 92 is defined by a dashed rectangle; and the PCO pre-charge line is shown as a polysilicon/silicide line 74 extending across the reference cell portion in the row direction. Note that the intersection of the PCO pre-charge line 74 and two legs of the active area 70 forms both the MR6 and MR8 transistors (inside bolded rectangles and labeled "MR6" and "MR8"). The layout of FIG. 44 also includes local interconnects 76 and metal lines 88 used for the extension of the BL0, BLb0, BL1, and BLb1 bit lines. Finally, eight square contacts 86 are shown allowing contact between local interconnect and P+active area, local interconnect and aluminum, and aluminum and P+active area.

In the layout of the 1T/1C memory array of the present invention, the bit line pitch is narrow. The placement and folding of the reference cells described and shown in further detail below allows the incorporation of an additional device to create a pre-charged charge-shared reference. Placement and twisting of bit line wires and interconnect allows the layout to fit in pitch and to provide low resistance paths for pre-charge and cell access.

Figure 45:
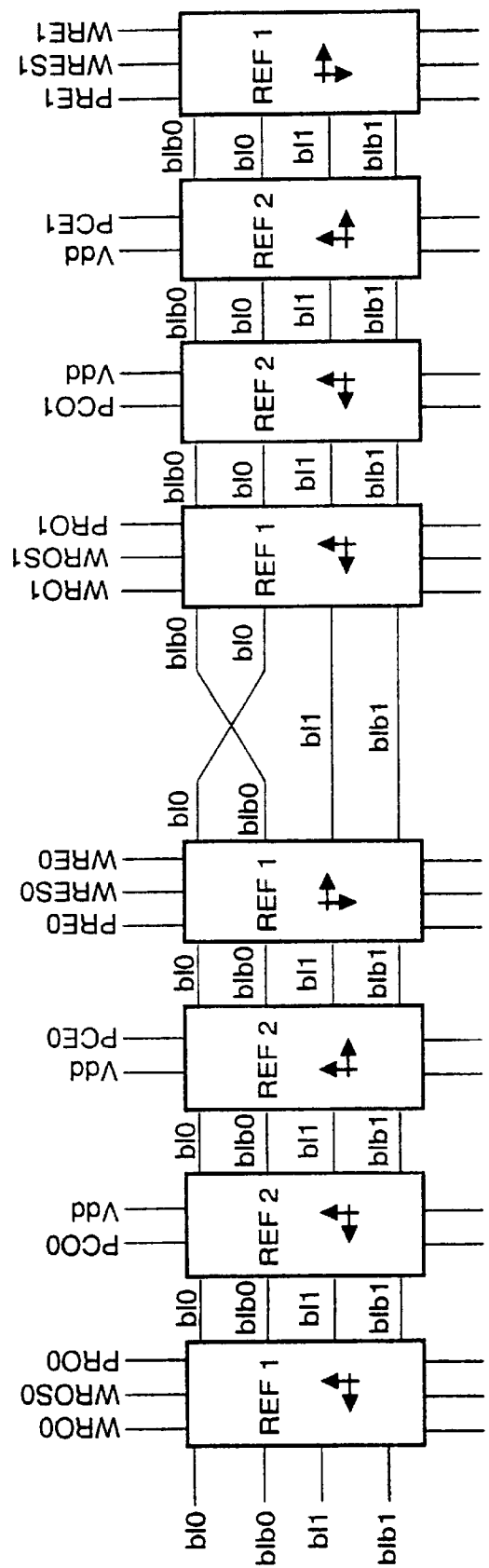
FIG. 45 is a block diagram of eight reference cells required for two columns in the memory array using the chip layouts of FIGS. 43 and 44, and in particular showing the orientation and interconnection of each layout portion.

Referring now to FIG. 45, the REF1 and REF2 portions are shown as they are placed on the memory chip. Eight individual reference cells are needed for two columns (bit/bit-bar pairs). From left to right in FIG. 45, a first REF1 portion is followed by a first REF2 portion. A second REF2 portion is followed by a second REF1 portion. Note that the orientation of the first REF1 and REF2 portions is the same as in the layout diagrams of FIGS. 43 and 44. The second REF2 portion is reversed in the column direction, and the second REF1 portion is reversed both in the row and column directions. The pattern, continuing from left to right in FIG. 45, is repeated again to complete the eight total REF1 and REF2 portions, forming a total of eight individual reference cells. There is a twisting of the BL0 and BLb0 bit lines, however, between the first group of four reference cell portions and the second group of four reference cell portions to ensure proper decoding of the bit-twisted memory cell array as is known in the art.

Figure 46:
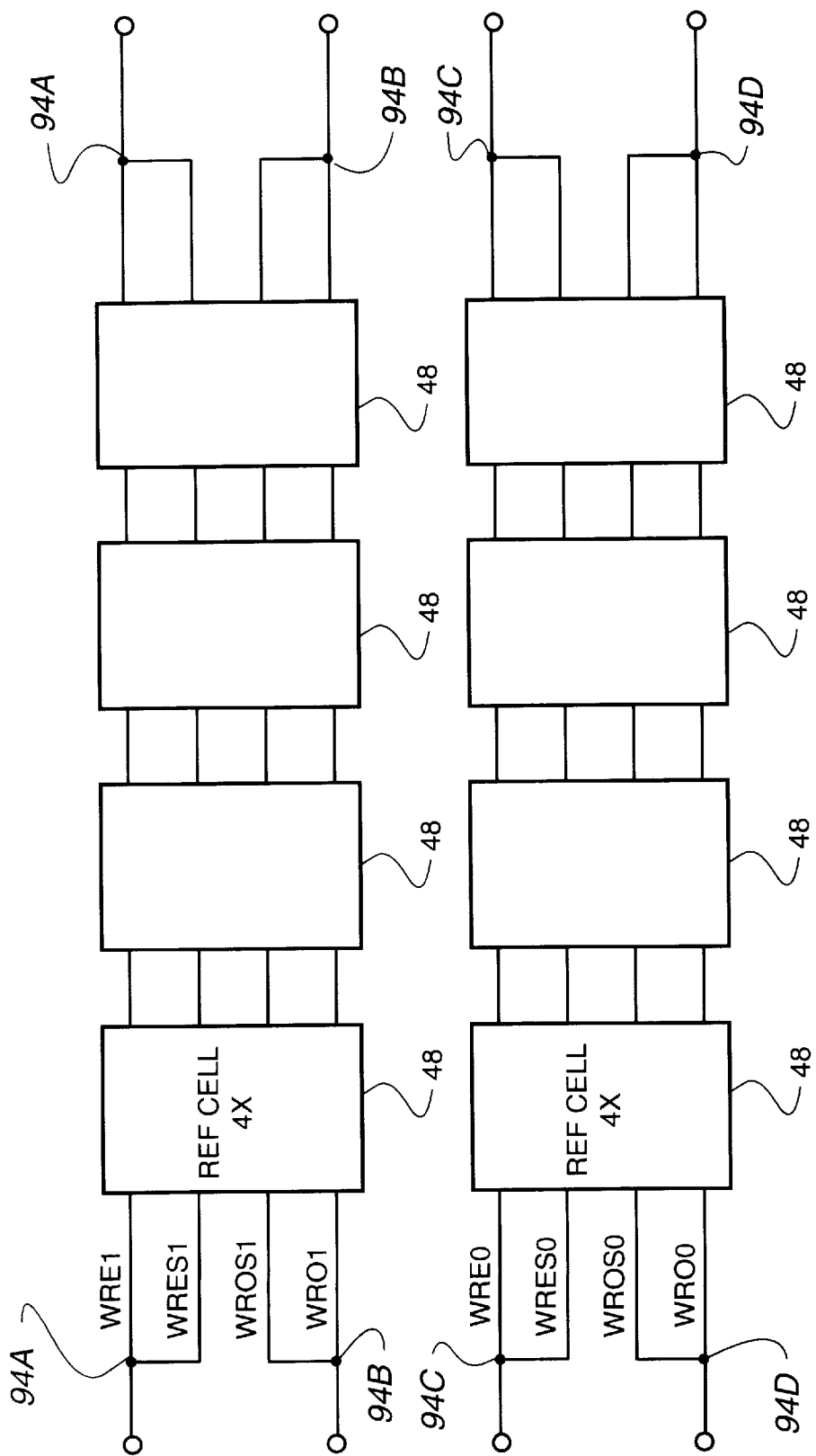
FIG. 46 is a block diagram of a representative 4×4 array of 1T/1C reference cells of FIG. 40 showing the reference word lines and the connection thereof to the shunt word lines.
Figure 47:
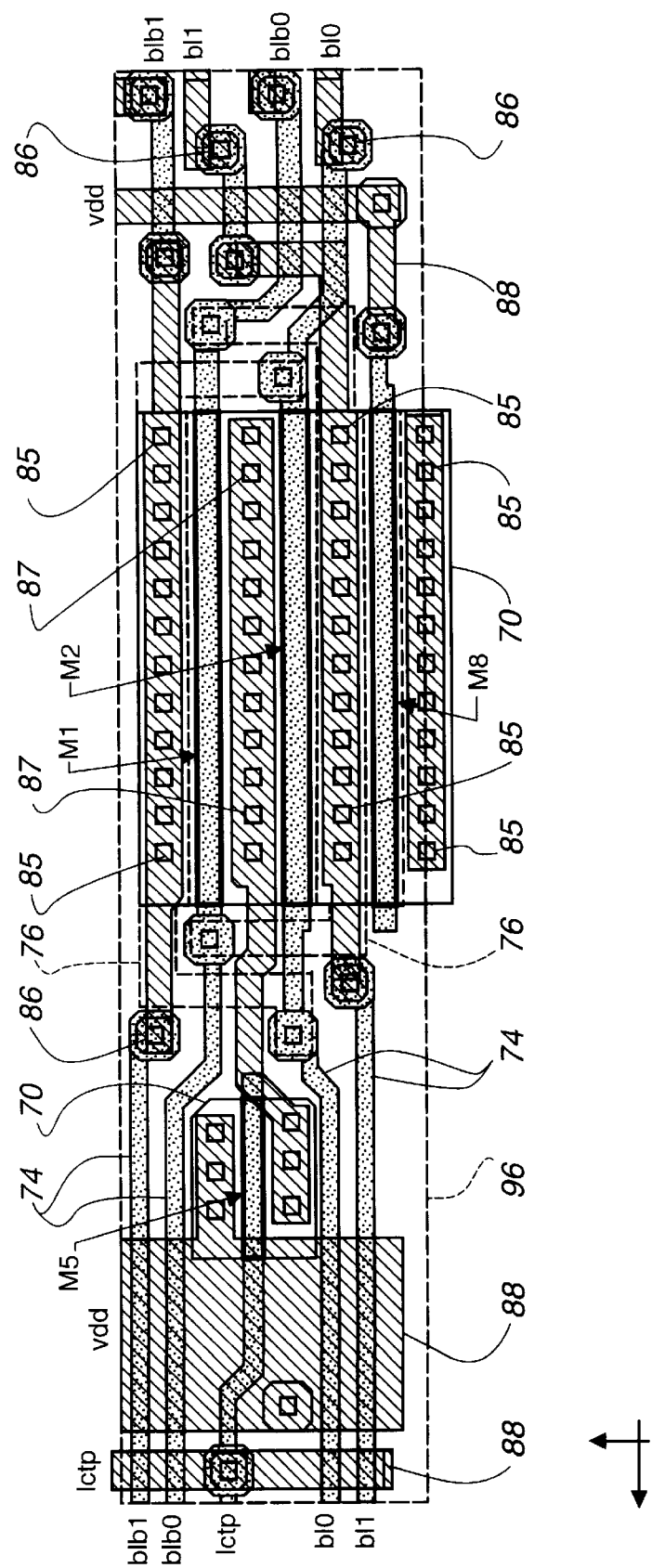
FIGS. 47–50 are plan views of a chip layout of four portions of the sense amplifiers shown in FIG. 35.
Figure 48:
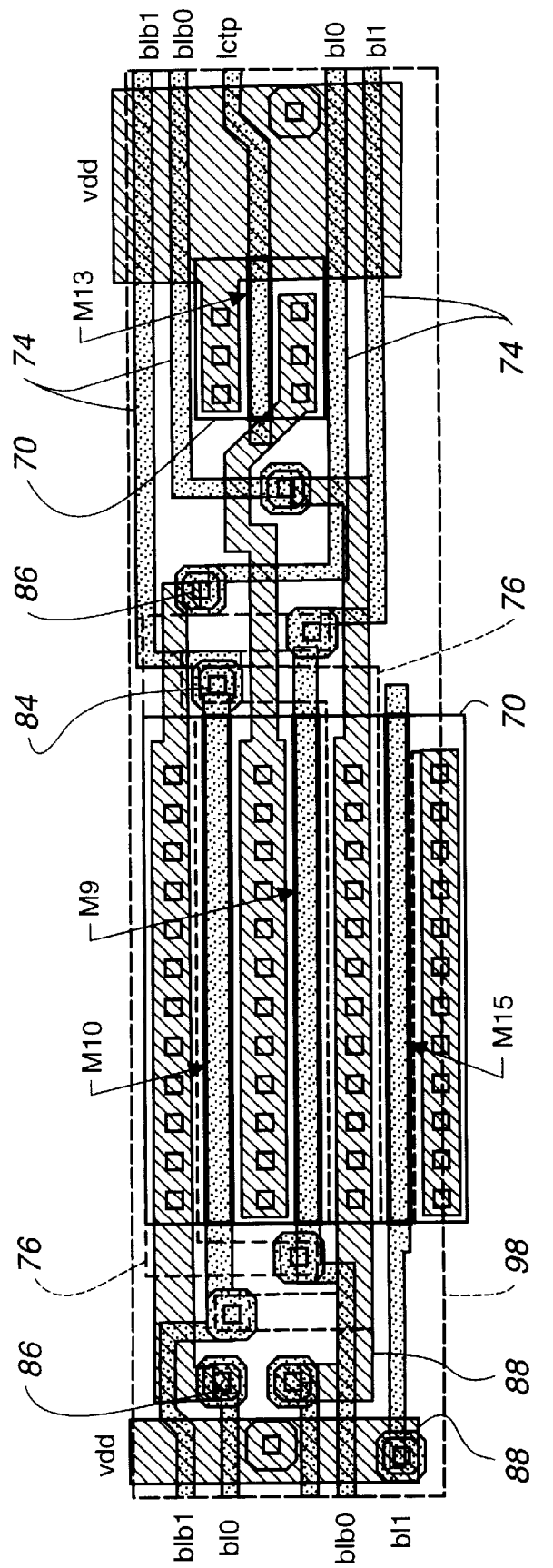
Figure 49:
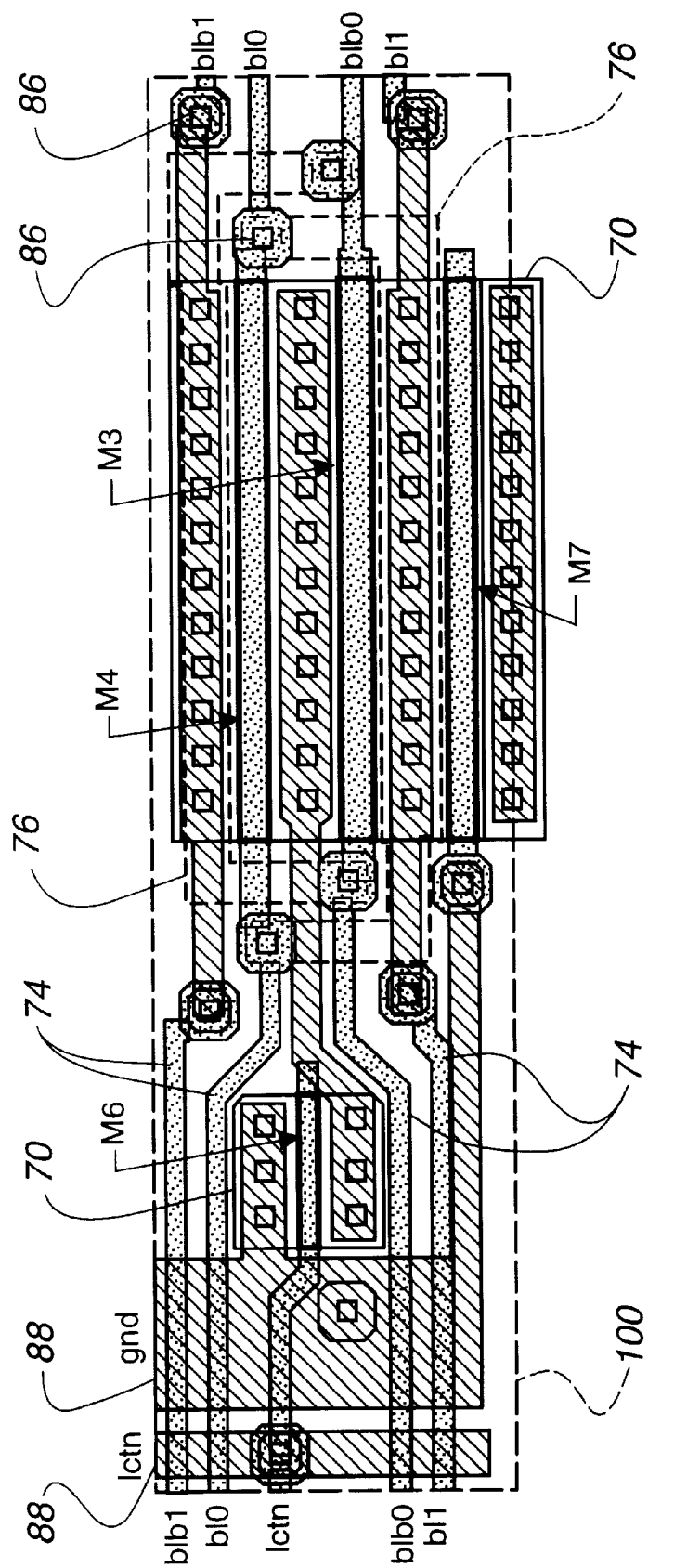
Figure 50:
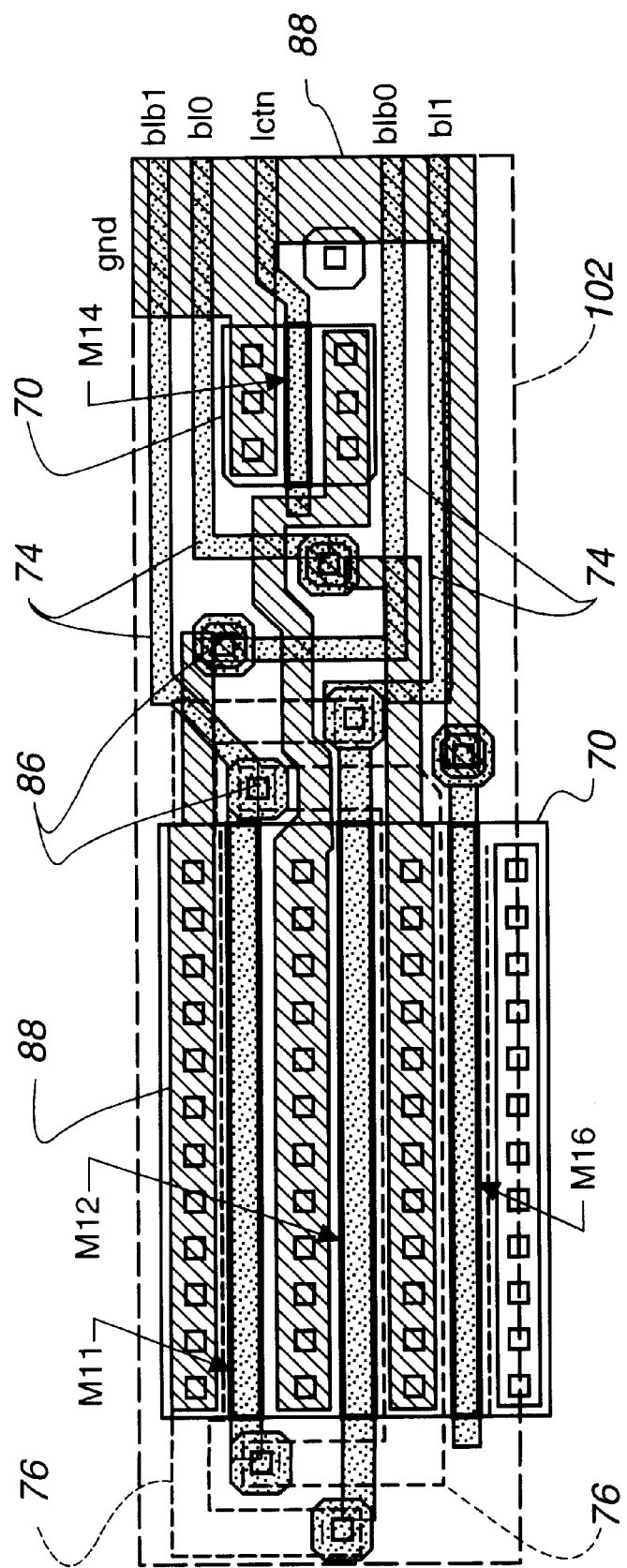

Turning now to the block diagram of FIG. 46, a representative array of reference cells is shown. The WRE, WRES, WRO, and WROS reference word lines are shown extending to each reference cell block 48 in the array. The WRE1 and WRES1 reference word line wires are tied together at node 94A. Note that the shunting nodes for joining two reference word lines occur at breaks in the array. Note also that all of the reference word lines are on the same level of polysilicon, but physically spaced apart in the cell. The word lines are not formed of different metal or polysilicon layers in the present invention. The layout shown in FIG. 46 having shunt word lines joined at nodes 94A–94D reduces the overall RC delay of the reference word lines and improves chip performance.

Sense Amplifier Layout

In a ferroelectric memory design the cell architecture is such that the bit line pitch is narrow and the word line pitch is wide. This makes it very difficult to interconnect the cross-coupled devices in the sense amplifier in pitch. Previous layouts have accomplished this by stacking the devices in a vertical direction. This type of layout adds a resistive path in one bit line different from its adjacent line. This resistance creates an imbalance that reduces the inherent sensitivity of the amplifier. A physical placement of the devices according to the present invention allows not only the addition of the separate "P" and "N" latch devices but also eliminates the resistive imbalance of the prior art. This layout is described in further detail below and shown in FIGS. 47–50.

The layout for the two sense amplifiers is shown in FIGS. 47 through FIG. 50 corresponding to the schematic diagram of FIG. 35. The layout for the two sense amplifiers are divided into four layout sections SA1, SA2, SA3, and SA4, which are repeated throughout the array. Each layout section SA1–SA4 fits in the layout pitch determined by two columns of memory cells.

The following structures can be seen in the layout sections of FIGS. 47–50: two solid areas 70 represent the N+ or P+ doped active areas that form the underlying structure of the sense amplifier transistors in that section; the memory cell boundaries 96 for SA1, 98 for SA2, 100 for SA3, and 102 for SA4 are defined by a dashed rectangle; and the BLb1, BLb0, BL1, BL0 bit lines, as well as the LCTP and LCTN latch lines are shown as polysilicon/silicide lines 74 extending across the sense amplifier section in the column direction. The transistors are labeled in layout sections SA1–SA4 and each section includes four transistors as follows: SA1 shown in FIG. 47 includes P-channel transistors M1, M2, M5, and M8; SA2 shown in FIG. 48 includes P-channel transistors M9, M10, M13, and M15; SA3 shown in FIG. 49 includes N-channel transistors M3, M4, M6, and M7; and SA4 shown in FIG. 50 includes N-channel transistors M11, M12, M14, and M16. The layout of FIGS. 47–50 also includes: local interconnects 76, identified by a dashed boundary; and metal areas and lines 88 for connecting to ground and the VCC power supply, as well as forming portions of the bit lines. Metal lines and areas 88 are typically aluminum or an aluminum/copper/silicon alloy. Finally, several contacts 86 are shown allowing contact between aluminum and polysilicon, aluminum and local interconnect, polysilicon and local interconnect, aluminum and source/drains, and local interconnect and source/drains. Note that the source/drains of transistors M1, M2, and M8 in sense amplifier section SA1 contains twelve contacts in order to reduce resistance between bit lines and latch nodes, and the respective source/drains. Contacts 85 are between local interconnect and source/drains, and contacts 87 are between aluminum and source/drains. Similar structures and contacts are shown in sense amplifier sections SA2–SA4.

A solution to resolving the noise issues discussed above associated with a common P and N latch node in prior art ferroelectric memories is to provide a layout that allows each sense amplifier to have its own separate latch devices. The architecture of a ferroelectric memory cell is unique and different from that of DRAM type cells. A DRAM cell generally has the word line pitch narrow and the bit line pitch wider allowing for an easier layout of sense amplifiers. This extra pitch in the column direction makes it easier to provide a balanced layout for the sense amplifier. This is a very key issue in sense amplifier design. Any mismatch as a result of resistive or capacitive imbalance, capacitive coupling or device mismatch can degrade the signal margin of the sense amplifier. In a ferroelectric memory the cell architecture is the opposite of that for a DRAM memory. The column pitch is narrow and the word line pitch is wide. This makes it very difficult to have a balanced layout for the sense amplifier. In general, the individual P and N cross-coupled devices are stacked in a vertical or column direction. Each sense amplifier then has a different resistive path for the bit versus the bit bar or complement line. Further, there are capacitive imbalances created because of this stacking. In addition, it is very difficult if not impossible to implement separate latch devices for each sense amplifier if constrained to a single column.

A layout approach according to the present invention is shown in FIGS. 47–50 wherein each column sense amplifier cross-coupled devices are drawn across two column pitches. This allows the individual P and N cross-coupled devices to be drawn with equal resistive paths to each bit line, thus eliminating resistive imbalance. Further, a twisting of the bit line wires as shown in FIGS. 47–50 eliminates any capacitive mismatch. Finally, because two pitches are used for each sense amplifier, separate P and N node latch devices can be incorporated, thus eliminating the noise problem discussed above with respect to ferroelectric memories.

Figure 51:
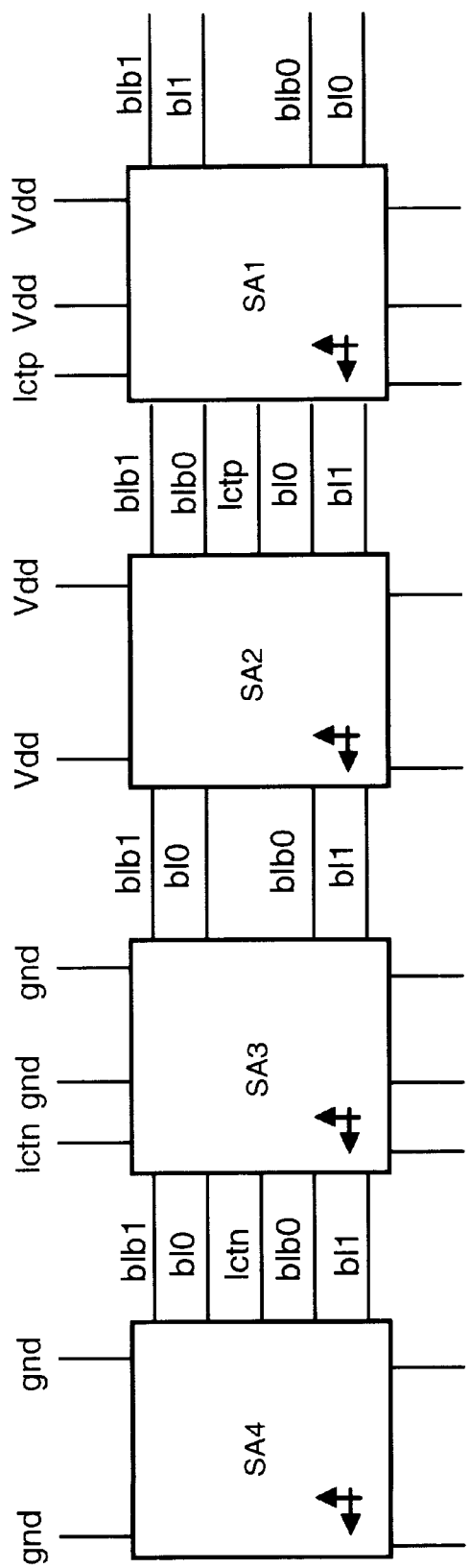
FIG. 51 is a block diagram of two sense amplifiers required for use in conjunction with two columns of the memory array using the chip layouts of FIGS. 47–50, and in particular showing the orientation and interconnection of each layout portion.

Turning now to FIG. 51, the stacking of the four layout sections SA1–SA4 in the column or vertical direction on the chip is shown. Note that two columns worth of BIT/BITb bit lines extends through all four layout sections. The LCTN line extends between sections SA3 and SA4, and the LCTP line extends between sections SA1 and SA2. The bit line pairs extending from layout section SA1 are coupled to two columns of the memory array. Thus, two columns of the array are sensed by two sense amplifiers across the pitch of two columns, creating a layout having the functionality of one sense amplifier per one column layout pitch.

Column Decoder Layout

Figure 52:
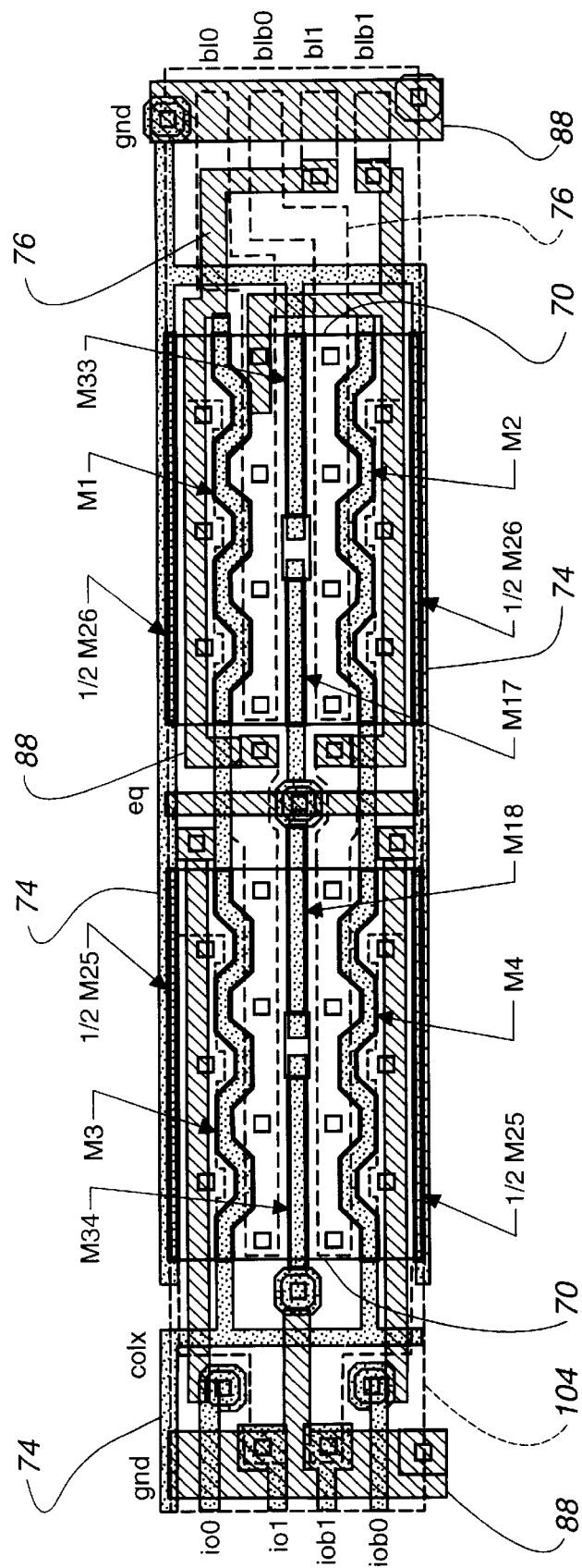
FIG. 52 is a plan view of a chip layout using a portion of a column decoder shown in FIG. 37.

The layout for the column decoder is shown in FIG. 52 corresponding to the schematic diagram of FIG. 37. The layout shown in FIG. 52 is actually a section of the column decoder shown in FIG. 37, representing only two columns of the eight shown in the schematic. The section shown in FIG. 52 is repeated as desired in the row direction to achieve the total number of columns desired.

The following structures can be seen in the layout section of FIGS. 52: two solid rectangles 70 represent the N+ doped active areas that forms the underlying structure for transistors M1–M4, M17–M18, M25–M26 (one half of each device is shown at both edges of the layout section), and M33–M34; the column decoder boundary 104 is defined by a dashed rectangle; and the COLX and EQ lines that connect to the gates of the transistors are shown as polysilicon/silicide lines 74 extending across the memory cell in the column direction. The layout of FIG. 52 also includes: local interconnects 76, identified by a dashed boundary, which form the bit lines and I/O lines; and metal lines and areas 88. Finally, several contacts 86 are shown allowing contact between aluminum and polysilicon, polysilicon and local interconnect, aluminum and local interconnect, local interconnect and source/drains, and aluminum and active area.

The column decoder layout 52 fits in the same narrow pitch determined by the bit lines of a 1T/1C ferroelectric memory cell. It is also important to avoid bit-to-bit, I/O-to-I/O, and I/O-to-bit noise coupling between adjacent bit line columns. Further, the resistive path from the bit line to the common decoded I/O output should ideally be balanced. The column decoder layout shown in FIG. 52 allows the devices for each bit line to lie side by side, thus eliminating resistive imbalance and capacitive coupling. Further, it is beneficial to incorporate an equilibrate device (transistors M17 and M18, for example) between bit line pairs to guarantee that the starting potential prior to reading the cell information is the same. In the layout of FIG. 52, the gates of transistors M33 and M34, which are located between the bit lines (local interconnect features 76), are tied to ground potential to keep the devices off. These so-called "isolation devices" are incorporated to keep the diffusions on each bit line balanced with respect to mask misalignments. Misalignments would otherwise cause capacitive mismatch between bit lines. The layout of FIG. 52 takes advantage of isolation devices M33 and M34, and also incorporates equilibrate devices M17 and M18 as part of the isolation.

Figure 53:
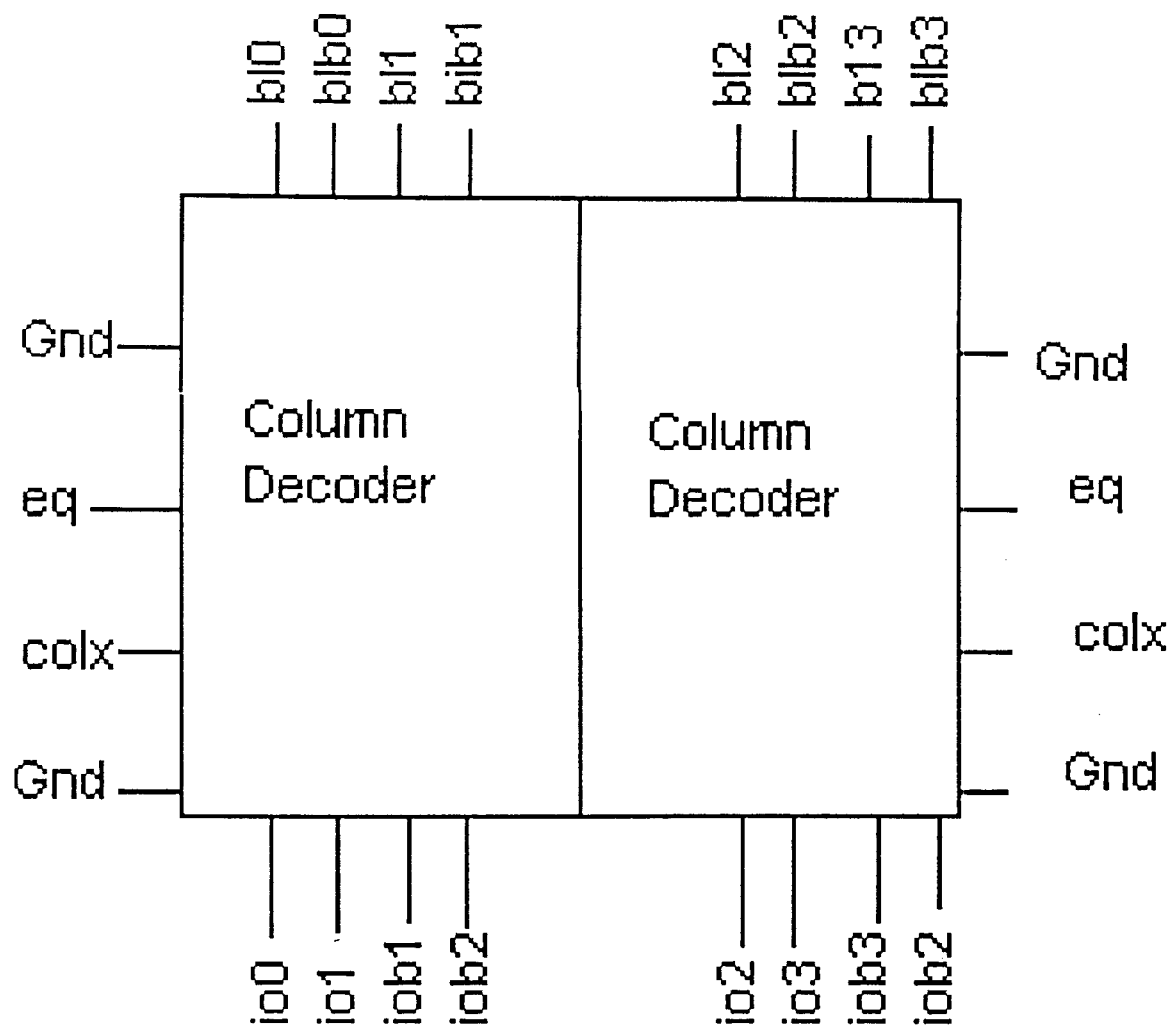
FIG. 53 is a block diagram a column decoder necessary for decoding four columns using the layout of FIG. 52.

Turning now to FIG. 53, a block diagram is shown for a column decoder layout serving four columns. Note that the column decoder section 104 is flipped in the row direction. This pattern is then repeated as necessary to construct a column decoder having eight or more columns.

A 70 ns 1 Mbit Nonvolatile Ferroelectric Memory

Ferroelectric memories have been shown to display characteristics of lower power operation, faster write times, and higher endurance when compared to conventional nonvolatile memory technologies. A density of 1 Mbit has been achieved using 0.5 µm technology along with a one transistor, one capacitor ("1T/1C") cell architecture to produce a 70 ns read/write time non-volatile memory with 10 mW power consumption at 5.0 volts.

The 128K×8 circuit of the present invention utilizes a folded bit line architecture. Each pair of bit lines connected to a sense amplifier receives charge from a cell capacitor and a reference capacitor. Prior to the plate pulse the bit lines are pre-biased to a ground potential. Reading data from the memory cell involves pulsing the plate line from ground to VDD. A logic level "1" is the result of a capacitor which is polarized such that the rising plate line edge switches the dipoles into the opposite orientation from that previously set during the most recent read or write operation. A logic level "0" is a result of a capacitor which is not switched by the rising transition of the plate line, i.e. it remains on a linear portion of the hysteresis loop. A reference capacitor which deposits charge onto the complementary bit line is located physically at one end of the array block. It is designed so that it places a voltage on the other bit line which is between that of a low or high signal from the cell.

The reference circuit is comprised of two versions which are programmed via interconnect modifications. One embodiment is produced by pre-biasing the top electrode of the reference capacitor to VDD and then charge sharing this capacitance with the opposite bit line from that receiving the cell signal. Its bottom electrode node is grounded. This approach offers the advantage of mitigating the relaxation component which may result from a ferroelectric capacitor stored for various amounts of time at temperature without bias. The second reference approach involves presetting both electrodes of the reference capacitor to ground, and then pulsing the plate electrode much like that of the cell capacitor. Although the reference circuit may be accessed many more times than a cell capacitor, care is taken via design and timing to insure that its polarization state is never switched so as to greatly reduce fatigue of the reference capacitors.

Thirty-two blocks of 512 rows×64 columns each were chosen as the unit block size which is exercised for a given access. The selection of 512 rows was based on the ratio of $C_{bit}/C_{cell}$, as an optimum ratio exists which will produce maximum signal on the bit lines for sensing. The choice of 64 columns per block resulted from a practical limit of the ability to drive the highly capacitive plate line via in-pitch circuitry. Also, the selection of 64 columns results in minimal power consumption as the majority of the circuit's power consumption is due to the sense amplifiers driving one half of each selected bit line pair to VDD. Bit line twists are used in the cell array to minimize the effect of dynamic capacitive coupling during sensing as well as equalizing the bit line capacitance of edge columns.

To improve density a shared plate line scheme is used. This involves two rows of capacitors sharing a common plate line or bottom electrode node, while only one of the two word lines is selected. Care should be taken to insure that the disturb inherent in this approach to the capacitors connected to the deselected word line and the selected shared plate line will not result in decreased reliability via a partial shift of the cell capacitor's dipoles. To this end one goal of the cell layout is to carefully minimize the parasitic capacitance of the top electrode node of the capacitor. This results in a small, tolerable back-switching voltage being realized across the disturbed capacitor, with a goal of the 1 Mbit design being a disturb voltage of 15% of VDD or less. The back-switching voltage inherent in the shared plate scheme requires margin with respect to the coercive voltage of the ferroelectric capacitor's hysteresis loop.

An in-pitch ferroelectric capacitor is used to provide for boosting of the word line voltage to provide for a full rail, hence more reliable, restoration of the cell capacitor. The high dielectric constant of the boosting capacitor results in small area consumption while avoiding high power global charge pumping schemes which can require setup time upon power-up as used by conventional DRAMs. Timing signals provide control for this capacitor so that the word line driver does not "see" its load initially, but also insures the boosting of the word line takes place just prior to being needed for the cell capacitor which stores the "1" state.

A 2T/2C ferroelectric memory design is inherently balanced in that the two capacitors whose polarization states are being compared are side by side and share a common word line and plate line. The denser 1T/1C approach results in the introduction of noise terms not present in a 2T/2C approach which can be exacerbated by the state of the data stored in a given row segment. The 1 Mbit design uses timing circuits which accurately mimic the delay of word lines and plate lines so as to properly synchronize the timing of both reference and data signals to mitigate this effect.

Write protection circuitry allows the user to define protected blocks with 32K granularity. Also, low voltage lock-out circuitry inhibits chip access when the power supply has dropped below the minimum specification to insure that low voltage writes do not compromise data retention.

The memory cell size is 3.95 µm×4.00 µm. Die size is 7.49 mm×5.67 mm. PZT ferroelectric capacitors utilizing platinum electrodes are formed on a 0.5 µm planarized CMOS process using tungsten plugs. TiN local interconnect straps provide for the internal cell node connection as well as peripheral circuit connections. The ferroelectric capacitor bottom electrode platinum serves as the plate line.

A 1 Mbit ferroelectric memory with 15.8 $µm^2$ cell size and 70 ns read/write times incorporates a 1T/1C architecture. An optimized reference and sensing scheme improves data retention reliability. Active power is 10 mW at 5.0 volts.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

We claim:

1. A plate line segmentation scheme for a 1T/1C ferroelectric memory comprising:
   a plurality of rows of 1T/1C ferroelectric memory cells;
   a plurality of word lines corresponding to each row of 1T/1C ferroelectric memory cells; and
   a plurality of plate lines corresponding to each row of 1T/1C ferroelectric memory cells, each plate line being divided into two or more plate line segments, only one of which is driven when a corresponding word line is selected.

2. A plate line segmentation scheme as in claim 1 in which each plate line is divided into four equal plate line segments.

3. A plate line segmentation scheme as in claim 1 in which each word line is coupled to 256 columns of ferroelectric memory cells and each plate line segment is coupled to 64 columns of ferroelectric memory cells.

4. A plate line segmentation scheme as in claim 1 further comprising a bank of sense amplifiers corresponding to each plate line segment.

5. A plate line segmentation scheme as in claim 4 in which only one bank of sense amplifiers is enabled corresponding to the driven plate line segment.

6. A plate line segmentation scheme as in claim 1 further comprising a bank of pre-charge circuits corresponding to each plate line segment.

7. A plate line segmentation scheme as in claim 6 in which only one bank of pre-charge circuits are disabled corresponding to the driven plate line segment.

8. A plate line segmentation scheme as in claim 1 further comprising a plurality of plate line driver circuits for selectively driving each plate line segment.

9. A plate line segmentation scheme as in claim 8 in which the plurality of plate line driver circuits are arranged into columns.

10. A plate line segmentation scheme as in claim 8 in which the plurality of plate line driver circuits are arranged into four columns coupled to four memory array sections, the first and second columns being located between a first and second memory array section, and the third and fourth columns being located between a third and fourth memory array section.

11. A plate line segmentation method comprising:
   selecting a word line coupled to a row ferroelectric memory cells;
   driving a first plate line segment coupled to a first portion of the row of ferroelectric memory cells; and
   grounding a second plate line segment coupled to a second portion of the row of ferroelectric memory cells.

12. The method of claim 11 further comprising sensing a charge on bit lines corresponding to the first portion of the row of ferroelectric memory cells.

13. The method of claim 11 further comprising grounding bit lines corresponding to the second portion of the row of ferroelectric memory cells.

14. The method of claim 11 further comprising disabling a pre-charge circuit coupled to the first portion of the row of ferroelectric memory cells.

15. The method of claim 11 further comprising enabling a pre-charge circuit coupled to the second portion of the row of ferroelectric memory cells.

16. An architecture for a 1T/1C ferroelectric memory having segmented plate line comprising:
   eight memory array sections having N rows and M columns of 1T/1C ferroelectric memory cells, N and M being multiples of two, each memory array section being divided into four sub-sections of memory cells;
   a plurality of word lines associated with each memory array section; and
   a plurality of plate line associated with each memory array section being divided into plate line segments coupled to each sub-section of memory cells,
   such that only a single plate line segment is driven when a corresponding word line is driven.

17. The architecture of claim 16 further comprising a bank of sense amplifiers associated with each memory sub-section, only one bank being enabled corresponding to the plate line segment being driven.

18. The architecture of claim 16 further comprising a bank of pre-charge circuits associated with each memory sub-section, only one bank being disabled corresponding to the plate line segment being driven.

19. The architecture of claim 16 further comprising a column of plate line driver circuits coupled to each memory sub-section.

20. The architecture of claim 16 in which N is equal to 512 and M is equal to 64.

* * * * *